(12) United States Patent
Maruyama

(10) Patent No.: US 8,889,335 B2
(45) Date of Patent: Nov. 18, 2014

(54) RADIATION-SENSITIVE RESIN COMPOSITION

(71) Applicant: JSR Corporation, Tokyo (JP)

(72) Inventor: Ken Maruyama, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/789,742

(22) Filed: Mar. 8, 2013

(65) Prior Publication Data

US 2013/0183624 A1    Jul. 18, 2013

Related U.S. Application Data

(63) Continuation of application No. PCT/JP2011/070411, filed on Sep. 7, 2011.

(30) Foreign Application Priority Data

Sep. 9, 2010 (JP) .................................. 2010-202360
Nov. 25, 2010 (JP) ................................. 2010-261873

(51) Int. Cl.
| | | |
|---|---|---|
| *G03F 7/039* | (2006.01) | |
| *G03F 7/11* | (2006.01) | |
| *G03F 7/004* | (2006.01) | |
| *G03F 7/033* | (2006.01) | |
| *G03F 7/038* | (2006.01) | |
| *G03F 7/20* | (2006.01) | |

(52) U.S. Cl.
CPC ............ *G03F 7/0045* (2013.01); *G03F 7/0382* (2013.01); *G03F 7/0388* (2013.01); *G03F 7/0046* (2013.01); *G03F 7/0397* (2013.01); *G03F 7/2041* (2013.01); *G03F 7/033* (2013.01); *G03F 7/0392* (2013.01); *G03F 7/11* (2013.01); *Y10S 430/126* (2013.01)
USPC ................. 430/270.1; 430/311; 430/280.1; 430/287.1; 430/925; 430/285.1; 522/15; 522/25; 522/31; 522/32

(58) Field of Classification Search
None
See application file for complete search history.

(56) References Cited

U.S. PATENT DOCUMENTS

| | | | | |
|---|---|---|---|---|
| 7,491,484 | B2 * | 2/2009 | Yun et al. ................... | 430/270.1 |
| 7,531,290 | B2 * | 5/2009 | Kobayashi et al. ......... | 430/270.1 |
| 2002/0197558 | A1 * | 12/2002 | Ferreira et al. ............. | 430/270.1 |
| 2008/0085469 | A1 * | 4/2008 | Ohsawa et al. ............. | 430/286.1 |
| 2008/0090172 | A1 * | 4/2008 | Hatakeyama et al. ...... | 430/270.1 |
| 2008/0254386 | A1 * | 10/2008 | Nishi et al. ................. | 430/286.1 |
| 2009/0061358 | A1 * | 3/2009 | Ohashi et al. .............. | 430/286.1 |
| 2009/0087786 | A1 * | 4/2009 | Hatakeyama ............... | 430/285.1 |
| 2009/0186296 | A1 * | 7/2009 | Ohsawa et al. ............. | 430/270.1 |
| 2009/0246694 | A1 * | 10/2009 | Ohsawa et al. ............. | 430/285.1 |
| 2009/0291390 | A1 * | 11/2009 | Jung et al. .................. | 430/270.1 |
| 2010/0113818 | A1 * | 5/2010 | Oh et al. ..................... | 560/17 |
| 2010/0304303 | A1 * | 12/2010 | Maeda et al. ............... | 430/286.1 |
| 2010/0323294 | A1 * | 12/2010 | Li et al. ...................... | 430/270.1 |
| 2011/0250538 | A1 * | 10/2011 | Li et al. ...................... | 430/270.1 |
| 2013/0065186 | A1 * | 3/2013 | Matsuda et al. ............ | 430/325 |

FOREIGN PATENT DOCUMENTS

| | | |
|---|---|---|
| JP | 2002-145955 | 5/2002 |
| JP | 2002-201232 | 7/2002 |
| JP | 2002-363123 | 12/2002 |
| JP | 2008-007409 | 1/2008 |
| JP | 2008-007410 | 1/2008 |
| JP | 2008-106045 | 5/2008 |
| JP | 2008-170535 | 7/2008 |
| JP | 2009-080474 | 4/2009 |
| JP | 2010-215612 | 9/2010 |
| JP | 2010-250063 | 11/2010 |
| JP | 2010-256875 | 11/2010 |
| JP | 2011-173863 | 9/2011 |
| WO | WO 2008/047678 | 4/2008 |
| WO | WO 2009/051088 | 4/2009 |
| WO | WO 2009057769 A1 * | 5/2009 |
| WO | WO 2011/115138 A1 * | 9/2011 |
| WO | WO 2012/033145 A1 * | 5/2012 |

OTHER PUBLICATIONS

International Search Report for corresponding International Application No. PCT/JP2011/070411, Dec. 13, 2011.

* cited by examiner

*Primary Examiner* — Cynthia Hamilton
(74) *Attorney, Agent, or Firm* — Oblon, Spivak, McClelland, Maier & Neustadt, L.L.P.

(57) ABSTRACT

A radiation-sensitive resin composition includes a compound represented by a formula (1), and a polymer that serves as a base resin. $R^1$ is a monovalent group that includes at least two groups of —CO—, —NH—, —S—, and —SO$_2$—, the at least two groups being each identical or different. A is a divalent hydrocarbon group or a divalent fluorohydrocarbon group having 1 to 5 carbon atoms. R is a fluorine atom or a hydrogen atom. a is an integer from 1 to 4. In a case where a plurality of R are present, each of the plurality of R is either identical or different. M$^+$ is a monovalent cation.

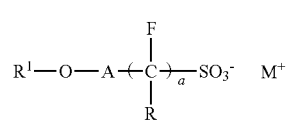

(1)

5 Claims, No Drawings

RADIATION-SENSITIVE RESIN COMPOSITION

CROSS-REFERENCE TO RELATED APPLICATIONS

The present application is a continuation application of International Application No. PCT/JP2011/070411, filed Sep. 7, 2011, which claims priority to Japanese Patent Application No. 2010-202360, filed Sep. 9, 2010 and to Japanese Patent Application No. 2010-261873, filed Nov. 25, 2010. The contents of these applications are incorporated herein by reference in their entirety.

BACKGROUND OF THE INVENTION

1. Field of the Invention

The invention relates to a radiation-sensitive resin composition.

2. Discussion of the Background

In the field of microfabrication such as production of integrated circuit devices, a lithographic technique that enables microfabrication that can implement a line width of about 100 nm or less by utilizing radiation such as deep ultraviolet rays (e.g., KrF excimer laser light, ArF excimer laser light, $F_2$ excimer laser light, or extreme ultraviolet (EUV) light), X-rays (e.g., synchrotron radiation), or charged particle rays (e.g., electron beams), has been desired in order to achieve a higher degree of integration.

A radiation-sensitive resin composition that utilizes a chemical amplification effect due to an acid-labile functional group-containing component and an acid generator has been proposed as a radiation-sensitive resin composition that is suitable for such radiation. For example, a radiation-sensitive resin composition that includes a polymer having a monomer unit including a norbornane ring derivative group has been known (see Japanese Patent Application Publication (KOKAI) No. 2002-201232 and Japanese Patent Application Publication (KOKAI) No. 2002-145955). A radiation-sensitive resin composition that further includes a photoactive compound in order to improve sensitivity and resolution has also been proposed (see Japanese Patent Application Publication (KOKAI) No. 2002-363123).

SUMMARY OF THE INVENTION

According to one aspect of the present invention, a radiation-sensitive resin composition includes a compound represented by a formula (1), and a polymer that serves as a base resin.

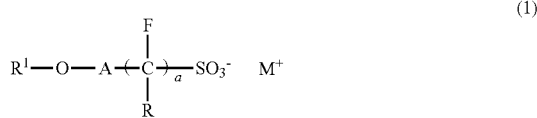

$R^1$ is a monovalent group that includes at least two groups of —CO—, —NH—, —S—, and —SO$_2$—, the at least two groups being each identical or different. A is a divalent hydrocarbon group having 1 to 5 carbon atoms or a divalent fluorohydrocarbon group having 1 to 5 carbon atoms. R is a fluorine atom or a hydrogen atom. a is an integer from 1 to 4. In a case where a plurality of R are present, each of the plurality of R is either identical or different. $M^+$ is a monovalent cation.

DESCRIPTION OF THE EMBODIMENTS

A radiation-sensitive resin composition according to one aspect of the embodiment of the present invention includes (A) a compound represented by the following formula (1) (hereinafter may be referred to as "compound (A)"), and (B) a polymer that serves as a base resin (hereinafter may be referred to as "polymer (B)").

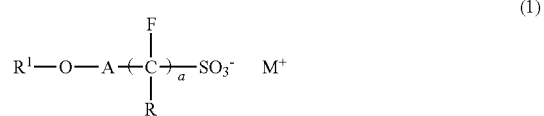

wherein $R^1$ is a monovalent group that includes at least two identical or different groups selected from a group consisting of —CO—, —NH—, —S—, and —SO$_2$—, A is a divalent hydrocarbon group having 1 to 5 carbon atoms or a divalent fluorohydrocarbon group having 1 to 5 carbon atoms, R is a fluorine atom or a hydrogen atom, a is an integer from 1 to 4, wherein in a case where a plurality of R are present, each of the plurality of R is either identical or different, and $M^+$ is a monovalent cation.

Since the radiation-sensitive resin composition includes the compound (A) that serves as an acid generator together with the polymer (B), the radiation-sensitive resin composition exhibits excellent post-development pattern collapse resistance, low LWR, a small MEEF, and excellent resolution. The reasons why the radiation-sensitive resin composition that includes the compound (A) exhibits the above effects are not clear at present. It is conjectured that the diffusion length of an acid generated by the compound (A) moderately decreases due to a plurality of the specific groups included in the compound (A), so that the above effects can be achieved, for example.

It is preferable that -A-(CFR)$_a$— in the formula (1) be —CH$_2$CH$_2$CF$_2$CF$_2$— or —CH$_2$CH$_2$CH$_2$CF$_2$CF$_2$—. When the compound (A) includes the above specific structure, it is considered that the acidity of an acid generated by the compound (A) moderately increases, and the diffusion length moderately decreases, so that the radiation-sensitive resin composition exhibits excellent post-development pattern collapse resistance, low LWR, a small MEEF, and excellent resolution.

It is preferable that $R^1$ in the formula (1) be at least one group selected from the group consisting of a group represented by the following formula (a1), a group represented by the following formula (a2), and a group represented by the following formula (a3).

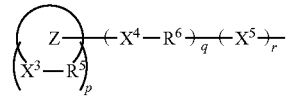

wherein $X^1$ to $X^5$ are each independently —CO—, —COO—, —COO—, —O—CO—O—, —NHCO—, —CONH—, —NH—CO—O—, —O—CO—NH—, —NH—, —S—, —SO—, or —SO$_2$—, R$^2$ and R$^4$ are each independently a monovalent hydrocarbon group having 1 to 30 carbon atoms, R$^3$, R$^5$, and R$^6$ are each independently a divalent hydrocarbon group having 1 to 30 carbon atoms, wherein some or all of hydrogen atoms of the monovalent hydrocarbon group or the divalent hydrocarbon group may be substituted with a substituent, Z is a group that is a heterocyclic structure taken together with —(X$^3$—R$^5$)$_p$—, m is 1 or 2, n is 0 or 1, p is an integer from 1 to 3, q is an integer from 0 to 2, and r is 0 or 1, wherein "m+n≥2" and "p+q+r>2" are satisfied, a plurality of X$^1$ may be either identical or different when a plurality of X$^1$ are present, a plurality of X$^3$ may be either identical or different when a plurality of X$^3$ are present, a plurality of X$^4$ may be either identical or different when a plurality of X$^4$ are present, a plurality of R$^3$ may be either identical or different when a plurality of R$^3$ are present, a plurality of R$^5$ may be either identical or different when a plurality of R$^5$ are present, and a plurality of R$^6$ may be either identical or different when a plurality of R$^6$ are present.

When the compound (A) includes the above specific structure, it is considered that the diffusion length of an acid generated by the compound (A) moderately decreases, so that the radiation-sensitive resin composition exhibits excellent post-development pattern collapse resistance, low LWR, a small MEEF, and excellent resolution.

It is preferable that M$^+$ in the formula (1) be a sulfonium cation or an iodonium cation. The sensitivity of the radiation-sensitive resin composition can be improved when the compound (A) includes the above specific cation.

It is preferable that the polymer (B) include a structural unit represented by the following formula (5).

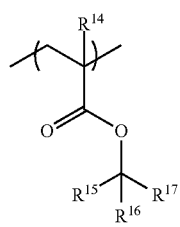

(5)

wherein R$^{14}$ is a hydrogen atom or a methyl group, and R$^{15}$, R$^{16}$, and R$^{17}$ are each independently a linear or branched alkyl group having 1 to 4 carbon atoms or an alicyclic hydrocarbon group having 4 to 20 carbon atoms, wherein two of R$^{15}$, R$^{16}$, and R$^{17}$ may bond to each other to form an alicyclic hydrocarbon group having 4 to 20 carbon atoms together with a carbon atom bonded thereto.

The pattern-forming capability of the radiation-sensitive resin composition can be improved when the compound (B) includes the above structural unit.

The radiation-sensitive resin composition according to one aspect of the embodiment of the present invention exhibits excellent post-development pattern collapse resistance, low LWR, a small MEEF, and excellent resolution. Therefore, the radiation-sensitive resin composition may suitably be used as a chemically-amplified resist that is useful for microfabrication that utilizes radiation such as deep ultraviolet rays (e.g., KrF excimer laser light, ArF excimer laser light, F$_2$ excimer laser light, and EUV light) or charged particle rays (e.g., synchrotron radiation). The embodiments will now be described in detail.

Radiation-Sensitive Resin Composition

A radiation-sensitive resin composition according to one embodiment of the invention includes the compound (A) and the polymer (B). The radiation-sensitive resin composition may preferably include (C) a polymer that has a fluorine atom content higher than that of the polymer (B) (hereinafter may be referred to as "polymer (C)"). The radiation-sensitive resin composition may further include an additional optional component as long as the advantageous effects of the invention are not impaired. Each component is described in detail below.

Compound (A)

The compound (A) is represented by the formula (1), and generates a compound represented by R$^1$—O-A-(CFR)$_a$—SO$_3$H upon exposure to radiation.

In the formula (1), R$^1$ is a monovalent group that includes at least two identical or different groups selected from the group consisting of —CO—, —NH—, —S—, and —SO$_2$—, A is a divalent hydrocarbon group or a divalent fluorohydrocarbon group having 1 to 5 carbon atoms, R is a fluorine atom or a hydrogen atom, a is an integer from 1 to 4, wherein a plurality of R may be either identical or different when a plurality of R are present, and M$^+$ is a monovalent cation.

The monovalent group represented by R$^1$ is not particularly limited as long as the monovalent group has the above structure. It is preferable that R$^1$ be at least one group selected from the group consisting of the group represented by the formula (a1), the group represented by the formula (a2), and the group represented by the formula (a3).

In formulas (a1) to (a3), X$^1$ to X$^5$ are each independently —CO—, —COO—, —COO—, —O—CO—O—, —NHCO—, —CONH—, —NH—CO—O—, —O—CO—NH—, —NH—, —S—, —SO—, or —SO$_2$—, R$^2$ and R$^4$ are each independently a monovalent hydrocarbon group having 1 to 30 carbon atoms, R$^3$, R$^5$, and R$^6$ are each independently a divalent hydrocarbon group having 1 to 30 carbon atoms, wherein some or all of hydrogen atoms of the monovalent hydrocarbon group or the divalent hydrocarbon group may be substituted with a substituent, Z is a group that is a heterocyclic structure taken together with —(X$^3$—R$^5$)$_p$—, m is 1 or 2, n is 0 or 1, p is an integer from 1 to 3, q is an integer from 0 to 2, and r is 0 or 1, wherein "m+n>2" and "p+q+r>2" are satisfied, a plurality of X$^1$ may be either identical or different when a plurality of X$^1$ are present, a plurality of X$^3$ may be either identical or different when a plurality of X$^3$ are present, a plurality of X$^4$ may be either identical or different when a plurality of X$^4$ are present, a plurality of R$^3$ may be either identical or different when a plurality of R$^3$ are present, a plurality of R$^5$ may be either identical or different when a plurality of R$^5$ are present, and a plurality of R$^6$ may be either identical or different when a plurality of R$^6$ are present.

X$^1$ and X$^4$ are preferably —COO— or —COO—, and more preferably —OCO—.

X$^2$ and X$^5$ are preferably —CO—.

X$^3$ is preferably —COO— or —COO—.

Examples of the monovalent hydrocarbon group represented by R$^2$ and R$^4$ include chain-like hydrocarbon groups such as a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, and a 3-(3-methylpentyl) group; alicyclic hydrocarbon groups such as a cyclopentyl group, a cyclohexyl group, a cycloheptyl group, a 2-norbornyl group, a 1-adamantyl group, and a 2-adamantyl group; and the like. Among these, alicyclic hydrocarbon groups are preferable, and a 1-adamantyl group is more preferable.

Examples of the divalent hydrocarbon group represented by $R^3$, $R^5$, and $R^6$ include groups obtained by removing one hydrogen atom from the above monovalent hydrocarbon groups, and the like. $R^3$ and $R^6$ are preferably a divalent chain-like hydrocarbon group or a divalent alicyclic hydrocarbon group, more preferably a divalent alicyclic hydrocarbon group, still more preferably a cyclohexanediyl group or a norbornanediyl group, and yet more preferably a cyclohexanediyl group. $R^5$ is preferably is a divalent alicyclic hydrocarbon group, and more preferably a norbornanediyl group.

Examples of the heterocyclic structure represented by Z taken together with —$(X^3$—$R^5)_p$— include lactone structures such as a butyrolactone structure, a valerolactone structure, a cyclohexanelactone structure, and a norbornanelactone structure; the cyclic carbonate structure represented by the following formula (a-1); the cyclic ketone structures represented by the following formulas (b-1) to (b-7); the cyclic sulfide structures represented by the following formulas (c-1) to (c-4); sultone structures such as the norbornanesultone structure represented by the following formula (d-1); and the like.

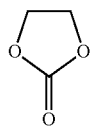
(a-1)

(b-1)

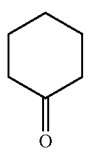
(b-2)

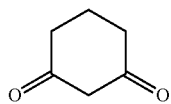
(b-3)

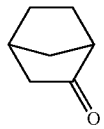
(b-4)

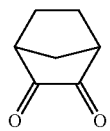
(b-5)

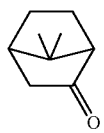
(b-6)

-continued

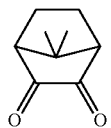
(b-7)

(c-1)

(c-2)

(c-3)

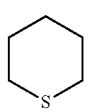
(c-4)

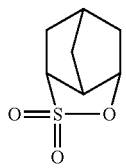
(d-1)

Among these, the lactone structure and the sultone structure are preferable, the norbornanelactone structure and the norbornanesultone structure are more preferable, and the norbornanelactone structure is still more preferable.

Examples of a substituent that may substitute the monovalent hydrocarbon group or the divalent hydrocarbon group represented by $R^2$ to $R^6$ include a hydroxyl group, a carboxyl group, a carbonyl group, a nitro group, an amino group, a silyl group, a halogen atom, a thienyl group, and the like. When the hydrocarbon group is a chain-like hydrocarbon group, the chain-like hydrocarbon group may be substituted with an alicyclic hydrocarbon group. When the hydrocarbon group is an alicyclic hydrocarbon group, the alicyclic hydrocarbon group may be substituted with a monovalent hydrocarbon group.

m is preferably 1. n is preferably 1.

p is preferably 1. q is preferably 1. r is preferably 1.

$R^1$ is more preferably the group represented by the formula (a3).

Examples of the divalent hydrocarbon group having 1 to 5 carbon atoms represented by A include chain-like hydrocarbon groups such as a methanediyl group, an ethanediyl group, a propanediyl group, and a butanediyl group; alicyclic hydrocarbon groups such as a cyclopropanediyl group, a cyclobutanediyl group, and a cyclopentanediyl group; and the like. Among these, chain-like hydrocarbon groups are preferable, and an ethanediyl group is more preferable.

Examples of the fluorohydrocarbon group having 1 to 5 carbon atoms represented by A include chain-like fluorohydrocarbon groups such as a fluoromethanediyl group, a difluoromethanediyl group, a difluoroethanediyl group, a trifluoroethanediyl group, and a tetrafluoroethanediyl group; alicyclic fluorohydrocarbon groups such as a fluorocyclopropanediyl group, a fluorocyclobutanediyl group, a difluorocyclopentanediyl group, and a tetrafluorocyclopentanediyl group; and the like. Among these, chain-like fluorohydrocarbon groups are preferable, and a tetrafluoroethanediyl group is more preferable.

R is preferably a fluorine atom.

a is preferably 2.

Examples of -A-$(CFR)_a$— in the formula (1) include —$CH_2CH_2CF_2CF_2$—, $CH_2CH_2CH_2CF_2CF_2$—, —$CH_2CH_2CF_2$—, —$CH_2CH_2CFH$—, —$CH_2CFH$—, and the like. Among these, —$CH_2CH_2CF_2CF_2$— and $CH_2CH_2CH_2CF_2CF_2$— are preferable since the acidity of the acid generated by the compound (A) moderately increases, and the diffusion length moderately decreases, and —$CH_2CH_2CF_2CF_2$— is more preferable from the viewpoint of the excellent balance between MEEF and LWR.

Synthesis of Compound (A)

The compound (A) may be synthesized using a compound represented by the following formula (1-0) as a raw material, for example.

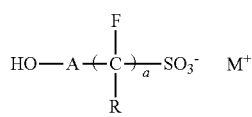

(1-0)

wherein A, R, a, and $M^+$ are the same as defined for the formula (1).

The compound represented by the formula (1-0) may be synthesized by the method disclosed in Japanese Patent Application Publication (KOKAI) No. 2008-007410 or Japanese Patent Application Publication (KOKAI) No. 2008-007409 using 1,4-dibromo-1,1,2,2-tetrafluorobutane, 4-bromo-3,3,4,4-tetrafluoro-1-butene, or 4-bromo-3,3,4,4-tetrafluorobutanol as a starting material, for example.

The compound represented by the formula (1) may be obtained using the above compound through the following reaction, for example.

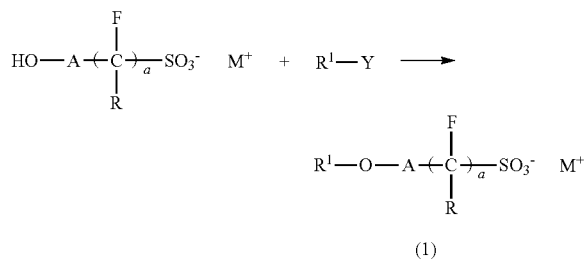

(1)

wherein $R^1$, R, A, a, and $M^+$ are the same as defined for the formula (1), and Y is a hydroxyl group or a halogen atom.

The compound (A) may also be obtained through the following reaction.

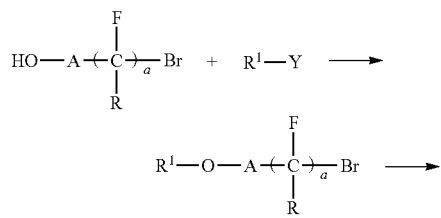

-continued

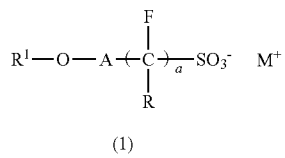

(1)

wherein $R^1$, R, A, a, and $M^+$ are the same as defined for the formula (1), and Y is a hydroxyl group or a halogen atom.

The monovalent cation represented by $M^+$ is not particularly limited, but is preferably a sulfonium cation or an iodonium cation.

Sulfonium Salt

Examples of the compound (A) when the monovalent cation represented by $M^+$ is a sulfonium cation include a sulfonium salt represented by the following formula (2a), a sulfonium salt represented by the following formula (2b), and the like.

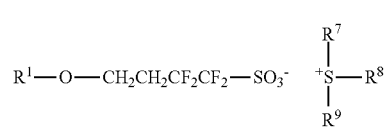

(2a)

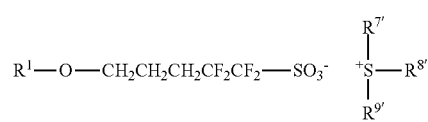

(2b)

wherein $R^1$ is the same as defined for the formula (1), and $R^7$, $R^8$, $R^9$, $R^{7'}$, $R^{8'}$, and $R^{9'}$ are each independently a linear or branched alkyl group having 1 to 10 carbon atoms, an alkenyl group, an oxoalkyl group, an aryl group having 6 to 18 carbon atoms, an aralkyl group, or an aryl oxoalkyl group, wherein some or all of the hydrogen atoms of these groups may be substituted with a substituent, and two or more of $R^7$, $R^8$, and $R^9$, or two or more of $R^{7'}$, $R^{8'}$, and $R^{9'}$ may bond to each other to form a cyclic structure together with the sulfur atom bonded thereto.

A sulfonium cation represented by the following formula (2-1) and a sulfonium cation represented by the following formula (2-2) are preferable as the sulfonium cation.

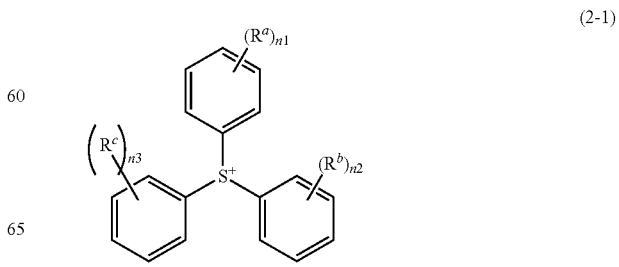

(2-1)

(2-2)

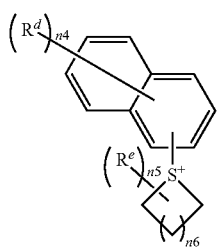

In the formula (2-1), $R^a$, $R^b$, and $R^c$ are each independently a hydrogen atom, a hydroxyl group, a halogen atom, a substituted or unsubstituted alkyl group, a substituted or unsubstituted cycloalkyl group, a substituted or unsubstituted alkoxy group, —S—$R^{10}$, or —$SO_2$—$R^{10'}$, $R^{10}$ is a substituted or unsubstituted alkyl group or a substituted or unsubstituted aryl group, $R^{10'}$ is a substituted or unsubstituted alkyl group, a substituted or unsubstituted cycloalkyl group, a substituted or unsubstituted alkoxy group, or a substituted or unsubstituted aryl group, and n1, n2, and n3 are each independently an integer from 0 to 5, wherein a plurality of $R^a$ may be either identical or different when a plurality of $R^a$ are present, a plurality of $R^b$ may be either identical or different when a plurality of $R^b$ are present, and a plurality of $R^c$ may be either identical or different when a plurality of $R^c$ are present.

In the formula (2-2), $R^d$ is a hydrogen atom, a linear or branched alkyl group having 1 to 8 carbon atoms, or an aryl group having 6 to 8 carbon atoms, wherein some or all of the hydrogen atoms of the alkyl group or the aryl group may be substituted with a substituent, a plurality of $R^d$ may be either identical or different when a plurality of $R^d$ are present, and two or more of $R^d$ may bond to each other to form a cyclic structure, $R^e$ is a hydrogen atom, a linear or branched alkyl group having 1 to 7 carbon atoms, or an aryl group having 6 or 7 carbon atoms, wherein some or all of the hydrogen atoms of the alkyl group or the aryl group may be substituted with a substituent, a plurality of $R^e$ may be either identical or different when a plurality of $R^e$ are present, and two or more of $R^e$ may bond to each other to form a cyclic structure, n4 is an integer from 0 to 7, n5 is an integer from 0 to 6, and n6 is an integer from 0 to 3.

Specific examples of the sulfonium cation include the sulfonium cations represented by the following formulas (i-1) to (i-67), and the like.

(i-1)

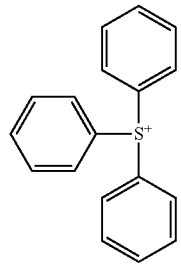

(i-2)

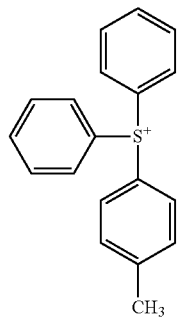

(i-3)

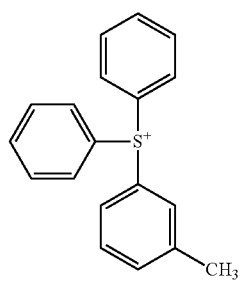

(i-4)

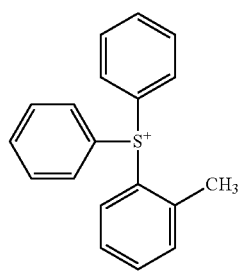

(i-5)

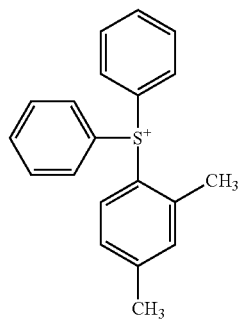

(i-6)

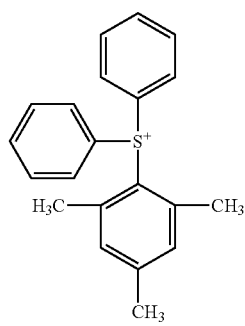

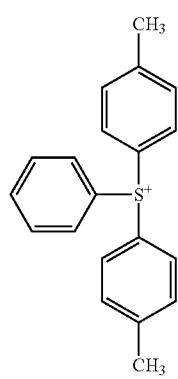 (i-7)
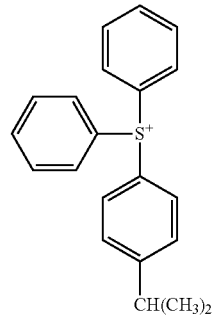 (i-11)
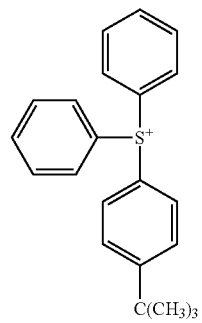 (i-12)
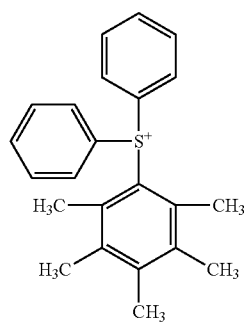 (i-8)
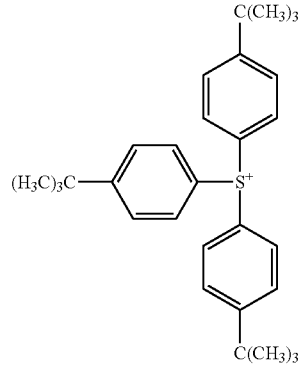 (i-13)
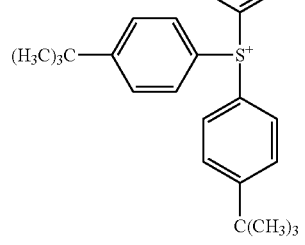 (i-9)
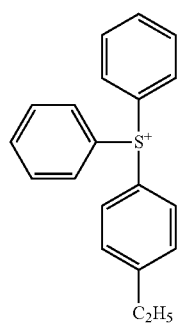 (i-10)
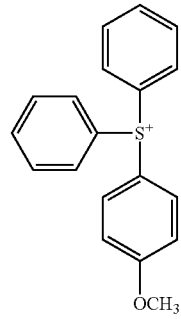 (i-14)

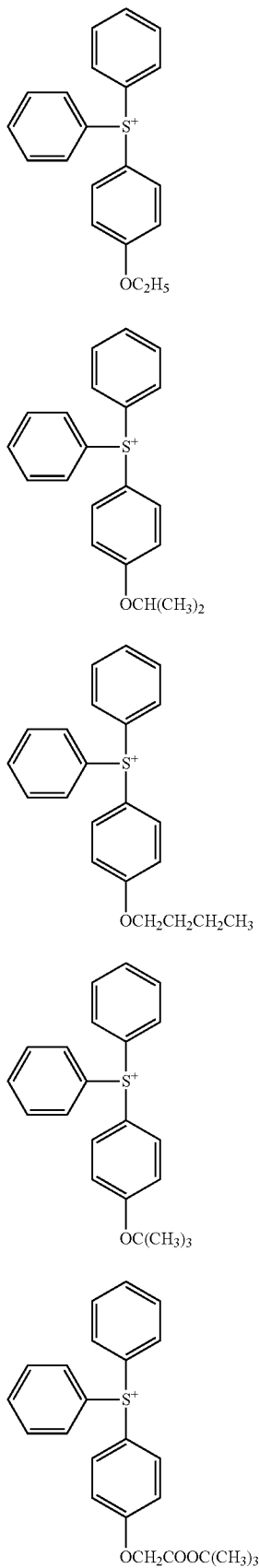
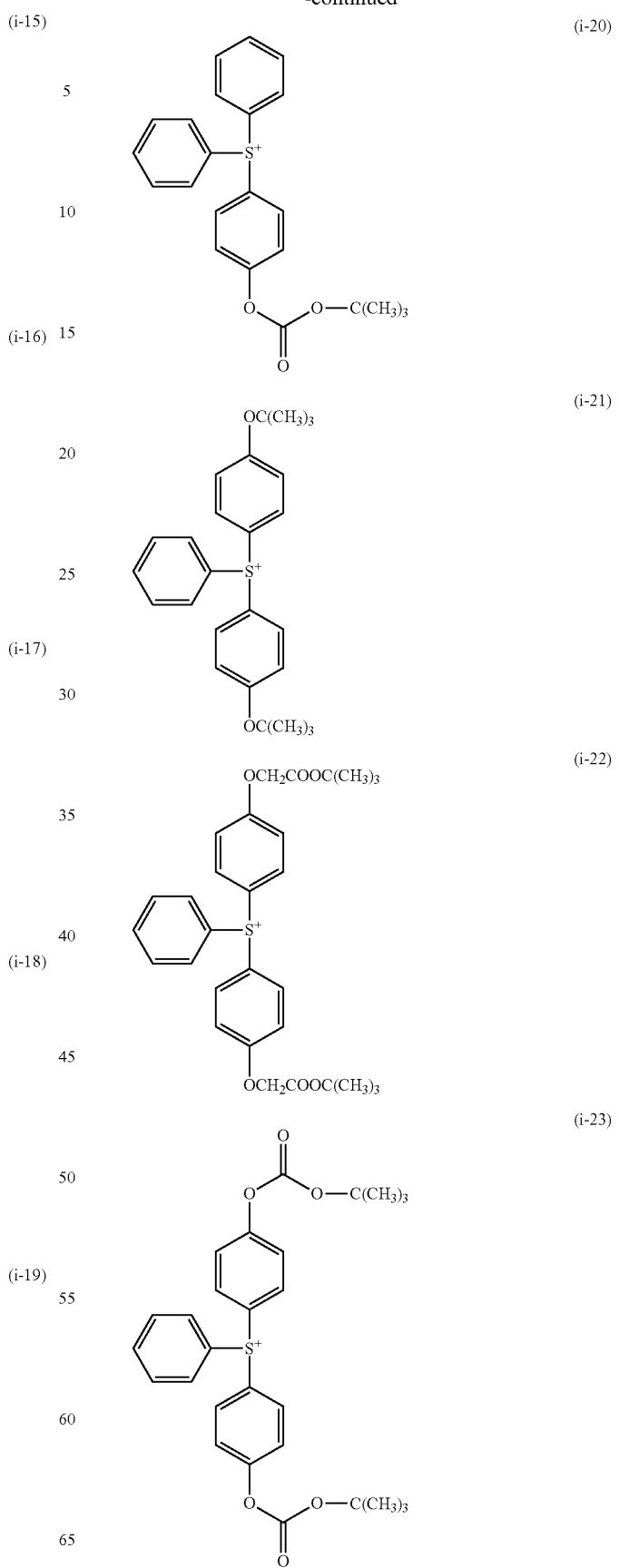

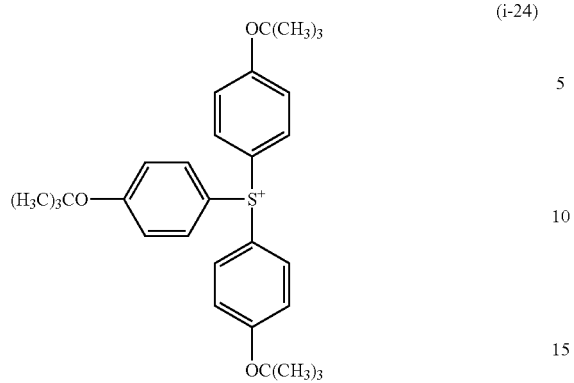
(i-24)
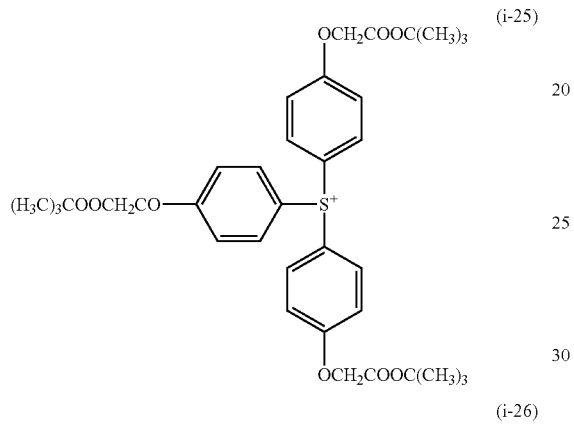
(i-25)
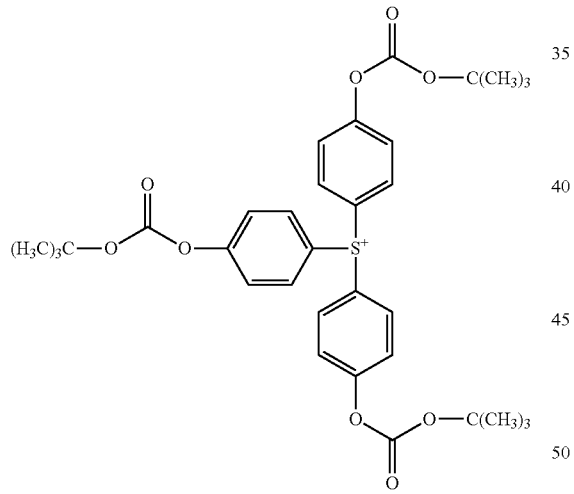
(i-26)
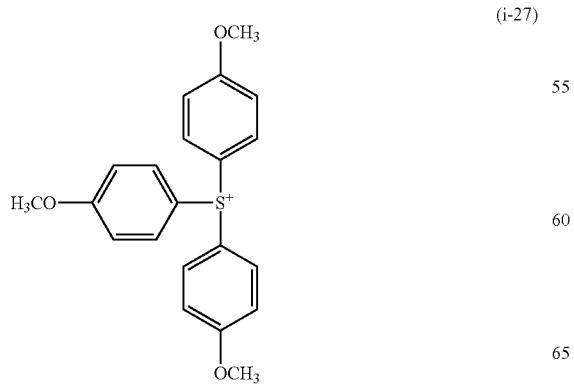
(i-27)
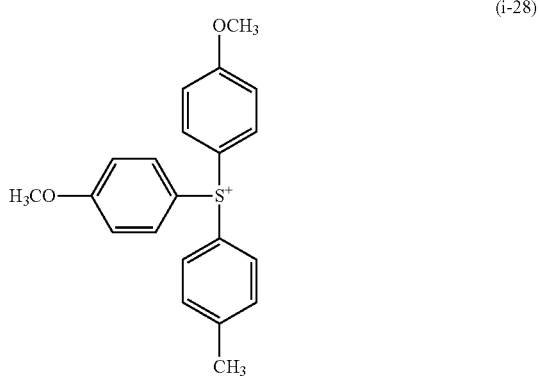
(i-28)
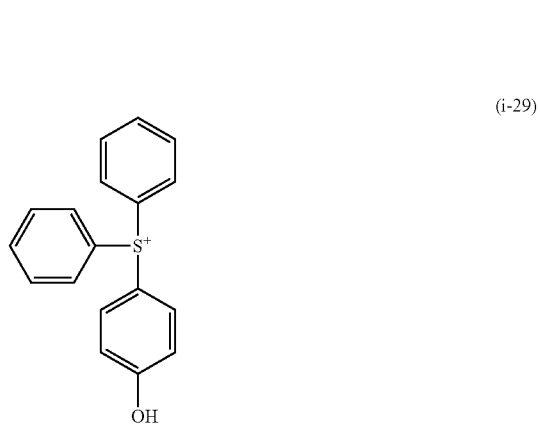
(i-29)
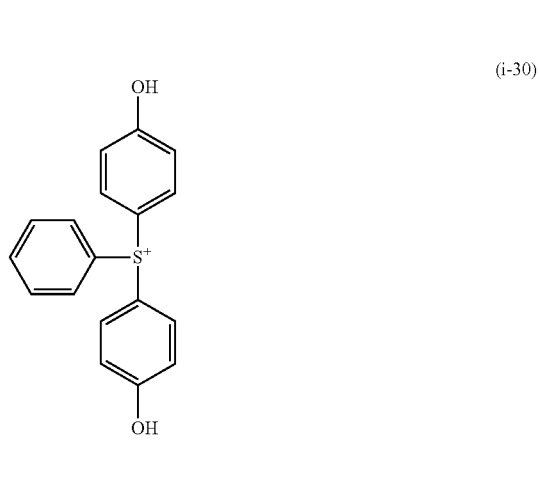
(i-30)
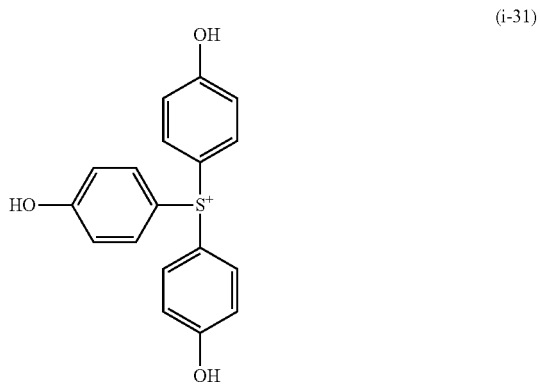
(i-31)

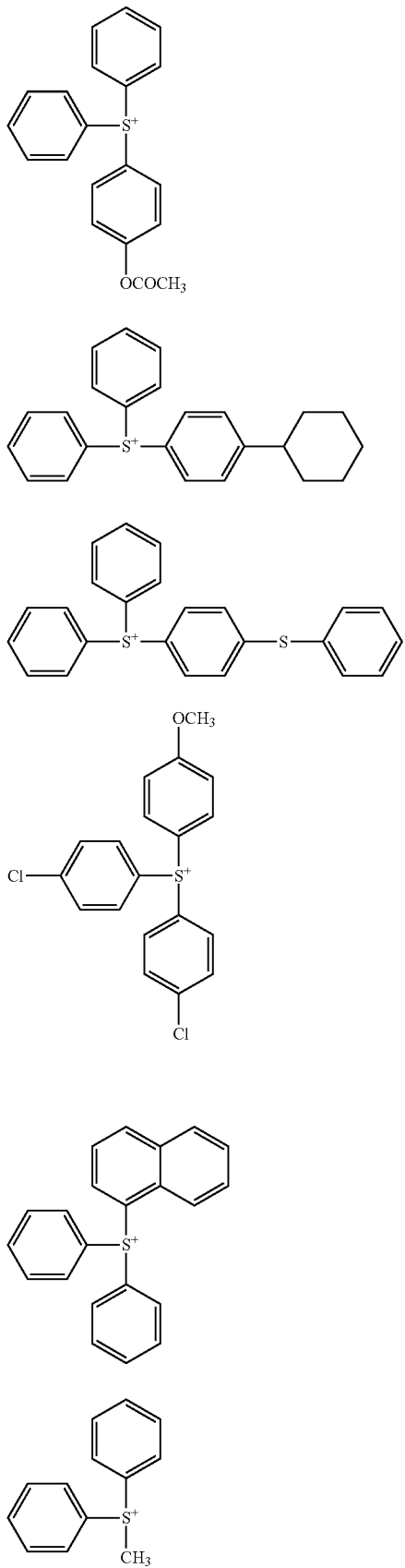
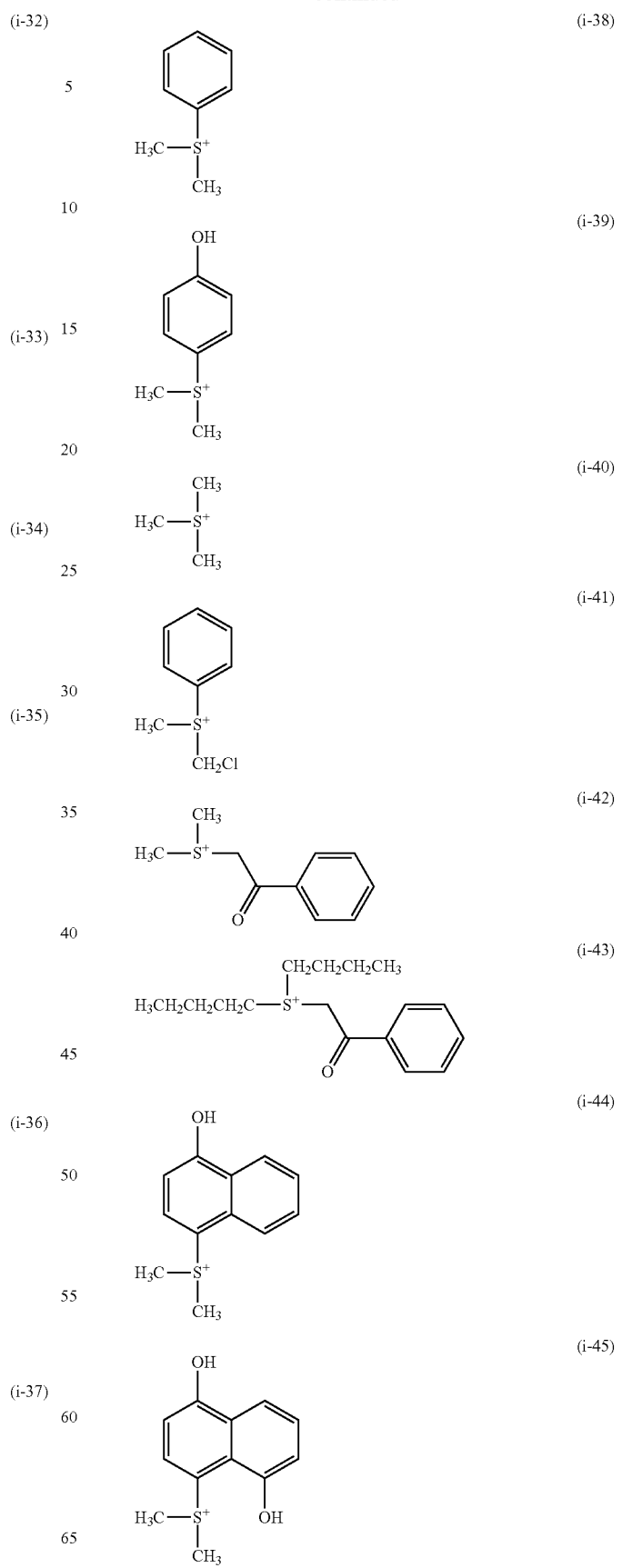

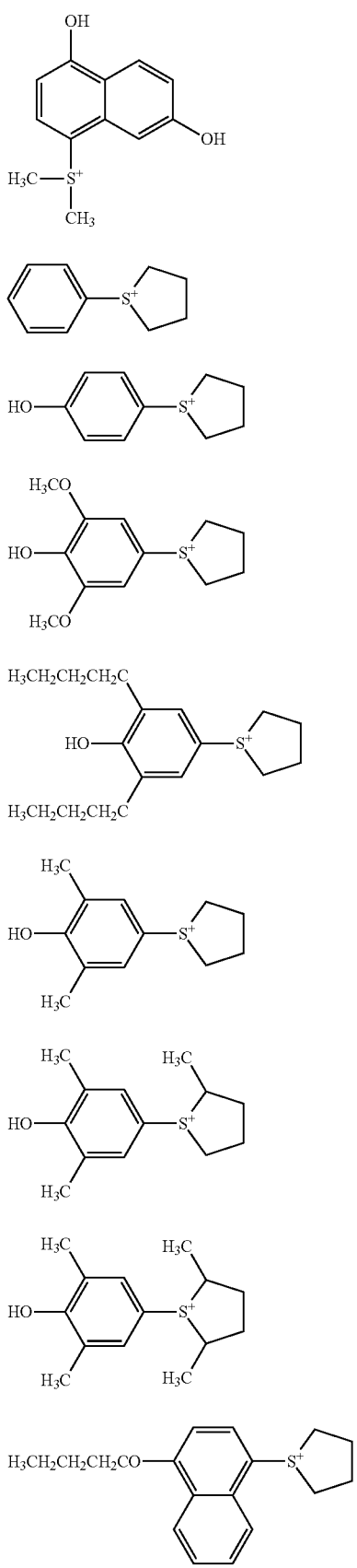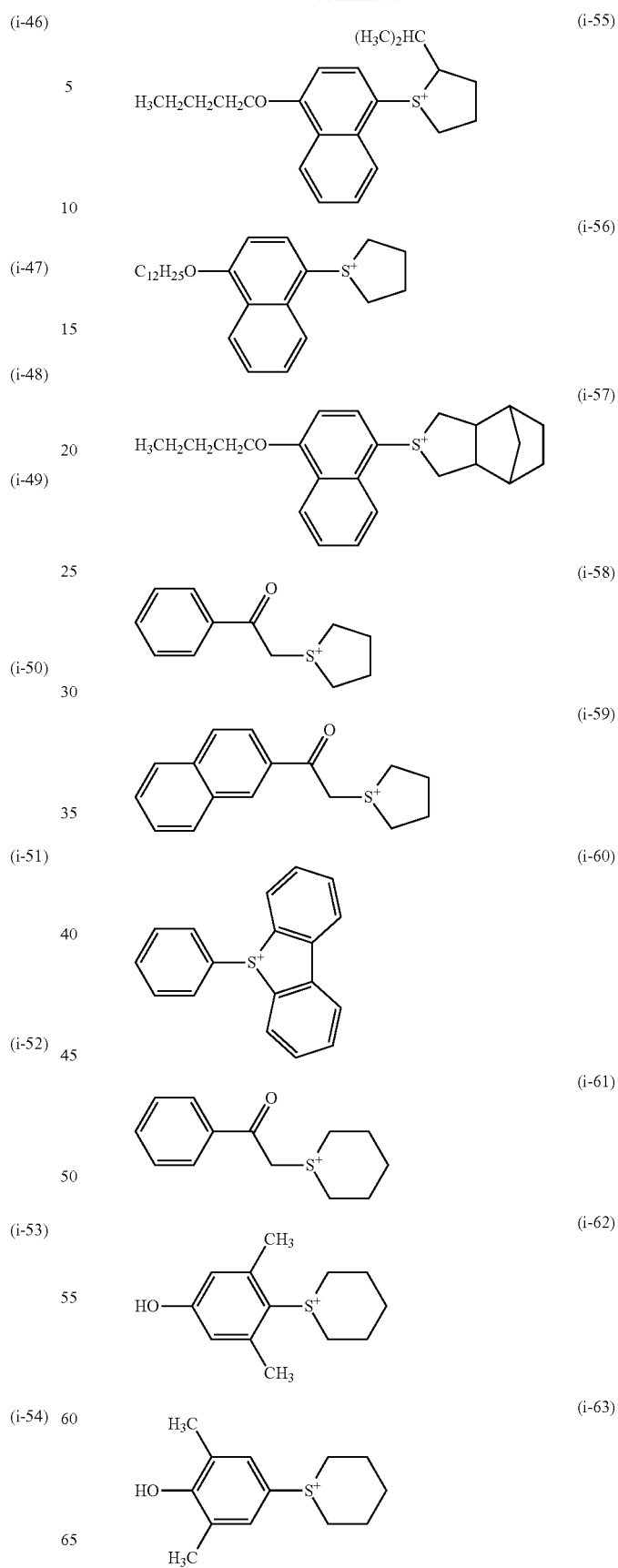

(i-64)
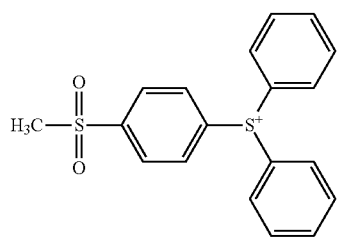

(i-65)
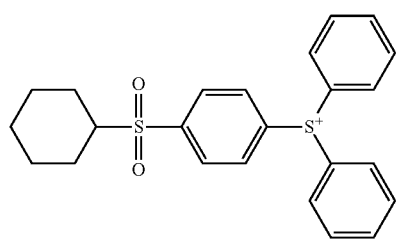

(i-66)
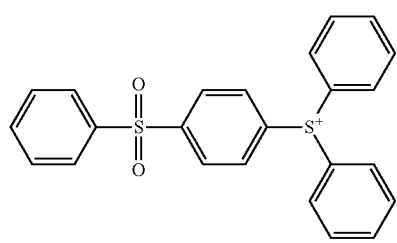

(i-67)
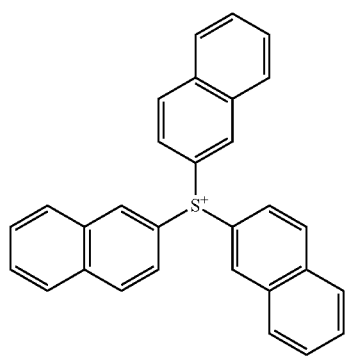

Among these, the sulfonium cations represented by the formulas (i-1), (i-2), (i-6), (i-8), (i-13), (i-19), (i-25), (i-27), (i-29), (i-33), (i-51), (i-54), (i-55), (i-56), and (i-57) are preferable, and the sulfonium cations represented by the formulas (i-1) and (i-54) are more preferable.

Iodonium Salt

Examples of the compound (A) when the monovalent cation represented by M⁺ is an iodonium cation include an iodonium salt represented by the following formula (3a), an iodonium salt represented by the following formula (3b), and the like.

(3a)
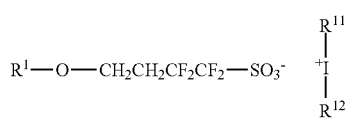

(3b)
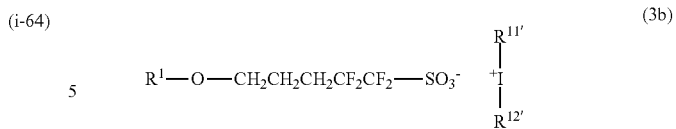

wherein $R^1$ is the same as defined for the formula (1), and $R^{11}$, $R^{12}$, $R^{11'}$, and $R^{12'}$ are the same as defined for $R^7$ and $R^8$ in the formulas (2a) and (2b).

An iodonium cation represented by the following formula (3-1) is preferable as the iodonium cation.

(3-1)
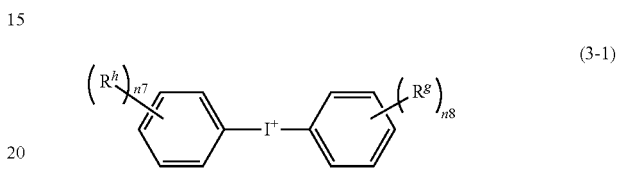

wherein $R^g$ and $R^h$ are each independently a hydrogen atom, a linear or branched alkyl group having 1 to 12 carbon atoms, or an aryl group having 6 to 12 carbon atoms, wherein some or all of the hydrogen atoms of the alkyl group or the aryl group may be substituted with a substituent, a plurality of $R^g$ may be either identical or different when a plurality of $R^g$ are present, a plurality of $R^h$ may be either identical or different when a plurality of $R^h$ are present, two or more of $R^g$ may bond to each other to form a cyclic structure, and two or more of $R^h$ may bond to each other to form a cyclic structure, and n7 to n8 are each independently an integer from 0 to 5.

Specific examples of the iodonium cation represented by the formula (3-1) include the iodonium cations represented by the following formulas (ii-1) and (ii-39), and the like.

(ii-1)
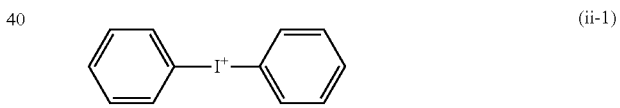

(ii-2)
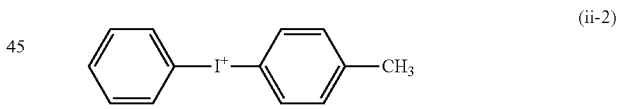

(ii-3)
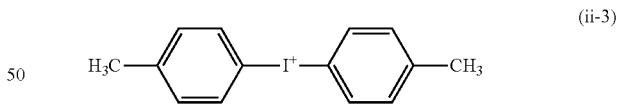

(ii-4)
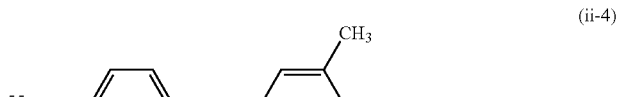

(ii-5)
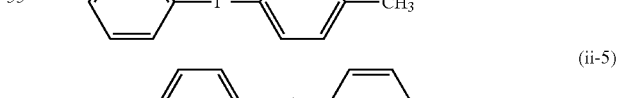

(ii-6)
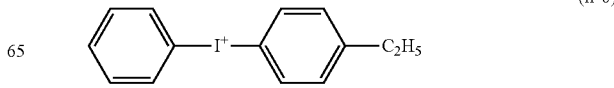

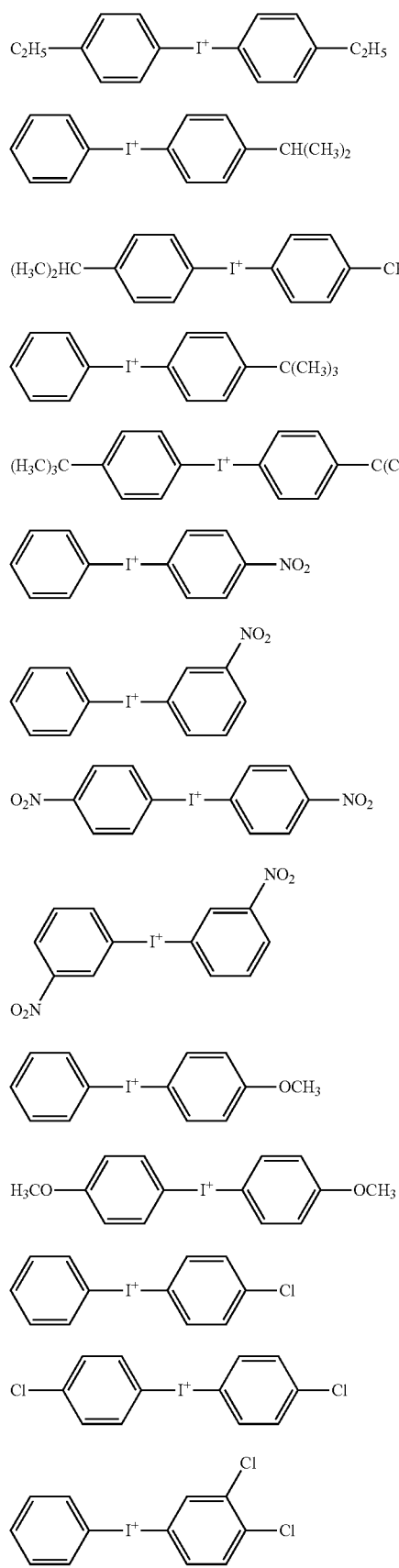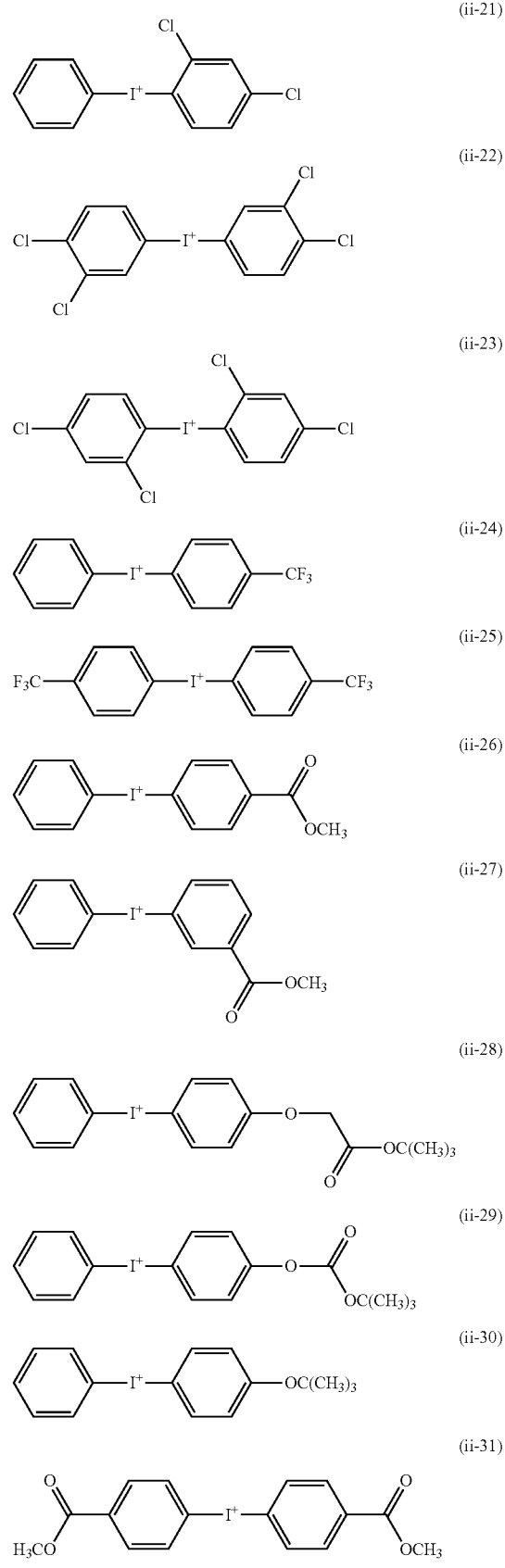

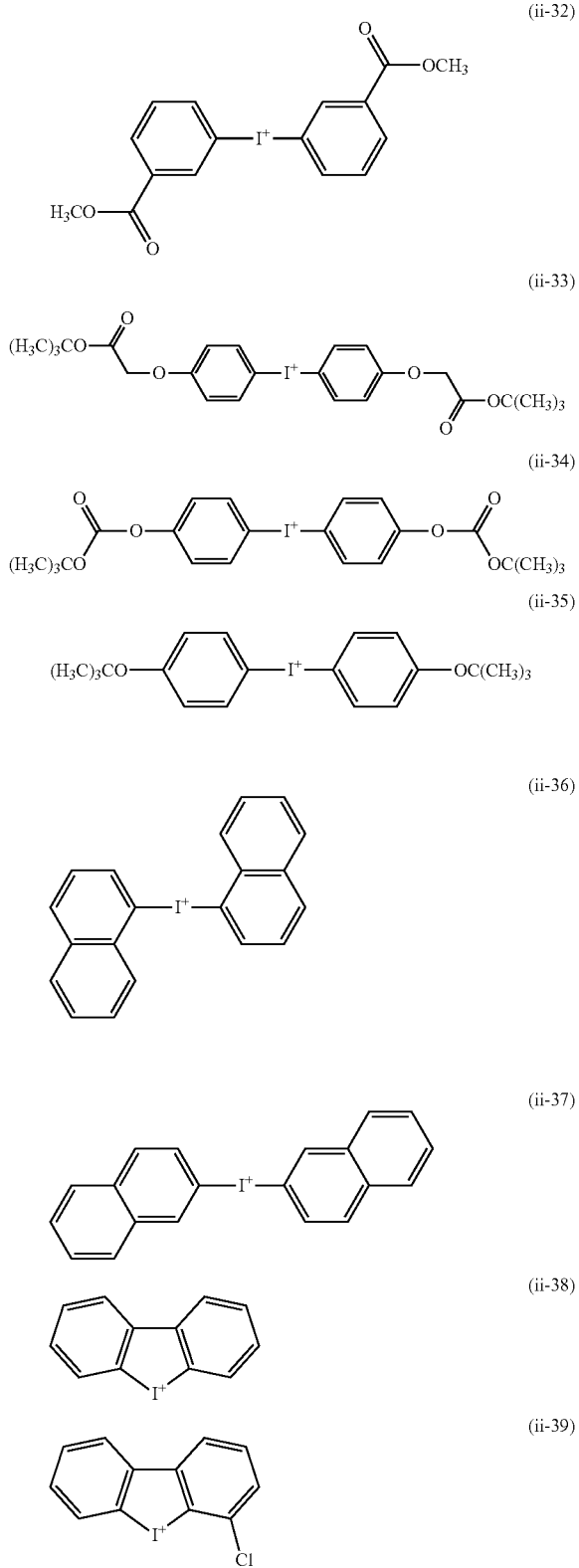
Among these, the iodonium cations represented by the formulas (ii-1) and (ii-11) are preferable.
The compounds represented by the following formulas are preferable as the compound (A).

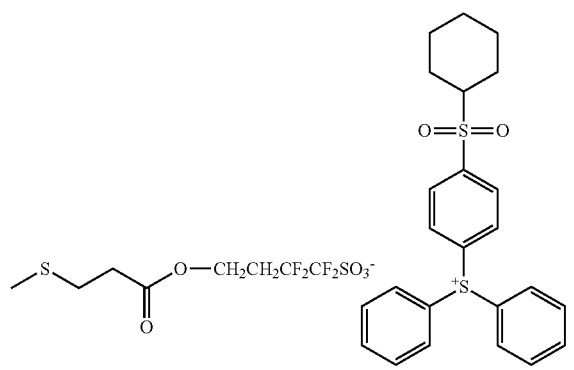
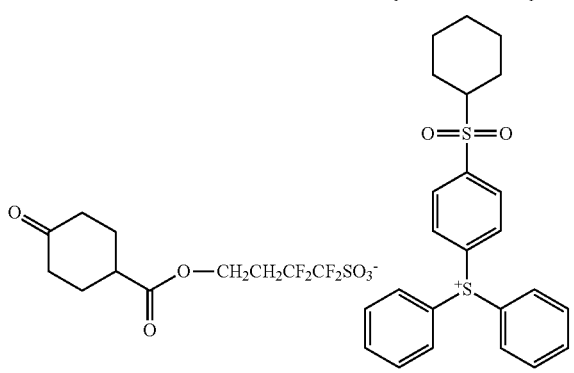
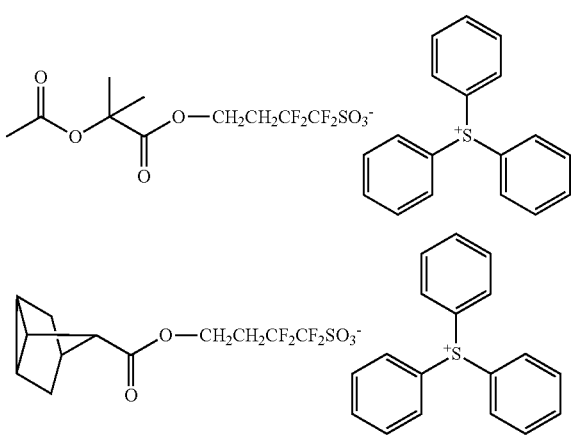
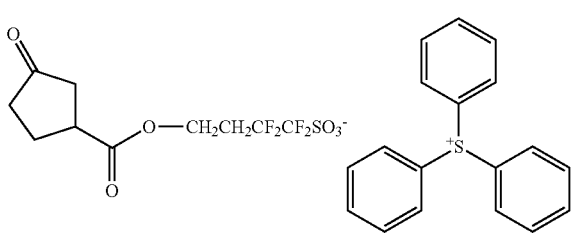
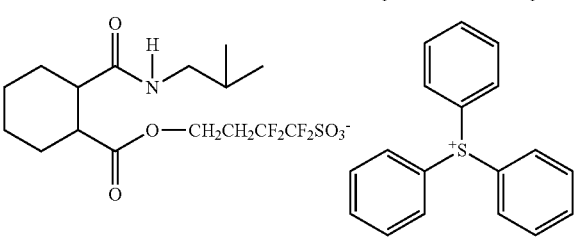
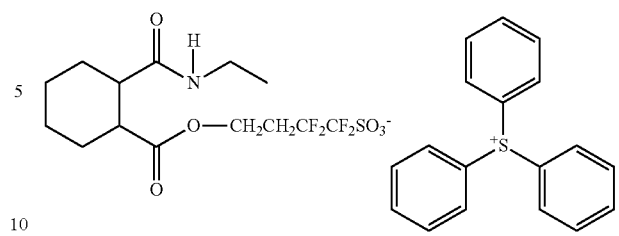
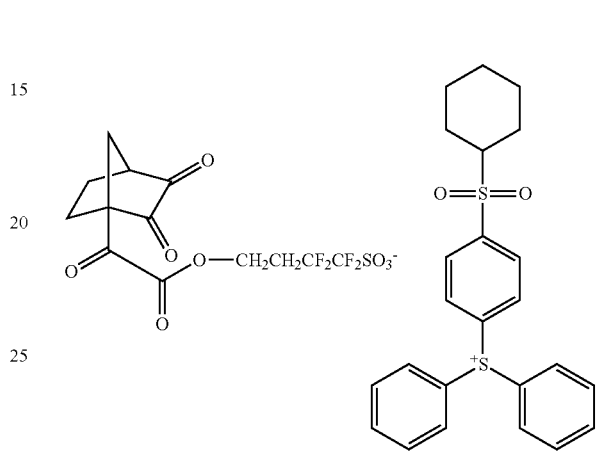
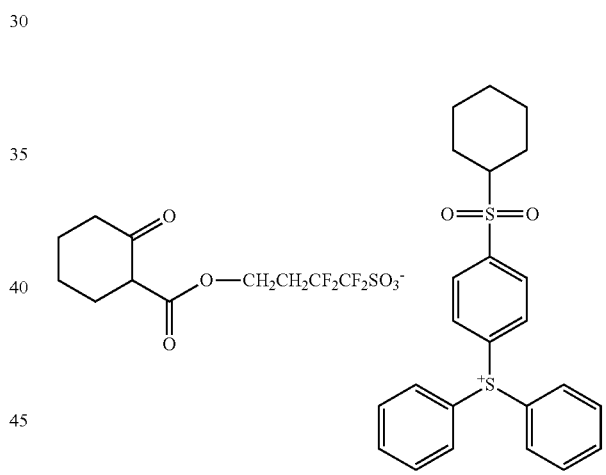
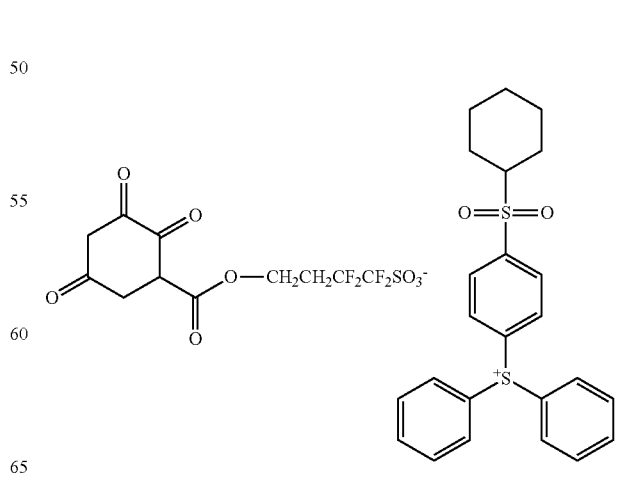

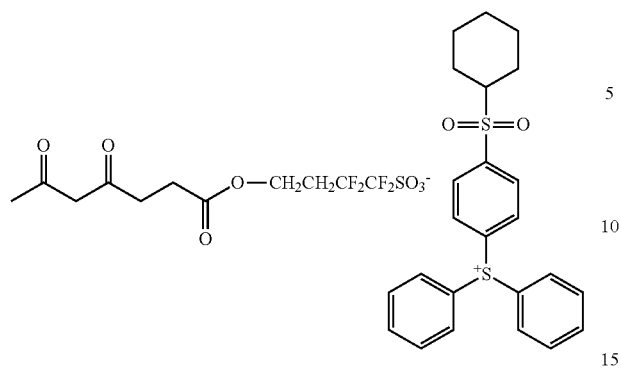
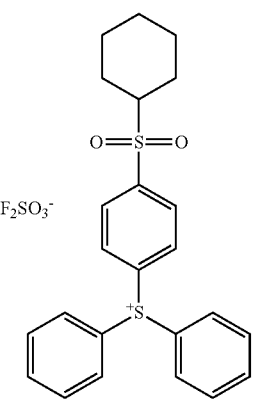
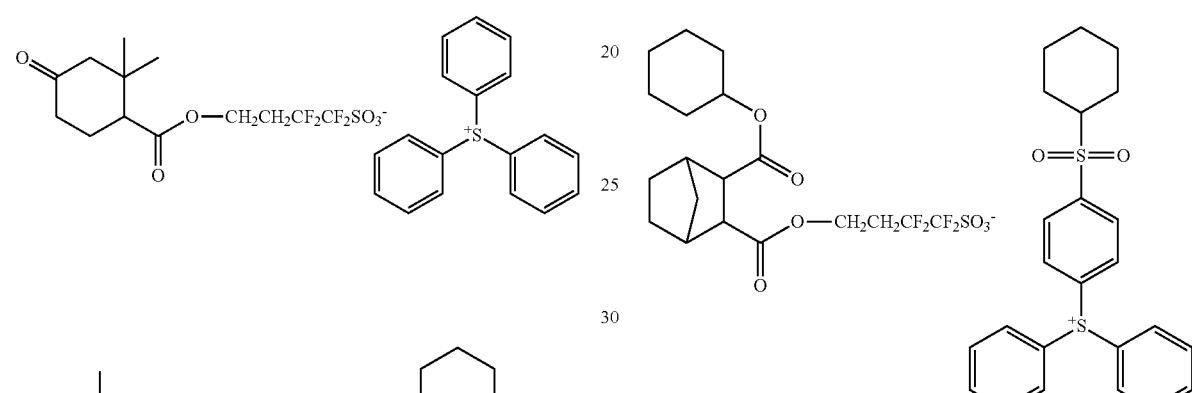
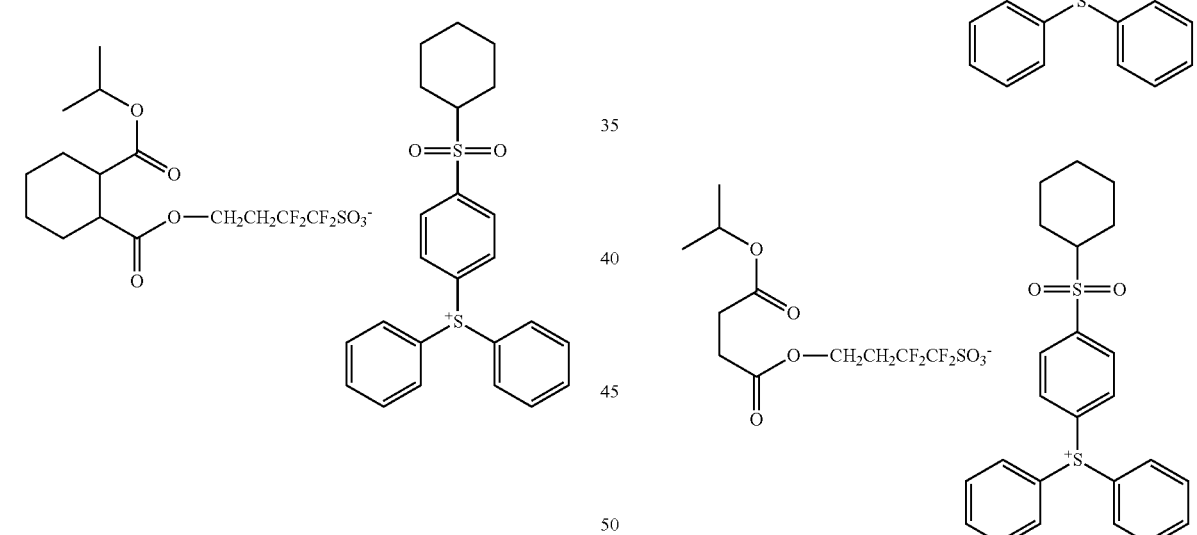
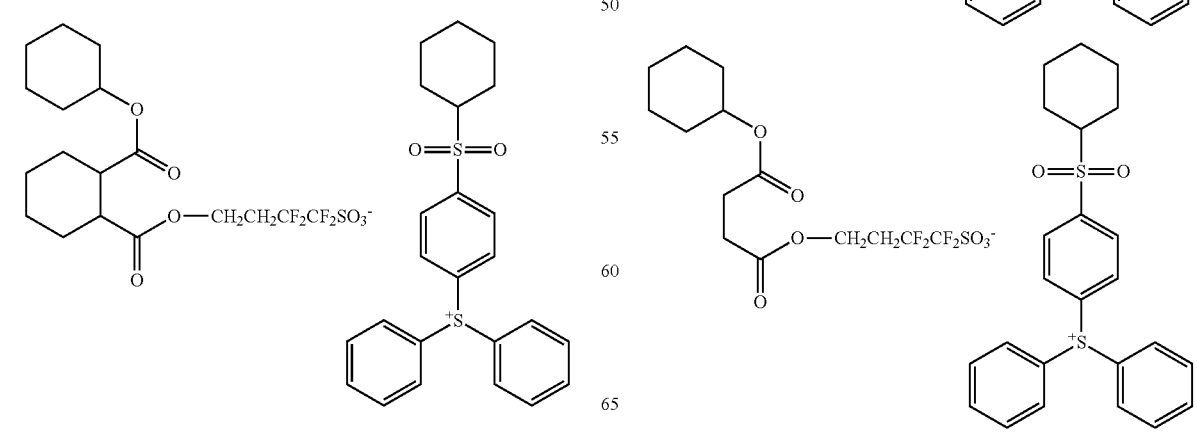

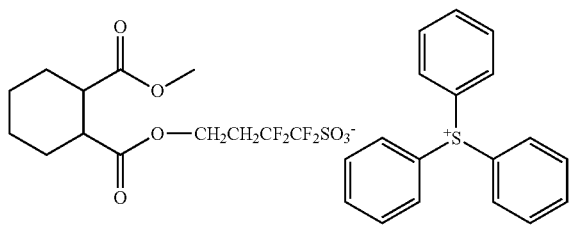
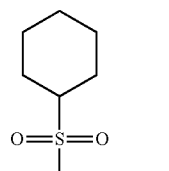
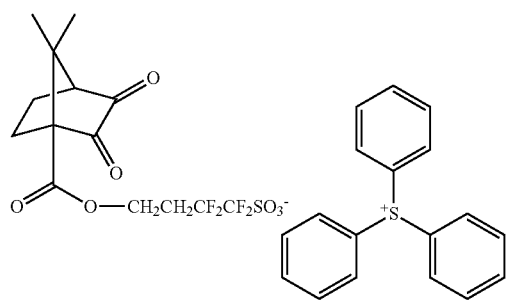
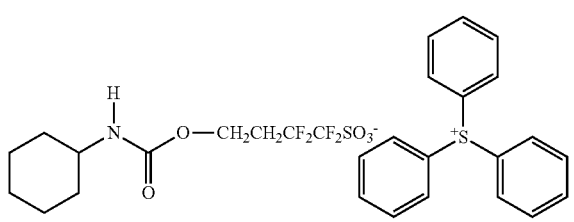
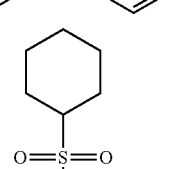
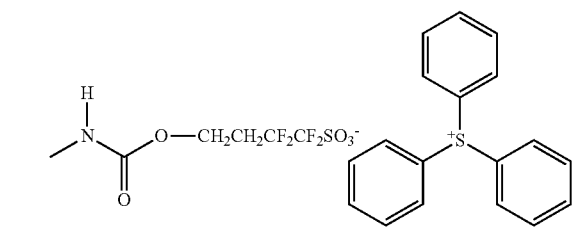
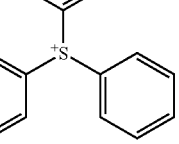
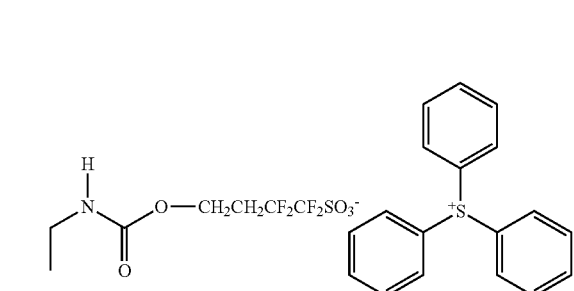
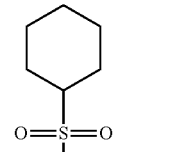
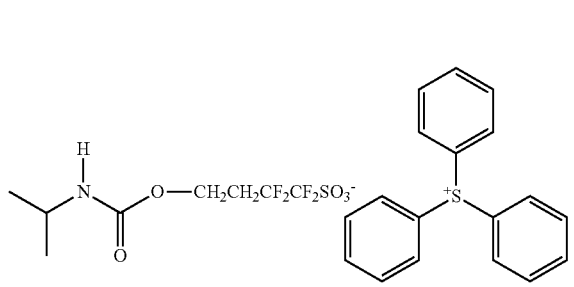
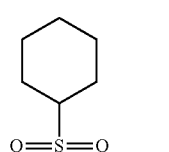
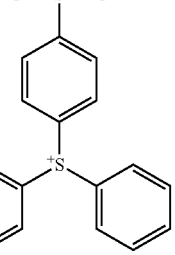

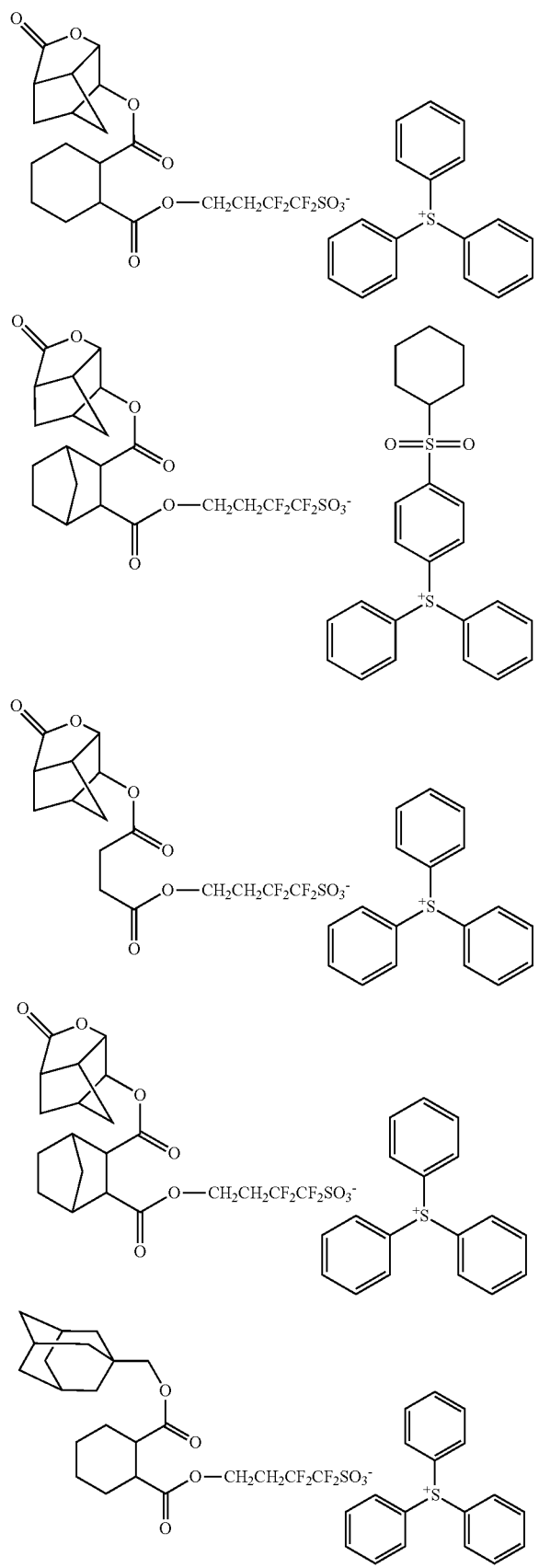
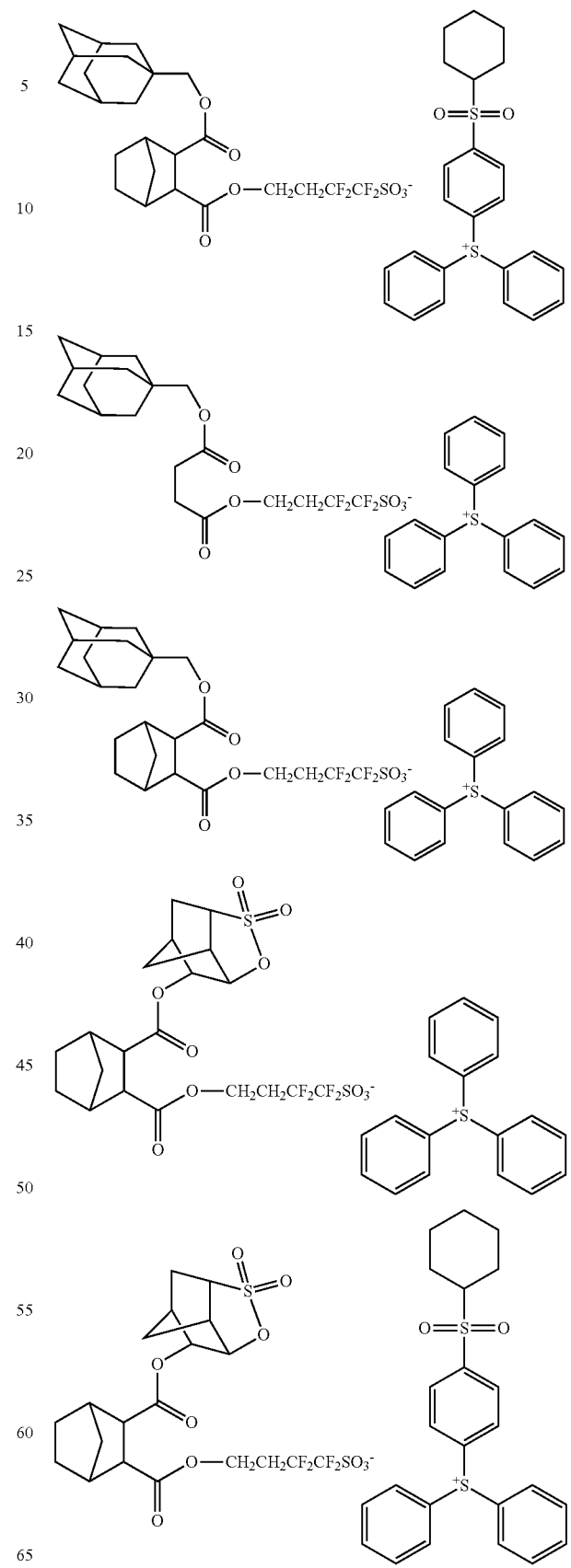

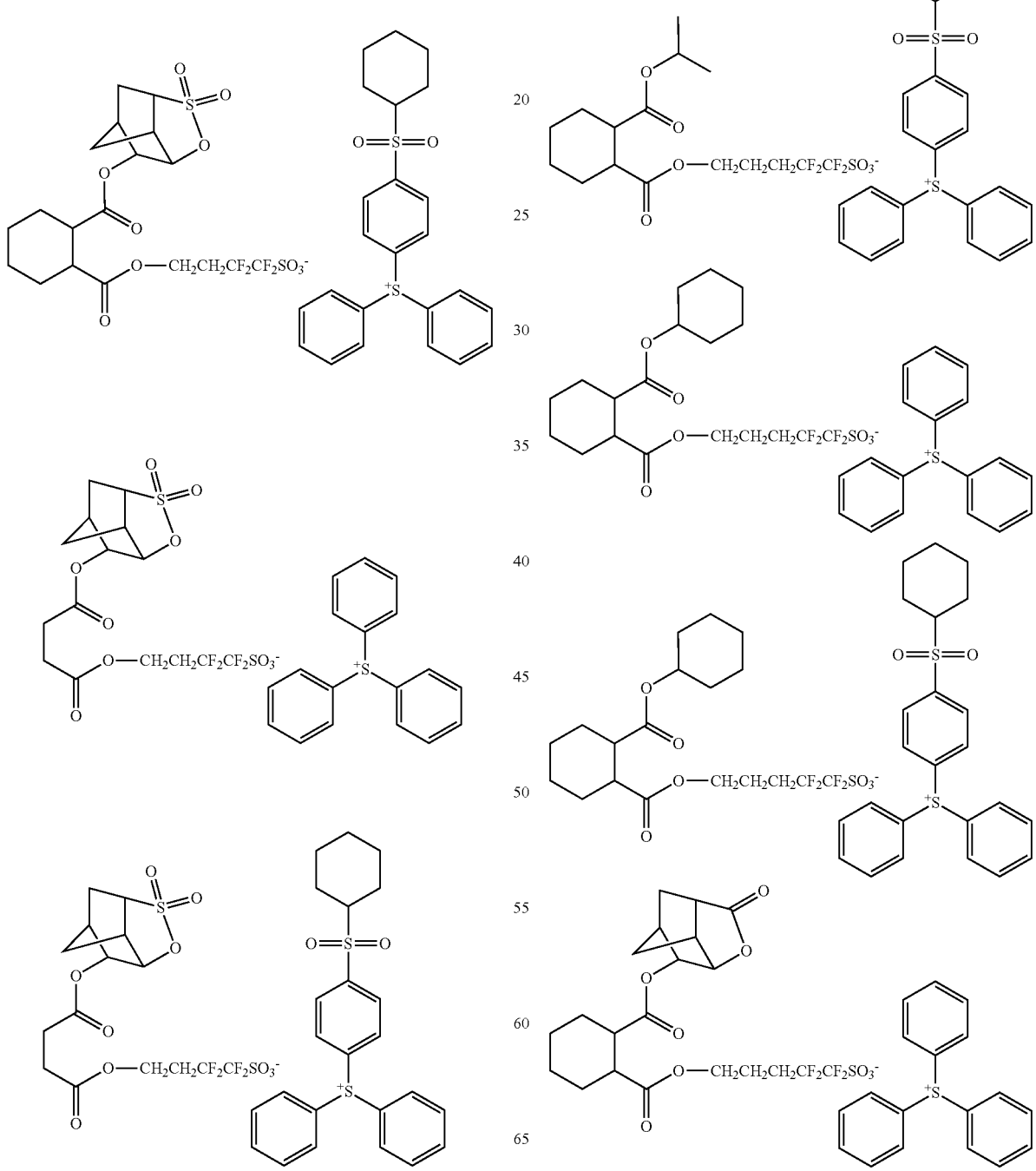

37
-continued
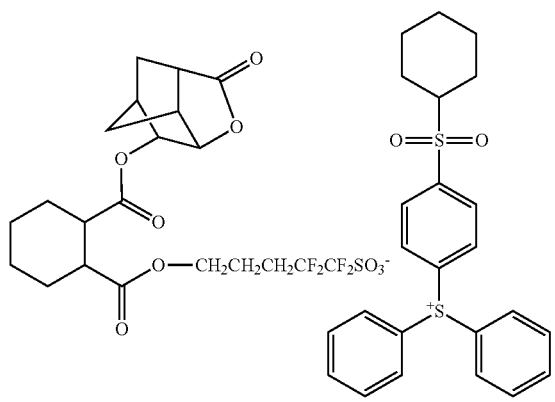
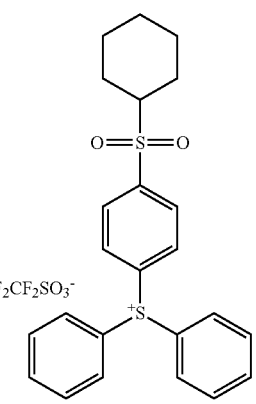
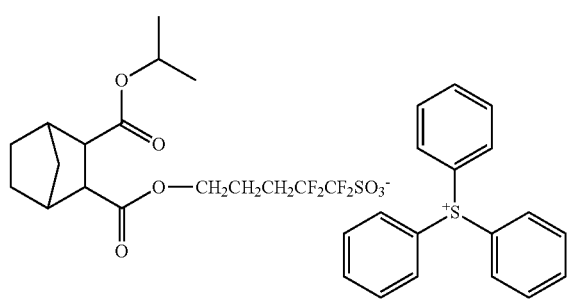
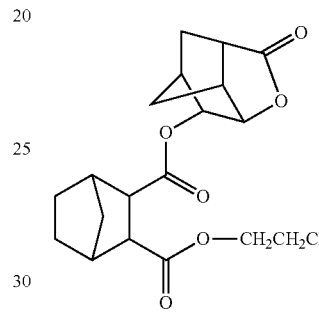
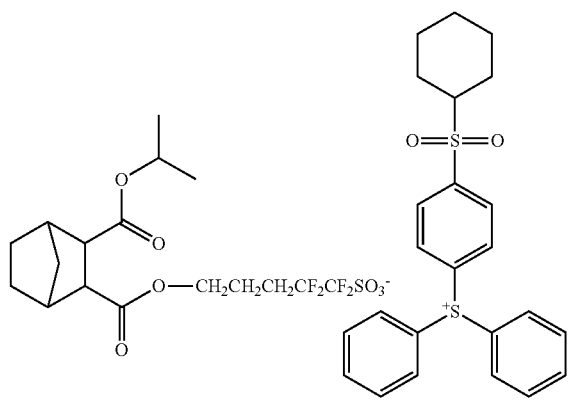
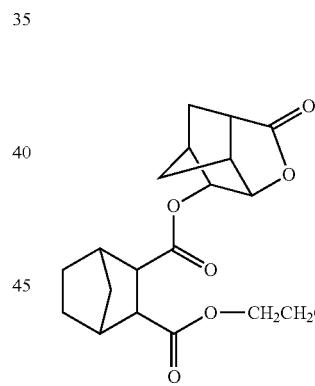
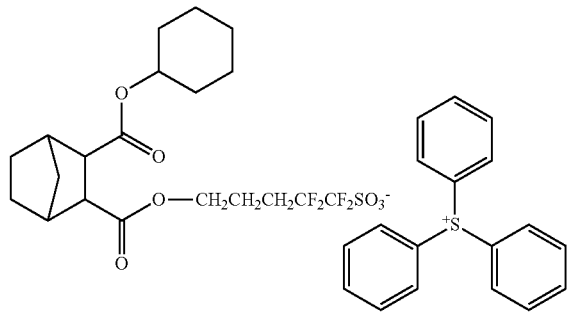
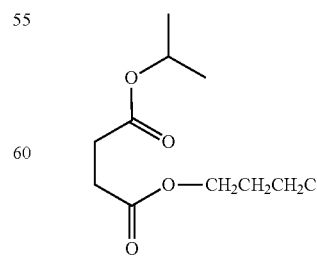
38
-continued
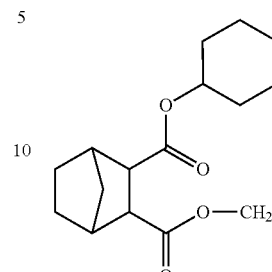
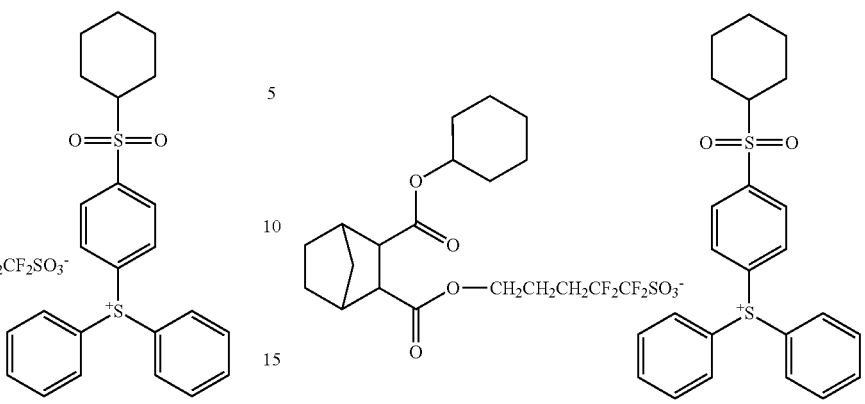
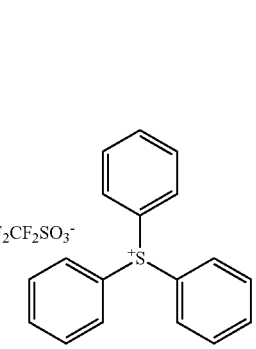
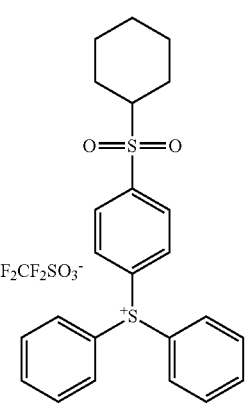
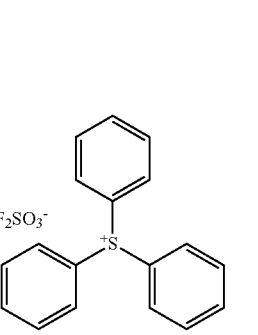
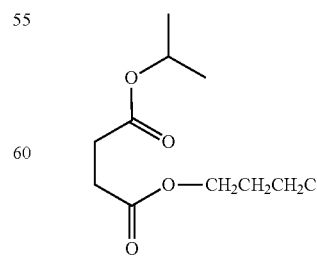

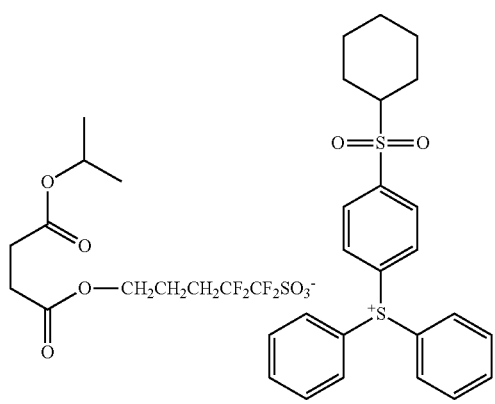
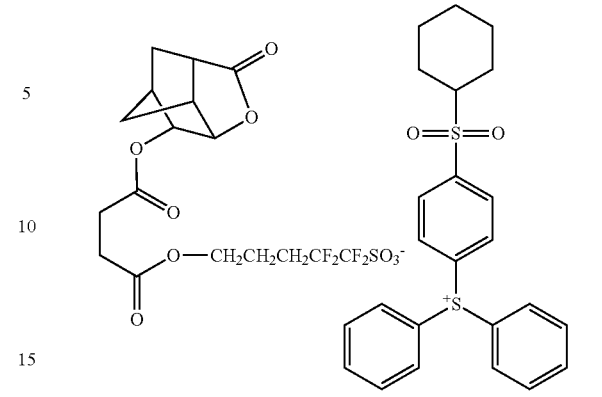
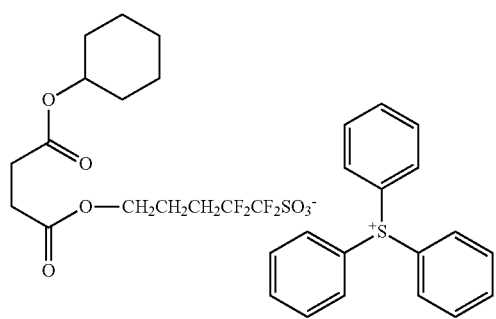
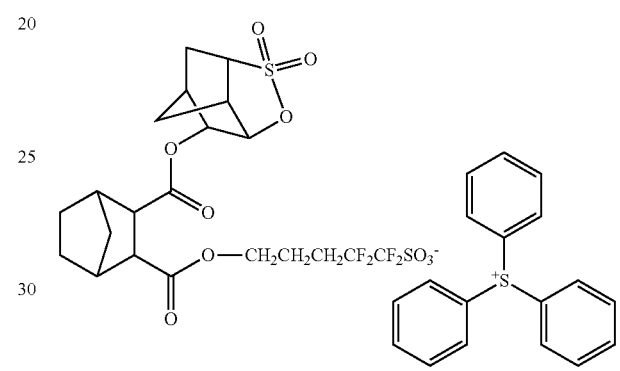
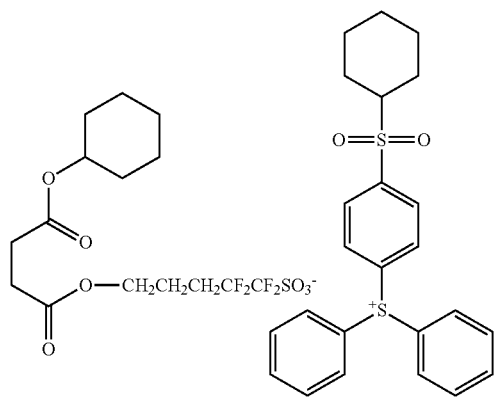
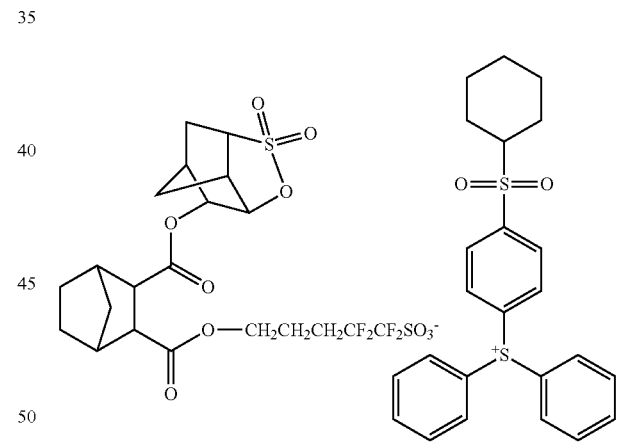
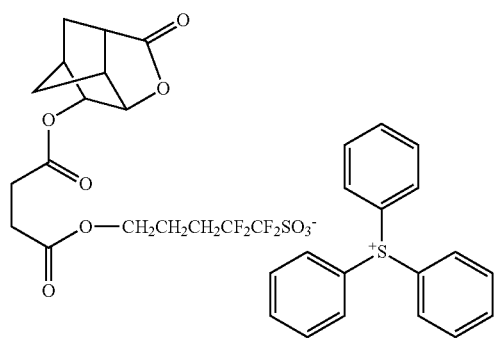
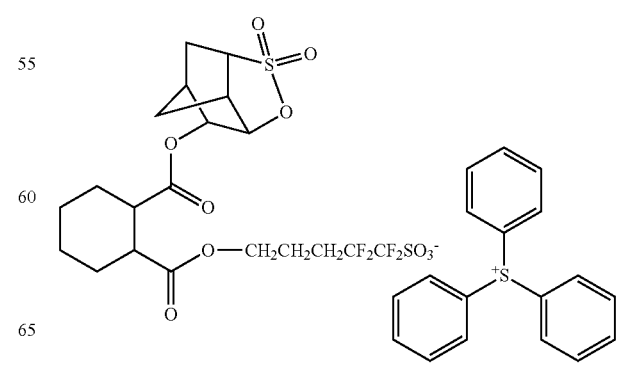

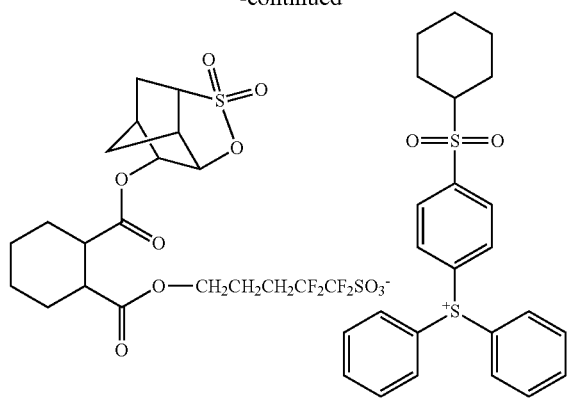
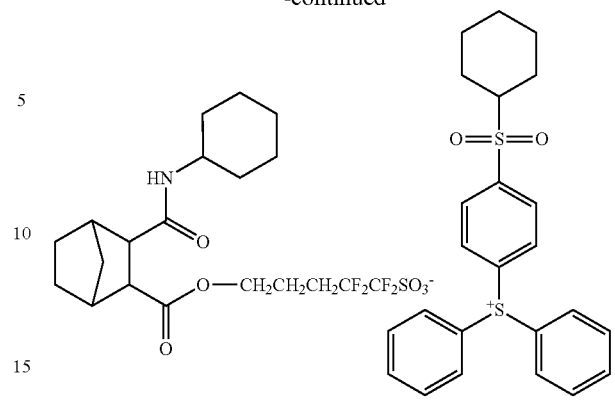

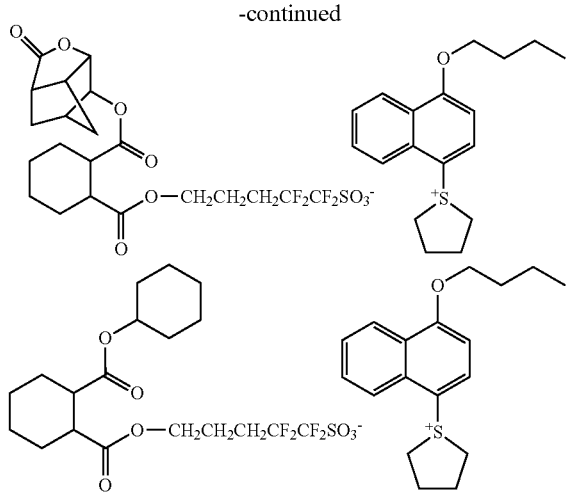

These compounds (A) may be used either alone or in combination. The compound (A) is normally used in an amount of 0.1 to 40 parts by mass, preferably 5 to 40 parts by mass, more preferably 5 to 30 parts by mass, and still more preferably 5 to 25 parts by mass, based on 100 parts by mass of the polymer (B). If the amount of the compound (A) is less than 0.1 parts by mass, it may be difficult to sufficiently achieve the intended effects of the embodiment of the invention. If the amount of the compound (A) exceeds 40 parts by mass, a deterioration in transparency to radiation, pattern shape, heat resistance, and the like may occur.

The radiation-sensitive resin composition may include at least one radiation-sensitive compound (acid generator) (hereinafter referred to as "additional radiation-sensitive compound") other than the compound (A). Examples of the additional radiation-sensitive compound include onium salt compounds, sulfone compounds, sulfonate compounds, N-sulfonyloxyimide compounds, diazomethane compounds, disulfonylmethane compounds, oxime sulfonate compounds, hydrazine sulfonate compounds, and the like.

Further examples of the additional radiation-sensitive compound include the compounds disclosed in paragraphs [0086] to [0113] of WO2009/051088, and the like.

Examples of the onium salt compounds include iodonium salt compounds such as diphenyliodonium trifluoromethanesulfonate, diphenyliodonium nonafluoro-n-butanesulfonate, diphenyliodonium p-toluenesulfonate, diphenyliodonium 10-camphorsulfonate, diphenyliodonium 2-trifluoromethylbenzenesulfonate, diphenyliodonium 4-trifluoromethylbenzenesulfonate, diphenyliodonium 2,4-difluorobenzenesulfonate, diphenyliodonium 1,1,2,2-tetrafluoro-2-(norbornan-2-yl)ethanesulfonate, diphenyliodonium 2-(5-t-butoxycarbonyloxybicyclo[2.2.1]heptan-2-yl)-1,1,2,2-tetrafluoroethanesulfonate, diphenyliodonium 2-(6-t-butoxycarbonyloxybicyclo[2.2.1]heptan-2-yl)-1,1,2,2-tetrafluoroethanesulfonate, diphenyliodonium 1,1-difluoro-2-(bicyclo[2.2.1]heptan-2-yl)ethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium p-toluenesulfonate, bis(4-t-butylphenyl)iodonium 10-camphorsulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl)iodonium 2,4-difluorobenzenesulfonate, bis(4-t-butylphenyl)iodonium 1,1,2,2-tetrafluoro-2-(norbornan-2-yl)ethanesulfonate, and bis(4-t-butylphenyl)iodonium 1,1-difluoro-2-(bicyclo[2.2.1]heptan-2-yl)ethanesulfonate; triphenylsulfonium salt compounds such as triphenylsulfonium trifluoromethanesulfonate, triphenylsulfonium nonafluoro-n-butanesulfonate, triphenylsulfonium p-toluenesulfonate, triphenylsulfonium 10-camphorsulfonate, triphenylsulfonium 2-trifluoromethylbenzenesulfonate, triphenylsulfonium 4-trifluoromethylbenzenesulfonate, triphenylsulfonium 2,4-difluorobenzenesulfonate, triphenylsulfonium 1,1,2,2-tetrafluoro-2-(norbornan-2-yl)ethanesulfonate, triphenylsulfonium 2-(5-t-butoxycarbonyloxybicyclo[2.2.1]heptan-2-yl)-1,1,2,2-tetrafluoroethanesulfonate, triphenylsulfonium 2-(6-t-butoxycarbonyloxybicyclo[2.2.1]heptan-2-yl)-1,1,2,2-tetrafluoroethanesulfonate, triphenylsulfonium 2-(5-pivaloyloxybicyclo[2.2.1]heptan-2-yl)-1,1,2,2-tetrafluoroethanesulfonate, triphenylsulfonium 2-(6-pivaloyloxybicyclo[2.2.1]heptan-2-yl)-1,1,2,2-tetrafluoroethanesulfonate, triphenylsulfonium 2-(5-hydroxybicyclo[2.2.1]heptan-2-yl)-1,1,2,2-tetrafluoroethanesulfonate, triphenylsulfonium 2-(6-hydroxybicyclo[2.2.1]heptan-2-yl)-1,1,2,2-tetrafluoroethanesulfonate, triphenylsulfonium 2-(5-methanesulfonyloxybicyclo[2.2.1]heptan-2-yl)-1,1,2,2-tetrafluoroethanesulfonate, triphenylsulfonium 2-(6-methanesulfonyloxybicyclo[2.2.1]heptan-2-yl)-1,1,2,2-tetrafluoroethanesulfonate, triphenylsulfonium 2-(5-1-propanesulfonyloxybicyclo[2.2.1]heptan-2-yl)-1,1,2,2-tetrafluoroethanesulfonate, triphenylsulfonium 2-(6-1-propanesulfonyloxybicyclo[2.2.1]heptan-2-yl)-1,1,2,2-tetrafluoroethanesulfonate, triphenylsulfonium 2-(5-n-hexanesulfonyloxybicyclo [2.2.1]heptan-2-yl)-1,1,2,2-tetrafluoroethanesulfonate, triphenylsulfonium 2-(6-n-hexanesulfonyloxybicyclo[2.2.1]heptan-2-yl)-1,1,2,2-tetrafluoroethanesulfonate, triphenylsulfonium 2-(5-oxobicyclo[2.2.1]heptan-2-yl)-1,1,2,2-tetrafluoroethanesulfonate, triphenylsulfonium 2-(6-oxobicyclo[2.2.1]heptan-2-yl)-1,1,2,2-tetrafluoroethanesulfonate, and triphenylsulfonium 1,1-difluoro-2-(bicyclo[2.2.1]heptan-2-yl)ethanesulfonate; tetrahydrothiophenium salt compounds such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium 1,1,2,2-tetrafluoro-2-(norbornan-2-yl)ethanesulfonate, 1-(4-n-butoxynaphthalen-1-yl)tetrahydrothiophenium 2-(5-t-butoxycarbonylo xybicyclo [2.2.1]heptan-2-yl)-1,1,2,2-tetrafluoroethanesulfonate, 1-(4-n-butoxynaphthalen-1-yl)tetrahydrothiophenium 2-(6-t-butoxycarbonyloxybicyclo [2.2.1]heptan-2-yl)-1,1,2,2-tetrafluoroethanesulfonate, and 1-(4-n-butoxynaphthalen-1-yl)tetrahydrothiophenium 1,1-difluoro-2-(bicyclo[2.2.1]heptan-2-yl)ethanesulfonate; and the like.

Examples of the N-sulfonyloxyimide compounds include N-(trifluoromethanesulfonyloxy)succinimide, N-(10-camphorsulfonyloxy)succinimide, n-[(5-methyl-5-carboxymethylbicyclo[2.2.1]heptan-2-yl)sulfonyloxy]succinimide, N-(trifluoromethanesulfonyloxy)bicyclo [2.2.1]hept-5-ene-2,3-dicarboxylmide, N-(nonafluoro-n-butanesulfonyloxy) bicyclo [2.2.1]hept-5-ene-2,3-dicarboxylmide, n-[1,1,2,2-tetrafluoro-2-(norbornan-2-yl)ethanesulfonyloxy]bicyclo [2.2.1]hept-5-ene-2,3-dicarboxylmide, N-(10-camphorsulfonyloxy)bicyclo[2.2.1]hept-5-ene-2,3-dicarboxylmide, n-[2-(5-oxobicyclo[2.2.1]heptan-2-yl)-1,1,2,2-tetrafluoroethanesulfonyloxy]bicyclo[2.2.1]hept-5-ene-2,3-dicarboxylmide, n-[2-(6-oxobicyclo[2.2.1]heptan-2-yl)-1,1,2,2-tetrafluoroethanesulfonyloxy]bicyclo[2.2.1]hept-5- ene-2,3-dicarboxylmide, n-[1,1-difluoro-2-(bicyclo[2.2.1] heptan-2-yl)ethanesulfonyloxy]bicyclo[2.2.1]hept-5-ene-2,3-dicarboxylmide, and the like.

Examples of the diazomethane compounds include bis(cyclohexanesulfonyl)diazomethane, bis(t-butylsulfonyl)diazomethane, bis(1,4-dioxaspiro[4.5]decane-7-sulfonyl)diazomethane, and the like.

The onium salt compounds, the N-sulfonyloxyimide compounds, and the diazomethane compounds are preferable as the additional radiation-sensitive compound.

The additional radiation-sensitive compound is normally used in an amount of 95 parts by mass or less, preferably 90 parts by mass or less, and still more preferably 80 parts by mass or less, based on 100 parts by mass or less of the compound (A) and the additional radiation-sensitive compound in total. If the amount of the additional radiation-sensitive compound exceeds 95 parts by mass, the intended effects of the embodiment of the invention may be impaired.

Polymer (B)

The polymer (B) serves as a base resin in the radiation-sensitive resin composition. The term "base resin" used herein refers to a polymer that is used as the main component of a resist pattern formed using the radiation-sensitive resin composition, and is preferably included in the resist pattern in an amount of 50 mass % or more based on the total polymers. Examples of the polymer (B) include an acid-labile group-containing polymer that is insoluble or scarcely soluble in an alkali, but becomes easily soluble in an alkali upon dissociation of the acid-labile group (hereinafter may be referred to as "polymer (B1)"), a polymer that is soluble in an alkaline developer, and includes one or more functional groups that exhibit affinity to an alkaline developer (e.g., oxygen-containing functional groups such as a phenolic hydroxyl group, an alcoholic hydroxyl group, and a carboxyl group) (hereinafter may be referred to as "polymer (B2)"), and the like. The radiation-sensitive resin composition that includes the polymer (B1) may suitably be used as a positive-tone radiation-sensitive resin composition, and the radiation-sensitive resin composition that includes the polymer (B2) may suitably be used as a negative-tone radiation-sensitive resin composition.

The expression "insoluble or scarcely soluble in an alkali" means that a film that is formed using only the acid-labile group-containing polymer has a thickness equal to or more than 50% of the initial thickness when developed under alkaline development conditions employed in a resist pattern-forming process.

When using the polymer (B) and the polymer (C) in combination, the fluorine atom content in the polymer (B) is normally less than 5 mass %, preferably 0 to 4.9 mass %, and more preferably 0 to 4 mass %. Note that the fluorine atom content in the polymer may be determined by determining the structure of the polymer by $^{13}$C-NMR spectroscopy. When the fluorine atom content in the polymer (B) is within the above range, the surface of a resist film formed using the radiation-sensitive resin composition that includes the polymer (B) and the polymer (C) exhibits improved water repellency. This makes it unnecessary to form an upper-layer film for liquid immersion lithography.

Polymer (B1)

The polymer (B1) is an acid-labile group-containing polymer that is insoluble or scarcely soluble in an alkali, but becomes easily soluble in an alkali upon dissociation of the acid-labile group. The term "acid-labile group" used herein refers to a group that substitutes the hydrogen atom of an acidic functional group (e.g., phenolic hydroxyl group, carboxyl group, or sulfonic acid group), and dissociates in the presence of an acid. Examples of the acid-labile group include a substituted methyl group, a 1-substituted ethyl group, a 1-substituted n-propyl group, a 1-branched alkyl group, an alkoxycarbonyl group, an acyl group, a cyclic acid-labile group, and the like.

Examples of the substituted methyl group include the groups disclosed in paragraphs [0117] of WO2009/051088, and the like. Examples of the 1-substituted ethyl group include the groups disclosed in paragraphs [0118] of WO2009/051088, and the like. Examples of the 1-substituted n-propyl group include the groups disclosed in paragraphs [0119] of WO2009/051088, and the like. Examples of the acyl group include the groups disclosed in paragraphs [0120] of WO2009/051088, and the like. Examples of the cyclic acid-labile group include the groups disclosed in paragraphs [0121] of WO2009/051088, and the like.

Among these acid-labile groups, a benzyl group, a t-butoxycarbonylmethyl group, a 1-methoxyethyl group, a 1-ethoxyethyl group, a 1-cyclohexyloxyethyl group, a 1-ethoxy-n-propyl group, a t-butyl group, a 1,1-dimethylpropyl group, a t-butoxycarbonyl group, a tetrahydropyranyl group, a tetrahydrofuranyl group, a tetrahydrothiopyranyl group, and a tetrahydrothiofuranyl group are preferable. The polymer (B1) may include one or more acid-labile groups.

The acid-labile group content in the polymer (B1) (i.e., the ratio of the number of acid-labile groups to the total number of acidic functional groups and acid-labile groups in the polymer (B1)) may be appropriately selected depending on the type of the acid-labile group and the type of the polymer into which the acid-labile group is introduced, but is preferably 5 to 100 mol %, and still more preferably 10 to 100 mol %.

The structure of the polymer (B1) is not particularly limited as long as the polymer (B1) has the above properties. It is preferable that the polymer (B1) be a polymer obtained by substituting some or all of the hydrogen atoms of the phenolic hydroxyl groups of poly(4-hydroxystyrene) with the acid-labile group, or a polymer obtained by substituting some or all of the hydrogen atoms of the phenolic hydroxyl groups and/or the carboxyl groups of a copolymer of 4-hydroxystyrene and/or 4-hydroxy-α-methylstyrene and (meth)acrylic acid with the acid-labile group.

The structure of the polymer (B1) may be appropriately selected depending on the type of radiation. For example, when the radiation-sensitive resin composition is a positive-tone radiation-sensitive resin composition that utilizes KrF excimer laser light, it is preferable that the polymer (B1) be a polymer that is insoluble or scarcely soluble in an alkali, and includes a structural unit represented by the following formula (4) (hereinafter may be referred to as "structural unit (4)"), and a structural unit obtained by protecting the phenolic hydroxyl group included in the structural unit (4) with the acid-labile group. Note that this polymer is also suitably used when utilizing ArF excimer laser light, $F_2$ excimer laser light, electron beams, or the like.

(4)

wherein $R^{13}$ is a hydrogen atom or a monovalent organic group, and n9 and n10 are each independently an integer from 1 to 3, wherein a plurality of $R^{13}$ may be either identical or different in a case where a plurality of $R^{13}$ are present.

A structural unit derived from 4-hydroxystyrene is preferable as the structural unit (4). The polymer (B1) may further include an additional structural unit.

Examples of the additional structural unit include a structural unit derived from a vinyl aromatic compound (e.g., styrene or α-methylstyrene), a structural unit derived from a (meth)acrylate (e.g., t-butyl (meth)acrylate, adamantyl (meth)acrylate, or 2-methyladamantyl (meth)acrylate), and the like.

When the radiation-sensitive resin composition is a positive-tone radiation-sensitive resin composition that utilizes ArF excimer laser light, it is preferable that the polymer (B1) be a polymer that is insoluble or scarcely soluble in an alkali, and includes a structural unit represented by the following formula (5) (hereinafter may be referred to as "structural unit (5)"). Note that this polymer is also suitably used when utilizing KrF excimer laser light, $F_2$ excimer laser light, electron beams, or the like.

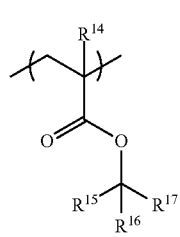

(5)

wherein $R^{14}$ is a hydrogen atom or a methyl group, and $R^{15}$, $R^{16}$, and $R^{17}$ are each independently a linear or branched alkyl group having 1 to 4 carbon atoms or an alicyclic hydrocarbon group having 4 to 20 carbon atoms, wherein two of $R^{15}$, $R^{16}$, and $R^{17}$ may bond to each other to form an alicyclic hydrocarbon group having 4 to 20 carbon atoms together with the carbon atom bonded thereto.

Examples of the alkyl group having 1 to 4 carbon atoms represented by $R^{15}$, $R^{16}$, and $R^{17}$ include a methyl group, an ethyl group, an n-propyl group, an i-propyl group, an n-butyl group, and the like. Examples of the monovalent alicyclic hydrocarbon group having 4 to 20 carbon atoms represented by $R^{15}$, $R^{16}$, and $R^{17}$, and the divalent alicyclic hydrocarbon group having 4 to 20 carbon atoms formed by two of $R^{15}$, $R^{16}$, and $R^{17}$ together with the carbon atom bonded thereto, include the alicyclic hydrocarbon groups mentioned above in connection with $R_2$ and $R_5$, and the like.

Examples of the group represented by $-C(R^{15})(R^{16})(R^{17})$ in the formula (5) include branched alkyl groups (e.g., t-butyl group and t-amyl group); the alicyclic structure-containing groups represented by the following formulas; and the like.

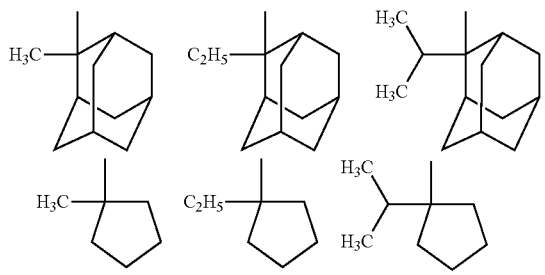

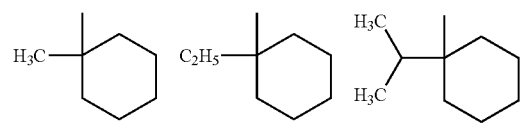

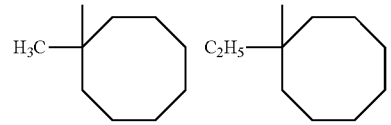

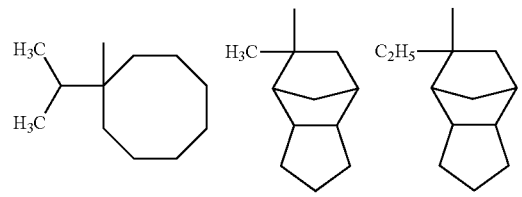

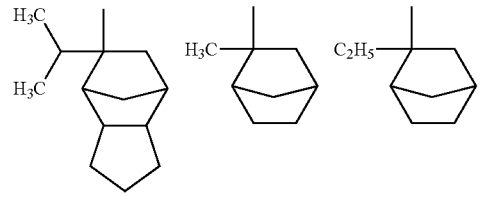

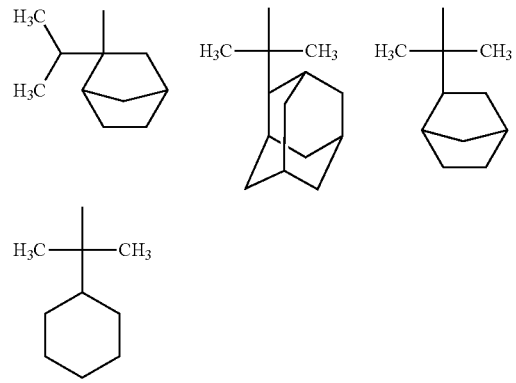

The structural unit (5) is preferably any of the structural units represented by the following formulas (5-1) to (5-18), and more preferably any of the structural units represented by the formulas (5-3), (5-4), (5-9), (5-12), and (5-13). The polymer (B) may include only one type of the structural unit (5), or may include two or more types of the structural unit (5).

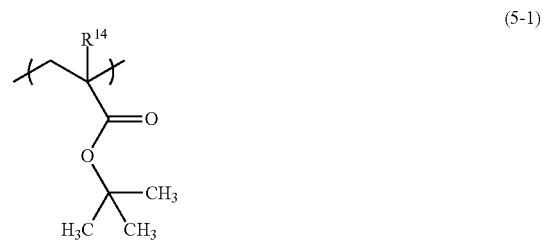

(5-1)

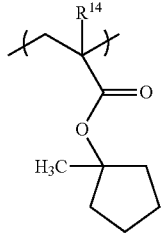
(5-2)
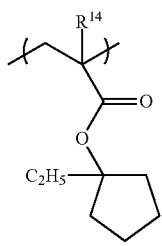
(5-3)
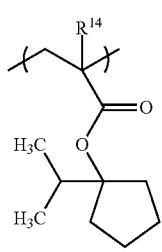
(5-4)
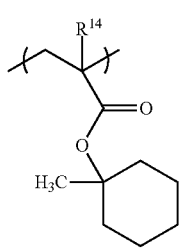
(5-5)
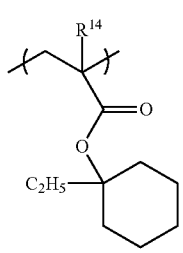
(5-6)
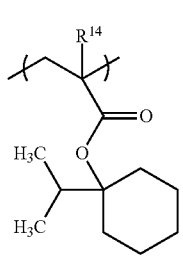
(5-7)
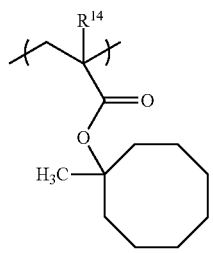
(5-8)
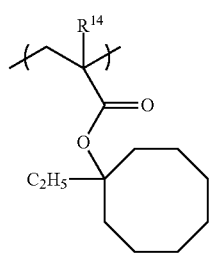
(5-9)
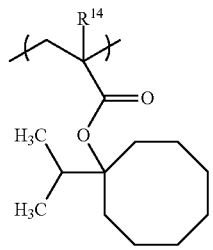
(5-10)
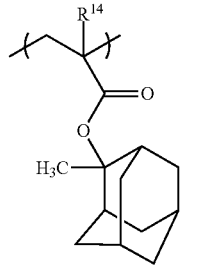
(5-11)
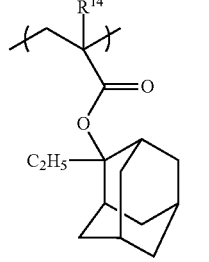
(5-12)
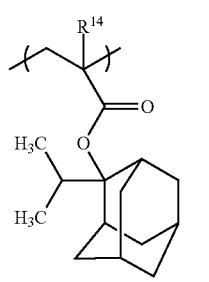
(5-13)

(5-14)

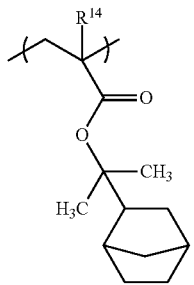

(5-15)

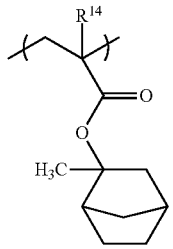

(5-16)

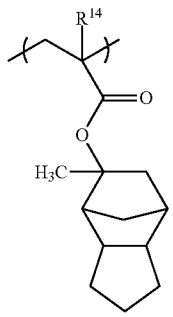

(5-17)

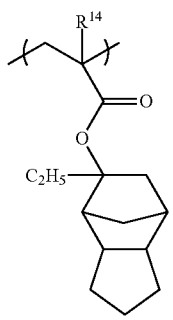

(5-18)

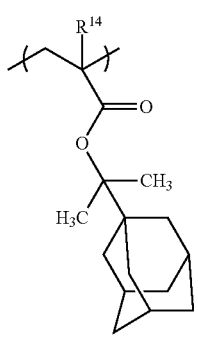

wherein $R^{14}$ is the same as defined for the formula (5).

It is preferable that the polymer (B1) further include one or more structural units that include a lactone skeleton or a cyclic carbonate skeleton (hereinafter may be referred to as "structural unit (6)"). Examples of the structural unit (6) include structural units represented by the following formulas, and the like.

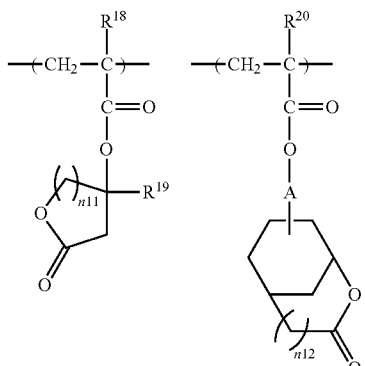

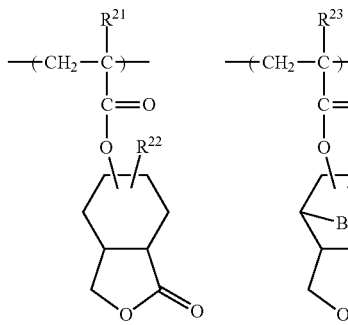

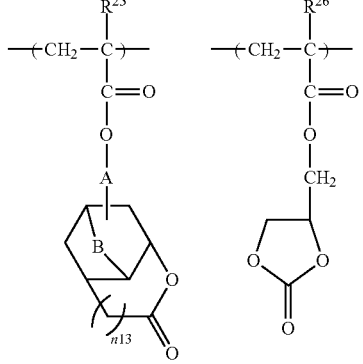

wherein $R^{18}$, $R^{19}$, $R^{20}$, $R^{21}$, $R^{23}$, $R^{25}$, and $R^{26}$ are each independently a hydrogen atom or a methyl group, $R^{22}$ and $R^{24}$ are each independently a hydrogen atom or a methoxy group, A is a single bond or a methylene group, B is a methylene group or an oxygen atom, n11 is an integer from 0 to 2, and n12 to n13 are each independently 0 or 1.

The structural unit (6) is preferably any of structural units represented by the following formulas.

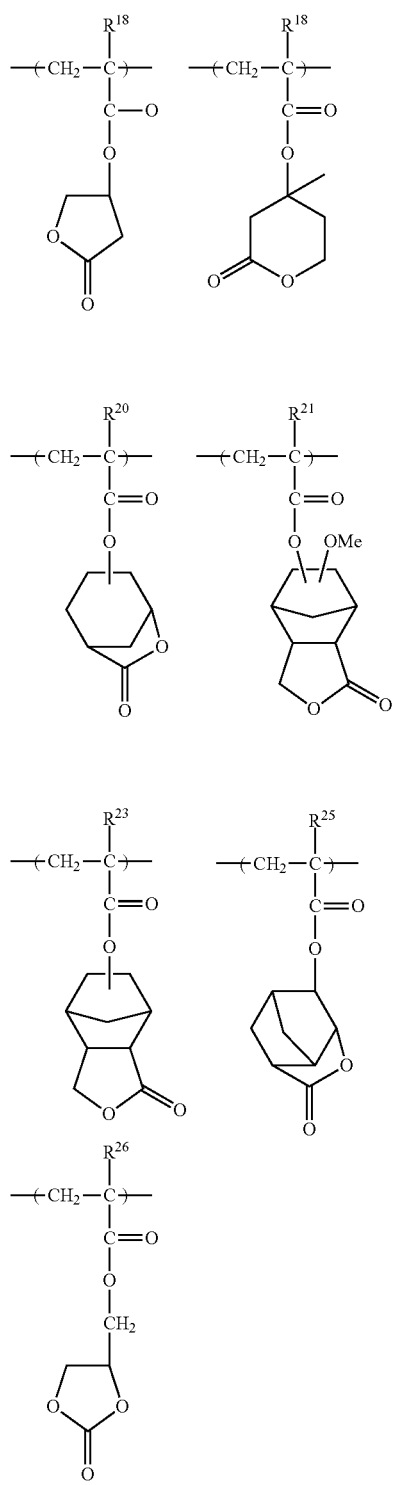

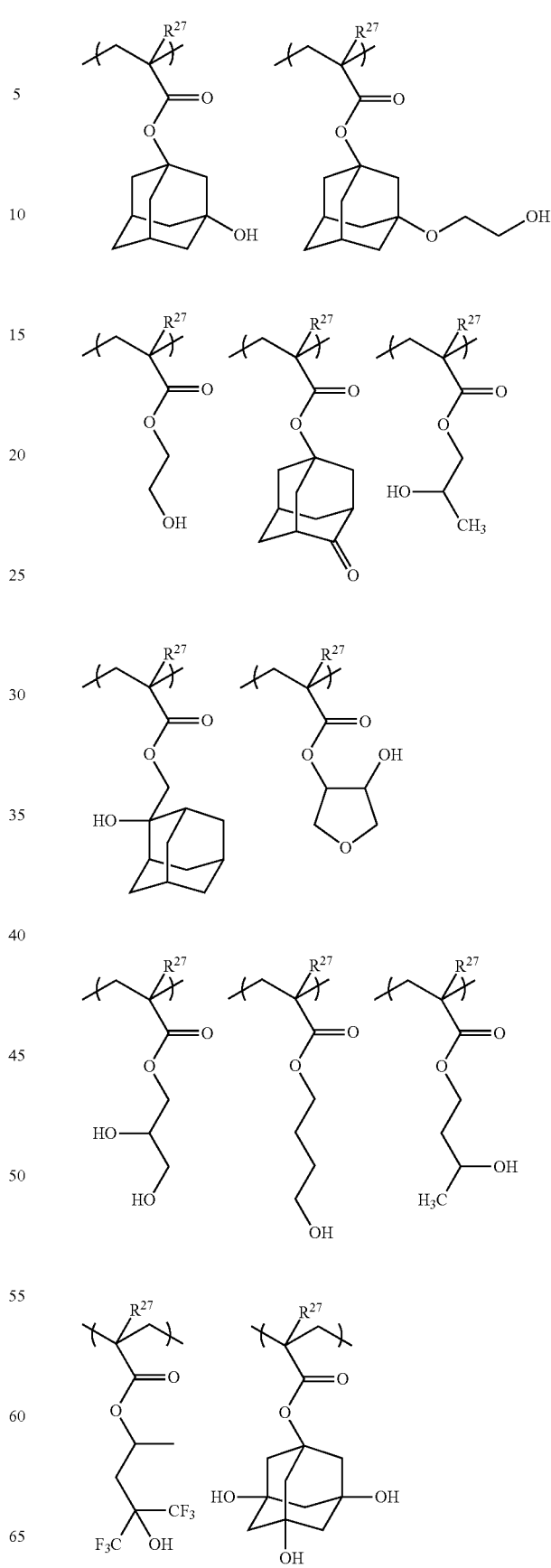

wherein $R^{18}$, $R^{20}$, $R^{21}$, and $R^{23}$ are each independently a hydrogen atom or a methyl group.

The polymer (B1) may include a structural unit that includes a polar group (hereinafter may be referred to as "structural unit (7)"). Examples of the polar group include a hydroxyl group, a ketonic carbonyl group, a sulfonamide group, and the like. Examples of the structural unit (7) include structural units represented by the following formulas, and the like.

-continued

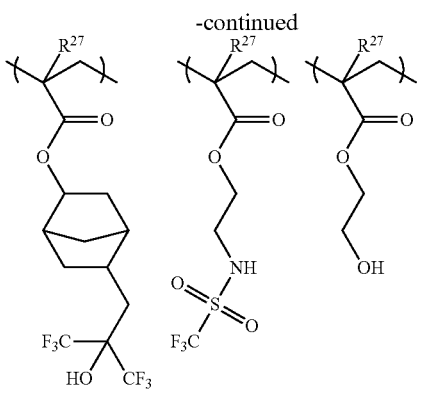

wherein R²⁷ is a hydrogen atom or a methyl group.

The polymer (B1) may further include a structural unit derived from an alkyl (meth)acrylate such as methyl (meth)acrylate, ethyl (meth)acrylate, butyl (meth)acrylate, lauryl (meth)acrylate, cyclohexyl (meth)acrylate, bicyclo[2.2.1]heptyl (meth)acrylate, cyclohexyl (meth)acrylate, bicyclo[4.4.0]decanyl (meth)acrylate, bicyclo[2.2.2]octyl (meth)acrylate, tricyclo[5.2.1.0$^{2,6}$]decanyl (meth)acrylate, adamantyl (meth)acrylate, or tricyclo[3.3.1.1$^{3,7}$]decanyl (meth)acrylate.

When the radiation-sensitive resin composition is a positive-tone radiation-sensitive resin composition that utilizes F$_2$ excimer laser light, the polymer disclosed in paragraphs [0136] to [0147] of WO2009/051088 are preferable as the polymer (B1).

When the polymer (B1) is synthesized by polymerizing a polymerizable unsaturated monomer, or synthesized through polymerization of a polymerizable unsaturated monomer, a branched structure may be introduced into the polymer (B1) using a structural unit derived from a polyfunctional monomer that includes two or more polymerizable unsaturated bonds and/or an acetal crosslinking group. The heat resistance of the polymer (B1) can be improved by introducing the branched structure.

In this case, the branched structure content in the polymer (B1) may be appropriately selected depending on the type of the branched structure and the type of the polymer into which the branched structure is introduced. It is preferable that the content of a structural unit that includes a branched structure in the polymer (B1) be 10 mol % or less based on the total content of the structural units included in the polymer (B1).

The molecular weight of the polymer (B1) is not particularly limited. The polystyrene-reduced weight molecular weight (Mw) of the polymer (B1) determined by gel permeation chromatography (GPC) is normally 1000 to 500,000, preferably 2000 to 400,000, and still more preferably 3000 to 300,000.

The Mw of the polymer (B1) that does not include a branched structure is preferably 1000 to 150,000, and more preferably 3000 to 100,000. The Mw of the polymer (B1) that includes a branched structure is preferably 5000 to 500,000, and more preferably 8000 to 300,000. The radiation-sensitive resin composition exhibits excellent alkali developability when the Mw of the polymer (B1) is within the above range.

The ratio (Mw/Mn) of the Mw to the polystyrene-reduced number molecular weight (Mn) of the polymer (B1) determined by GPC is not particularly limited, but is normally 1 to 10, preferably 1 to 8, and still more preferably 1 to 5. The radiation-sensitive resin composition exhibits excellent resolution capability when the ratio "Mw/Mn" of the polymer (B1) is within the above range. The radiation-sensitive resin composition may include only one type of the polymer (B1), or may include two or more types of the polymer (B1).

The polymer (B1) may be synthesized by an arbitrary method. For example, the polymer (B1) may be synthesized by a method that introduces one or more acid-labile groups into the acidic functional group of an alkali-soluble polymer synthesized in advance, a method that polymerizes one or more polymerizable unsaturated monomers including an acid-labile group optionally together with one or more additional polymerizable unsaturated monomers, or a method that polycondenses one or more polycondensable components including an acid-labile group optionally together with an additional polycondensable component.

The polymerizable unsaturated monomer and the polymerizable unsaturated monomer including an acid-labile group may be polymerized by bulk polymerization, solution polymerization, precipitation polymerization, emulsion polymerization, suspension polymerization, bulk-suspension polymerization, or the like using an appropriate initiator (e.g., radical initiator) or an appropriate polymerization catalyst (e.g., anionic polymerization catalyst, coordination anionic polymerization catalyst, or cationic polymerization catalyst) depending on the type of the polymerizable unsaturated monomer, the type of the reaction medium, and the like.

The polycondensable component including an acid-labile group may preferably be polycondensed in an aqueous medium or a mixture of water and a hydrophilic solvent in the presence of an acidic catalyst.

Polymer (B2)

Examples of the polymer (B2) include a polymer that includes at least one structural unit selected from the group consisting of a structural unit represented by the following formula (8) (hereinafter may be referred to as "structural unit (8)"), a structural unit represented by the following formula (9) (hereinafter may be referred to as "structural unit (9)"), and a structural unit represented by the following formula (10) (hereinafter may be referred to as "structural unit (10)"), and the like.

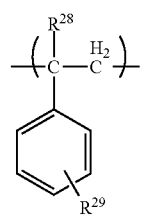

(8)

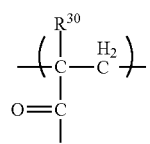

(9)

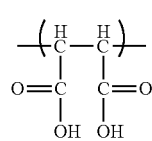

(10)

wherein R²⁸ and R³⁰ are each independently a hydrogen atom or a methyl group, R²⁹ is a hydroxyl group, a carboxyl group, —R³¹COOH, —OR³¹COOH, —OCOR³¹COOH, or —COOR$^{31}$COOH, R$^{31}$ is each independently —(CH$_2$)$_{n14}$—, and n14 is an integer from 1 to 4.

The polymer (B2) may include only the structural unit (8), the structural unit (9), and/or the structural unit (10), or may include one or more additional structural units as long as the polymer is soluble in an alkaline developer. Examples of the additional structural unit include the additional structural units mentioned above in connection with the polymer (B1), and the like.

The total content of the structural unit (8), the structural unit (9), and the structural unit (10) in the polymer (B2) is appropriately selected depending on the type of the optional additional structural unit, but is preferably 10 to 100 mol %, and more preferably 20 to 100 mol %.

When the polymer (B2) includes a structural unit that includes a carbon-carbon unsaturated bond (e.g., structural unit (8)), the carbon-carbon unsaturated bond may be hydrogenated. In this case, the hydrogenation rate is normally 70 mol % or less, preferably 50 mol % or less, and more preferably 40 mol % or less, based on the number of moles of carbon-carbon unsaturated bonds included in the structural unit. If the hydrogenation rate exceeds 70 mol %, the alkali developability of the radiation-sensitive resin composition that includes the polymer (B2) may deteriorate.

A polymer that mainly includes poly(4-hydroxystyrene), a 4-hydroxystyrene/4-hydroxy-α-methylstyrene copolymer, or a 4-hydroxystyrene/styrene copolymer is preferable as the polymer (B2).

The Mw of the polymer (B2) is appropriately selected depending on the desired properties of the radiation-sensitive resin composition, but is normally 1000 to 150,000, and preferably 3000 to 100,000.

The radiation-sensitive resin composition may include only one type of the polymer (B2), or may include two or more types of the polymer (B2).

Crosslinking Agent

When the radiation-sensitive resin composition mainly includes the polymer (B2), and is used as a negative-tone radiation-sensitive resin composition, the radiation-sensitive resin composition may include a compound (crosslinking agent) that crosslinks an alkali-soluble polymer in the presence of an acid. Examples of the crosslinking agent include a compound that includes one or more functional groups (crosslinkable functional groups) having crosslinking reactivity with an alkali-soluble polymer.

Examples of the crosslinkable functional group include a glycidyl ether group, a glycidyl ester group, a glycidyl amino group, a methoxymethyl group, an ethoxymethyl group, a benzyloxymethyl group, an acetoxymethyl group, a benzoiloxymethyl group, a formyl group, an acetyl group, a vinyl group, an isopropenyl group, a (dimethylamino)methyl group, a (diethylamino)methyl group, a (dimethylolamino) methyl group, a (diethylolamino)methyl group, a morpholinomethyl group, and the like.

Examples of the crosslinking agent include a bisphenol A-based epoxy compound, a bisphenol F-based epoxy compound, a bisphenol S-based epoxy compound, a novolac polymer-based epoxy compound, a resol polymer-based epoxy compound, a poly(hydroxystyrene)-based epoxy compound, a methylol group-containing melamine compound, a methylol group-containing benzoguanamine compound, a methylol group-containing urea compound, a methylol group-containing phenol compound, an alkoxyalkyl group-containing melamine compound, an alkoxyalkyl group-containing benzoguanamine compound, an alkoxyalkyl group-containing urea compound, an alkoxyalkyl group-containing phenol compound, a carboxymethyl group-containing melamine polymer, a carboxymethyl group-containing benzoguanamine polymer, a carboxymethyl group-containing urea polymer, a carboxymethyl group-containing phenol polymer, a carboxymethyl group-containing melamine compound, a carboxymethyl group-containing benzoguanamine compound, a carboxymethyl group-containing urea compound, a carboxymethyl group-containing phenol compound, and the like.

Among these, a methylol group-containing phenol compound, a methoxymethyl group-containing melamine compound, a methoxymethyl group-containing phenol compound, a methoxymethyl group-containing glycoluril compound, a methoxymethyl group-containing urea compound, and an acetoxymethyl group-containing phenol compound are preferable, and a methoxymethyl group-containing melamine compound (e.g., hexamethoxymethylmelamine), a methoxymethyl group-containing glycoluril compound, and a methoxymethyl group-containing urea compound are more preferable. A methoxymethyl group-containing melamine compound is commercially available as CYMEL 300, CYMEL 301, CYMEL 303, CYMEL 305 (manufactured by Mitsui Cyanamid Co., Ltd.), and the like. A methoxymethyl group-containing glycoluril compound is commercially available as CYMEL 1174 (manufactured by Mitsui Cyanamid Co., Ltd.), and the like. A methoxymethyl group-containing urea compound is commercially available as MX290 (manufactured by Sanwa Chemical Co., Ltd.), and the like.

A polymer obtained by substituting the hydrogen atom of the oxygen-containing functional group of the alkali-soluble polymer with the crosslinkable functional group may also suitably be used as the crosslinking agent. The crosslinkable functional group content is appropriately determined depending on the type of the crosslinkable functional group and the type of the alkali-soluble polymer into which the crosslinkable functional group is introduced, but is normally 5 to 60 mol %, preferably 10 to 50 mol %, and still more preferably 15 to 40 mol %, based on the total content of the oxygen-containing functional groups in the alkali-soluble polymer. If the crosslinkable functional group content is less than 5 mol %, a decrease in residual ratio, a meandering or swelling of the pattern, and the like may occur. If the crosslinkable functional group content exceeds 60 mol %, the alkali developability of the radiation-sensitive resin composition may deteriorate.

It is preferable to use a methoxymethyl group-containing compound (more preferably dimethoxymethylurea or tetramethoxymethylglycoluril) as the crosslinking agent. The negative-tone radiation-sensitive resin composition may include only one type of the crosslinking agent, or may include two or more types of the crosslinking agent.

The crosslinking agent is preferably used in an amount of 5 to 95 parts by mass, more preferably 15 to 85 parts by mass, and particularly preferably 20 to 75 parts by mass, based on 100 parts by mass of the polymer (B2). If the amount of the crosslinking agent is less than 5 parts by mass, a decrease in residual ratio, a meandering or swelling of the pattern, and the like may occur. If the amount of the crosslinking agent is less than exceeds 95 parts by mass, the alkali developability of the radiation-sensitive resin composition may deteriorate.

Polymer (C)

The radiation-sensitive resin composition may preferably include the polymer (C). When the radiation-sensitive resin composition further includes the polymer (C), the polymer (C) can be distributed in the surface area of the resulting resist film due to the oil repellency of the polymer (C). This makes it unnecessary to form an upper-layer film that isolates the resist film from an immersion medium. Therefore, the radiation-sensitive resin composition may suitably be used for liquid immersion lithography.

The polymer (C) is not particularly limited as long as the polymer (C) has a fluorine atom content higher than that of the polymer (B). It is preferable that the polymer (C) include a structural unit that includes a fluorine atom (hereinafter may be referred to as "structural unit (C1)"). The polymer (C) may include a structural unit that includes an acid-labile group (hereinafter may be referred to as "structural unit (C2)"), a structural unit that includes an alkali-soluble group (hereinafter may be referred to as "structural unit (C3)"), and a structural unit that includes a lactone skeleton (hereinafter may be referred to as "structural unit (C4)") in addition to the structural unit (C1). When the polymer (C) includes the structural unit (C3) and/or the structural unit (C4), the solubility of the polymer (C) in a developer can be improved. The polymer (C) may include only one type of each structural unit, or may include two or more types of each structural unit.

Structural Unit (C1)

The structural unit (C1) is a structural unit that includes a fluorine atom. Examples of the structural unit (C1) include a structural unit represented by the following formula (11) (hereinafter may be referred to as "structural unit (11)"), a structural unit represented by the following formula (12) (hereinafter may be referred to as "structural unit (12)"), a structural unit represented by the following formula (13) (hereinafter may be referred to as "structural unit (13)"), and the like. When the polymer (C) includes structural units (11) to (13), it is possible to suppress a situation in which the acid generator, the acid diffusion controller, and the like included in the resist film are eluted into the immersion liquid. Moreover, water droplets of the immersion liquid rarely remain on the resist film due to an increase in receding contact angle of the resist film with the immersion liquid, and defects due to the immersion liquid can be suppressed.

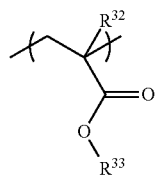

(11)

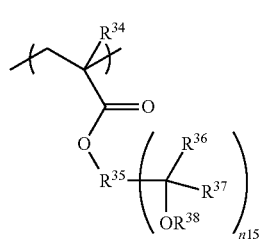

(12)

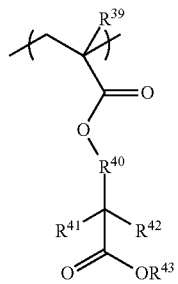

(13)

$R^{32}$, $R^{34}$, and $R^{39}$ in the formulas (11) to (13) are each independently a hydrogen atom, a methyl group, or a trifluoromethyl group.

$R^{33}$ in the formula (11) is a fluoroalkyl group having 1 to 30 carbon atoms.

$R^{35}$ in the formula (12) is an (n15+1)-valent linking group. n15 is an integer from 1 to 3.

$R^{40}$ in the formula (13) is a divalent linking group.

$R^{38}$ and $R^{43}$ in the formulas (12) and (13) are each independently a hydrogen atom, a monovalent hydrocarbon group having 1 to 30 carbon atoms, an acid-labile group, or an alkali-labile group. $R^{36}$, $R^{37}$, $R^{41}$, and $R^{42}$ are each independently a hydrogen atom, a fluorine atom, or a fluoroalkyl group having 1 to 30 carbon atoms, wherein a case where $R^{36}$ and $R^{37}$ are hydrogen atoms or $R^{41}$ and $R^{42}$ are hydrogen atoms is excluded. A plurality of $R^{36}$ may be either identical or different when a plurality of $R^{36}$ are present, a plurality of $R^{37}$ may be either identical or different when a plurality of $R^{37}$ are present, a plurality of $R^{38}$ may be either identical or different when a plurality of $R^{38}$ are present, a plurality of $R^{41}$ may be either identical or different when a plurality of $R^{41}$ are present, a plurality of $R^{42}$ may be either identical or different when a plurality of $R^{42}$ are present, and a plurality of $R^{43}$ may be either identical or different when a plurality of $R^{43}$ are present.

Examples of the fluoroalkyl group having 1 to 30 carbon atoms represented by $R^{33}$ include a linear or branched alkyl group having 1 to 6 carbon atoms that is substituted with at least one fluorine atom, a monovalent alicyclic hydrocarbon group having 4 to 20 carbon atoms that is substituted with at least one fluorine atom, groups derived therefrom, and the like.

Examples of the linear or branched alkyl group having 1 to 6 carbon atoms that is substituted with at least one fluorine atom include a trifluoromethyl group, a difluoroethyl group, a trifluoroethyl group, a hexafluoro-1-propyl group, and the like. Examples of the monovalent alicyclic hydrocarbon group having 4 to 20 carbon atoms that is substituted with at least one fluorine atom include a perfluorocyclopentyl group, a perfluorocyclohexyl group, and the like.

Examples of a preferable monomer that produces the structural unit (11) include trifluoromethyl (meth)acrylate, 2,2,2-trifluoroethyl (meth)acrylate, perfluoroethyl (meth)acrylate, perfluoro-n-propyl (meth)acrylate, perfluoro-1-propyl (meth)acrylate, perfluoro-n-butyl (meth)acrylate, perfluoro-1-butyl (meth)acrylate, perfluoro-t-butyl (meth)acrylate, 2-(1,1,1,3,3,3-hexafluoropropyl) (meth)acrylate, 1-(2,2,3,3,4,4,5,5-octafluoropentyl)(meth)acrylate, perfluorocyclohexylmethyl (meth)acrylate, 1-(2,2,3,3,3-pentafluoropropyl) (meth)acrylate, 1-(3,3,4,4,5,5,6,6,7,7,8,8,9,9,10,10,10-heptadecafluorodecyl)(meth)acrylate, 1-(5-trifluoromethyl-3,3,4,4,5,6,6,6-octafluorohexyl)(meth)acrylate, and the like.

Examples of the monovalent hydrocarbon group having 1 to 30 carbon atoms represented by $R^{38}$ and $R^{43}$ include linear or branched monovalent hydrocarbon groups having 1 to 10 carbon atoms, monovalent alicyclic hydrocarbon groups having 3 to 30 carbon atoms, and the like. Examples of these hydrocarbon groups include those mentioned above in connection with $R^3$, but exclude the groups that fall under the acid-labile group and the alkali-labile group. The hydrocarbon group may be substituted with a substituent. Examples of the substituent include the substituents mentioned above in connection with $R^3$.

The term "acid-labile group" used herein refers to a group that substitutes the hydrogen atom of a polar functional group (e.g., hydroxyl group or carboxyl group), and dissociates in the presence of an acid. Examples of the acid-labile group represented by $R^{38}$ and $R^{43}$ include a t-butoxycarbonyl group, a tetrahydropyranyl group, a tetrahydrofuranyl group, a (thiotetrahydropyranylsulfanyl)methyl group, a (thiotetrahydrofuranylsulfanyl)methyl group, an alkoxy-substituted methyl group, an alkylsulfanyl-substituted methyl group, and the like. Examples of the alkoxy group (substituent) of the alkoxy-substituted methyl group include alkoxy groups having 1 to 4 carbon atoms, and the like. Examples of the alkyl group (substituent) of the alkylsulfanyl-substituted methyl group include alkyl groups having 1 to 4 carbon atoms, and the like.

The acid-labile group may be a group represented by $-C(R)_3$. Note that R is the same as defined for $R^{15}$ to $R^{17}$ in the formula (5).

Among these, the group represented by $-C(R)_3$, a t-butoxycarbonyl group, and an alkoxy-substituted methyl group are preferable. A t-butoxycarbonyl group and an alkoxy-substituted methyl group are preferable for the structural unit (12). An alkoxy-substituted methyl group and the group represented by $-C(R)_3$ are preferable for the structural unit (13).

The above configuration is preferable for a positive-tone radiation-sensitive resin composition since the polymer (C) that includes the structural unit (12) that includes an acid-labile group and/or the structural unit (13) that includes an acid-labile group can be used in combination with the polymer (B1), and the solubility of the polymer (C) in the exposed area can be improved. More specifically, it is conjectured that a reaction with an acid generated by the polymer (C) occurs in the exposed area of the resist film to produce a polar group during an exposure step performed when forming a resist pattern.

The term "alkali-labile group" used herein refers to a group that substitutes the hydrogen atom of a polar functional group (e.g., hydroxyl group or carboxyl group), and dissociates in the presence of an alkali.

The alkali-labile group is not particularly limited as long as the alkali-labile group has the above properties. A group represented by the following formula (14) is preferable as the alkali-labile group in the formula (12).

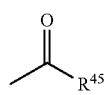

(14)

wherein $R^{45}$ is a hydrocarbon group having 1 to 10 carbon atoms in which at least one hydrogen atom is substituted with a fluorine atom.

The description given above in connection with $R^{33}$ may be applied to $R^{45}$.

$R^{45}$ is preferably a linear or branched perfluoroalkyl group having 1 to 10 carbon atoms, and more preferably a trifluoromethyl group.

Examples of the alkali-labile group in the formula (13) include a group represented by the following formula (15), a group represented by the following formula (16), a group represented by the following formula (17), and the like.

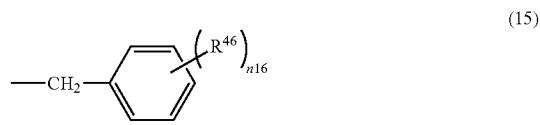

(15)

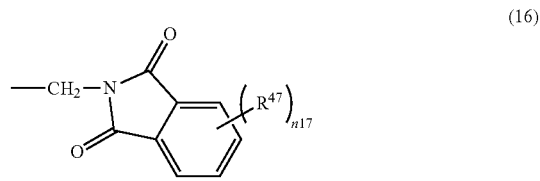

(16)

(17)

In the formulas (15) and (16), $R^{46}$ and $R^{47}$ are each independently a halogen atom, an alkyl group having 1 to 10 carbon atoms, an alkoxy group having 1 to 10 carbon atoms, an acyl group having 1 to 10 carbon atoms, or an acyloxy group having 1 to 10 carbon atoms, n16 is an integer from 0 to 5, and n17 is an integer from 0 to 4, wherein a plurality of $R^{46}$ may be either identical or different when a plurality of $R^{46}$ are present, and a plurality of $R^{47}$ may be either identical or different when a plurality of $R^{47}$ are present.

In the formula (17), $R^{48}$ and $R^{49}$ are each independently a hydrogen atom or an alkyl group having 1 to 10 carbon atoms, wherein $R^{48}$ and $R^{49}$ may bond to each other to form an alicyclic structure having 4 to 20 carbon atoms together with the carbon atom bonded thereto.

Examples of the halogen atom represented by $R^{46}$ and $R^{47}$ include a fluorine atom, a chlorine atom, a bromine atom, an iodine atom, and the like. Among these, a fluorine atom is preferable.

Examples of the alkyl group having 1 to 10 carbon atoms represented by $R^{46}$ and $R^{47}$ include a methyl group, an ethyl group, an n-propyl group, an i-propyl group, an n-butyl group, and the like.

Examples of the alkoxy group having 1 to 10 carbon atoms represented by $R^{46}$ and $R^{47}$ include a methoxy group, an ethoxy group, a propoxy group, a butoxy group, and the like.

Examples of the acyl group having 1 to 10 carbon atoms represented by $R^{46}$ and $R^{47}$ include a formyl group, an acetyl group, a propionyl group, a butyryl group, and the like.

Examples of the acyloxy group having 1 to 10 carbon atoms represented by $R^{46}$ and $R^{47}$ include an acetoxy group, a propionyloxy group, a butyryloxy group, and the like.

Examples of the alkyl group having 1 to 10 carbon atoms represented by $R^{48}$ or $R^{49}$ include the groups mentioned above in connection with the alkyl group represented by $R^{46}$ and $R^{47}$.

Examples of the alicyclic structure having 4 to 20 carbon atoms formed by $R^{48}$ or $R^{49}$ together with the carbon atom bonded thereto include a cyclopentane structure, a methylcyclopentane structure, an ethylcyclopentane structure, a cyclohexane structure, a methylcyclohexane structure, an ethylcyclohexane structure, a cycloheptane structure, a methylcycloheptane structure, an ethylcycloheptane structure, a norbornane structure, and the like.

Examples of the group represented by the formula (17) include a methyl group, an ethyl group, a 1-propyl group, a 2-propyl group, a 1-butyl group, a 2-butyl group, a 1-pentyl group, a 2-pentyl group, a 3-pentyl group, a 1-(2-methylbutyl) group, a 1-(3-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(3-methylpentyl) group, a 2-(4-methylpentyl) group, a 3-(2-methylpentyl) group, and the like. Among these, a methyl group, an ethyl group, a 1-propyl group, a 2-propyl group, a 1-butyl group, and a 2-butyl group are preferable.

When the polymer (C) includes the structural unit (12) that includes an alkali-labile group or the structural unit (13) that includes an alkali-labile group, the affinity of the polymer (C) to a developer can be improved. More specifically, it is conjectured that the polymer (C) reacts with a developer to produce a polar group during a development step performed when forming a resist pattern.

When $R^{38}$ in the formula (12) or $R^{43}$ in the formula (13) is a hydrogen atom, the structural unit (12) or (13) includes a hydroxyl group or a carboxyl group (i.e., polar group). When the polymer (C) includes such a structural unit, the polymer (C) exhibits an improved affinity to a developer during a development step performed when forming a resist pattern.

Examples of the (n15+1)-valent linking group represented by $R^{35}$ include an (n15+1)-valent chain-like or cyclic hydrocarbon group having 1 to 30 carbon atoms, a group obtained by combining such a hydrocarbon group with a sulfur atom, an imino group, a carbonyl group, —CO—O—, or —CO—NH—, and the like.

Examples of the (n15+1)-valent chain-like hydrocarbon group include a group obtained by removing (n15+1) hydrogen atoms from a chain-like hydrocarbon having 1 to 10 carbon atoms (e.g., methane, ethane, propane, butane, 2-methylpropane, pentane, 2-methylbutane, 2,2-dimethylpropane, hexane, heptane, octane, nonane, or decane), and the like.

Examples of the (n15+1)-valent cyclic hydrocarbon group include a group obtained by removing (n15+1) hydrogen atoms from an alicyclic hydrocarbon having 4 to 20 carbon atoms (e.g., cyclobutane, cyclopentane, cyclohexane, bicyclo[2.2.1]heptane, bicyclo[2.2.2]octane, tricyclo[5.2.1.0$^{2,6}$]decane, or tricyclo[3.3.1.1$^{3,7}$]decane); a group obtained by removing (n15+1) hydrogen atoms from an aromatic hydrocarbon having 6 to 30 carbon atoms (e.g., benzene or naphthalene); and the like.

Examples of the (n15+1)-valent linking group represented by $R^{35}$ that includes an oxygen atom, a sulfur atom, an imino group, a carbonyl group, —CO—O—, or —CO—NH— include groups represented by the following formulas, and the like.

$$*-R^{50}+NH-R^{51}-*)_{n18}$$
$$*-R^{52}+S-R^{53}-*)_{n19}$$
$$*-R^{54}+O-R^{55}-*)_{n20}$$
$$*-R^{56}+C-R^{57}-*)_{n21}$$
$$\quad\quad\quad\; \|$$
$$\quad\quad\quad\; O$$
$$*-R^{58}+O-C-R^{59}-*)_{n22}$$
$$\quad\quad\quad\quad\quad \|$$
$$\quad\quad\quad\quad\quad O$$
$$*-R^{60}+NH-C-R^{61}-*)_{n23}$$
$$\quad\quad\quad\quad\quad\;\; \|$$
$$\quad\quad\quad\quad\quad\;\; O$$
$$*-R^{62}+C-O-R^{63}-*)_{n24}$$
$$\quad\quad\quad\;\; \|$$
$$\quad\quad\quad\;\; O$$
$$*-R^{64}+C-NH-R^{65}-*)_{n25}$$
$$\quad\quad\quad\; \|$$
$$\quad\quad\quad\; O$$

wherein $R^{50}$, $R^{52}$, $R^{54}$, $R^{56}$, $R^{58}$, $R^{60}$, $R^{62}$, and $R^{64}$ are the same as defined for $R^{35}$ in the formula (12), $R^{51}$, $R^{53}$, $R^{55}$, $R^{57}$, $R^{59}$, $R^{61}$, $R^{63}$, and $R^{65}$ are each independently a single bond, a divalent chain-like hydrocarbon group having 1 to 10 carbon atoms, a divalent alicyclic hydrocarbon group having 4 to 20 carbon atoms, or a divalent aromatic hydrocarbon group having 6 to 30 carbon atoms, and n18 to n25 are each independently an integer from 1 to 3.

Examples of the divalent chain-like hydrocarbon group having 1 to 10 carbon atoms, the divalent alicyclic hydrocarbon group having 4 to 20 carbon atoms, and the divalent aromatic hydrocarbon group having 6 to 30 carbon atoms represented by $R^{51}$, $R^{53}$, $R^{55}$, $R^{57}$, $R^{59}$, $R^{61}$, $R^{63}$, and $R^{65}$ include the divalent groups (when n15=1) mentioned above in connection with $R^{35}$, and the like.

The linking group represented by $R^{35}$ may be substituted with a substituent. Examples of the substituent include the substituents mentioned above in connection with $R^3$.

The description given above in connection with $R^{35}$ (when n15=1) may be applied to the divalent linking group represented by $R^{40}$.

Examples of the group represented by —C($R^{36}$)($R^{37}$)— in the formula (12) and the group represented by —C($R^{41}$)($R^{42}$)— in the formula (13) include the groups represented by the following formulas (x-1) to (x-5), and the like. Among these, the group represented by the formula (x-5) is preferable as the group represented by —C($R^{36}$)($R^{37}$)— in the formula (12), and the group represented by the formula (x-3) is preferable as the group represented by —C($R^{41}$)($R^{42}$)— in the formula (13).

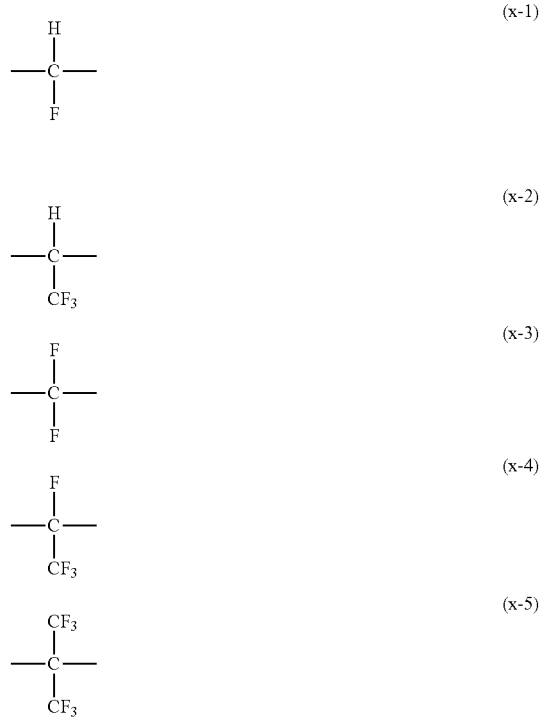

Examples of the structural unit (12) include a structural unit represented by the following formula (12-1), a structural unit represented by the following formula (12-2), and the like.

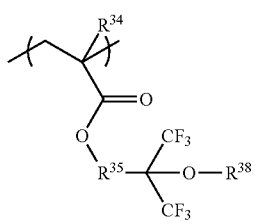

(12-1)

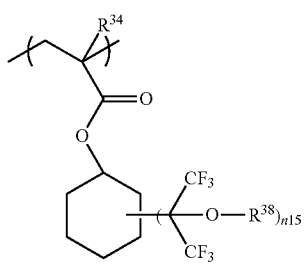

(12-2)

wherein $R^{34}$, $R^{35}$, $R^{38}$, and n15 are the same as defined for the formula (12).

Examples of a monomer that produces the structural unit (12) include compounds represented by the following formulas, and the like.

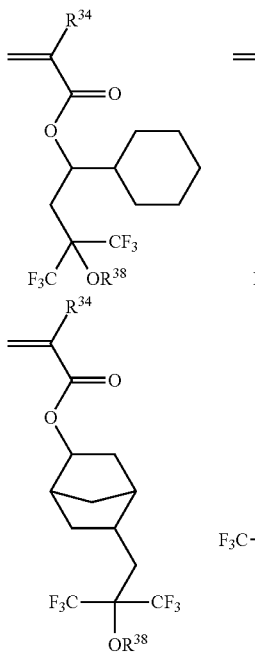

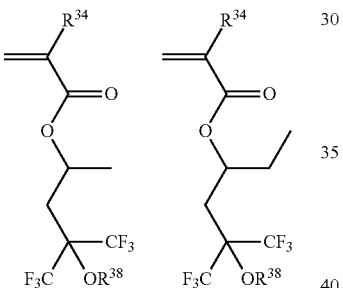

wherein $R^{34}$ and $R^{38}$ are the same as defined for the formula (12).

A monomer that produces the structural unit (12) wherein $R^{38}$ is an acid-labile group or an alkali-labile group may be synthesized using a compound represented by each formula wherein $R^{38}$ is a hydrogen atom as a raw material, for example. When $R^{38}$ is the group represented by the formula (14), the compound may be synthesized by fluoroacylating the compound represented by each formula wherein $R^{38}$ is a hydrogen atom by a known method. Fluoroacylation may be implemented by 1) condensing an alcohol and a fluorocarboxylic acid in the presence of an acid to effect esterification, or 1) condensing an alcohol and a fluorocarboxylic acid halide in the presence of a base to effect esterification, for example.

Examples of the structural unit (13) include a structural unit represented by the following formula (13-1), and the like.

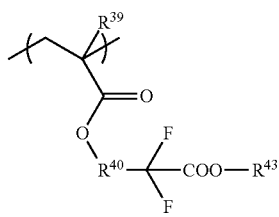

(13-1)

wherein $R^{39}$, $R^{40}$, and $R^{43}$ are the same as defined for the formula (13).

Examples of a monomer that produces the structural unit (13) include compounds represented by the following formulas, and the like.

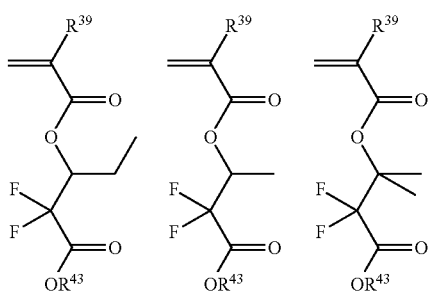

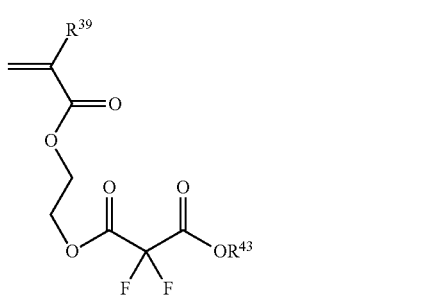

wherein $R^{39}$ and $R^{43}$ are the same as defined for the formula (13).

A compound that produces the structural unit (13) wherein $R^{43}$ is an acid-labile group or an alkali-labile group may be synthesized using a compound represented by each formula wherein $R^{43}$ is a hydrogen atom as a raw material. When $R^{43}$ is the group represented by the formula (17), the compound may be synthesized by reacting a compound represented by the following formula (18) with a compound represented by the following formula (19), for example.

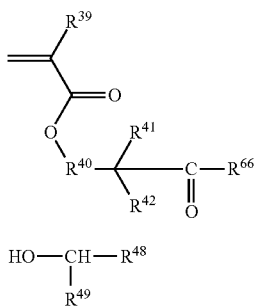

(18)

(19)

In the formula (18), $R^{39}$, $R^{40}$, $R^{41}$, and $R^{42}$ are the same as defined for the formula (13), and $R^{66}$ is a hydroxyl group or a halogen atom.

In the formula (19), $R^{48}$ and $R^{49}$ are the same as defined for the formula (17).

The polymer (C) may include only one structural unit among the structural units (11) to (13), or may include two or more structural units among the structural units (11) to (13). It is preferable that the polymer (C) include at least two structural units among the structural units (11) to (13). It is more preferable that the polymer (C) include the structural units (12) and (13).

Structural Unit (C2)

The structural unit (C2) is a structural unit that includes an acid-labile group (excluding a structural unit that falls under the structural unit (C1)). It is preferable to use the polymer (B1) and the polymer (C) that includes the structural unit (C2) in combination when using the radiation-sensitive resin composition as a positive-tone radiation-sensitive resin composition. In this case, the difference between the advancing contact angle and the receding contact angle of the resist film can be reduced, and the scan speed during exposure can be increased. Examples of the structural unit (C2) include the structural unit represented by the formula (5), and the like.

A structural unit represented by the following formula (20) is preferable as the structural unit (C2).

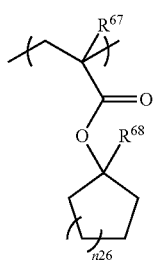

(20)

wherein $R^{67}$ is a hydrogen atom, a methyl group, a trifluoromethyl group, or a hydroxymethyl group, $R^{68}$ is a linear or branched alkyl group having 1 to 4 carbon atoms, and n26 is an integer from 1 to 4.

Examples of the linear or branched alkyl group having 1 to 4 carbon atoms represented by $R^{68}$ include a methyl group, an ethyl group, an n-propyl group, an i-propyl group, an n-butyl group, a 2-methylpropyl group, a 1-methylpropyl group, a t-butyl group, and the like.

Structural Unit (C3)

The structural unit (C3) is a structural unit that includes an alkali-soluble group (excluding a structural unit that falls under the structural unit (C1)). The alkali-soluble group included in the structural unit (C3) is preferably a functional group that includes a hydrogen atom having a pKa of 4 to 11 from the viewpoint of improving solubility in a developer. Examples of such a functional group include a functional group represented by the following formula (21), a functional group represented by the following formula (22), and the like.

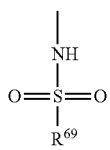

(21)

(22)

wherein $R^{69}$ is a hydrocarbon group having 1 to 10 carbon atoms that is substituted with a fluorine atom.

$R^{69}$ is preferably a trifluoromethyl group.

The main chain skeleton of the structural unit (C3) is not particularly limited, but is preferably a skeleton derived from a methacrylate, an acrylate, or an α-trifluoroacrylate.

Examples of a monomer that produces the structural unit (C3) include a compound represented by the following formula (23), a compound represented by the following formula (24), and the like.

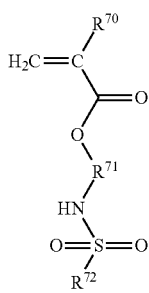

(23)

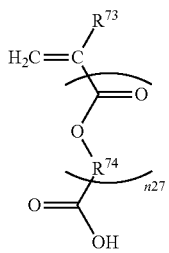

(24)

wherein $R^{70}$ and $R^{73}$ are each independently a hydrogen atom, a methyl group, or a trifluoromethyl group, $R^{71}$ and $R^{74}$ are each independently a divalent linking group, $R^{72}$ is a hydrocarbon group having 1 to 10 carbon atoms that is substituted with a fluorine atom, and n27 is 0 or 1.

Examples of the group represented by $R^{71}$ and $R^{74}$ include the groups mentioned above in connection with $R^{40}$ in the formula (13), and the like. $R^{72}$ is preferably a trifluoromethyl group.

Structural Unit (C4)

The structural unit (C4) is a structural unit that includes a lactone skeleton. Examples of the structural unit (C4) include the structural unit (6) that includes a lactone skeleton, and the like.

A preferable content of each structural unit in the polymer (C) based on the total structural units included in the polymer (C) is shown below. The content of the structural unit (C1) is preferably 20 to 90 mol %, and more preferably 20 to 80 mol %. The content of the structural unit (C2) is normally 80 mol % or less, preferably 20 to 80 mol %, and still more preferably 30 to 70 mol %. When the content of the structural unit (C2) is within the above range, the difference between the advancing contact angle and the receding contact angle of a resist film formed using the radiation-sensitive resin composition can be reduced. The content of the structural unit (C3) is normally 50 mol % or less, preferably 5 to 30 mol %, and still more preferably 5 to 20 mol %. The content of the structural unit (C4) is normally 50 mol % or less, preferably 5 to 30 mol %, and still more preferably 5 to 20 mol %.

Synthesis of Polymer (C)

The polymer (C) may be synthesized by polymerizing a monomer that produces each structural unit in an appropriate solvent optionally in the presence of a chain transfer agent using a radical initiator (e.g., hydroperoxide, dialkyl peroxide, diacyl peroxide, or azo compound), for example.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, 2-butanone, 4-methyl-2-pentanone, and 2-heptanone; ethers such as tetrahydrofuran, dimethoxyethanes, and diethoxyethanes; alcohols such as methanol, ethanol, 1-propanol, 2-propanol, and 4-methyl-2-pentanol; and the like. These solvents may be used either alone or in combination.

The polymerization temperature is normally 40 to 150° C., and preferably 50 to 120° C. The polymerization time is normally 1 to 48 hours, and preferably 1 to 24 hours.

The Mw of the polymer (C) is preferably 1000 to 50,000, more preferably 1000 to 40,000, and still more preferably 1000 to 30,000. If the Mw of the polymer (C) is less than 1000, a resist film having a sufficient receding contact angle may not be obtained. If the Mw of the polymer (C) exceeds 50,000, the developability of the resulting resist film may deteriorate. The ratio "Mw/Mn" of the polymer (C) is preferably 1 to 5, and more preferably 1 to 4.

It is preferable that the polymer (C) have an impurity (e.g., halogens and metals) content as low as possible. The sensitivity, the resolution, the process stability, the pattern shape, and the like of a resist film formed using the radiation-sensitive resin composition can be further improved by reducing the impurity content.

The polymer (C) is preferably used in an amount of 0.1 to 20 parts by mass, more preferably 1 to 10 parts by mass, and still more preferably 1 to 7.5 parts by mass, based on 100 parts by mass of the polymer (B). If the amount of the polymer (C) is less than 0.1 parts by mass, the polymer (C) may not exhibit a sufficient effect. If the amount of the polymer (C) exceeds 20 parts by mass, development failure may occur due to an increase in water repellency of the surface of the resist.

The fluorine atom content in the polymer (C) is normally 5 mass % or more, preferably 5 to 50 mass %, and more preferably 5 to 40 mass %. When the fluorine atom content in the polymer (C) is within the above range, the water repellency of the surface of a resist film formed using the radiation-sensitive resin composition can be further improved.

Additional Optional Component

The radiation-sensitive resin composition may include additional optional components (e.g., acid diffusion controller, lactone compound, dissolution controller, surfactant, sensitizer, dye, pigment, adhesion improver, halation inhibitor, preservative, antifoaming agent, and shape modifier) in addition to the components (A) to (C) as long as the advantageous effects of the invention are not impaired. These additional optional components may respectively be used either alone or in combination. Each additional optional component is described in detail below.

Acid Diffusion Controller

The acid diffusion controller controls a phenomenon in which an acid generated by the compound (A) or the like upon exposure is diffused in the resist film, and suppresses undesired chemical reactions in the unexposed area. The acid diffusion controller improves the storage stability and the resolution of the radiation-sensitive resin composition, and suppresses a change in line width of the resist pattern due to a change in post-exposure delay (PED) from exposure to development. This makes it possible to obtain a radiation-sensitive resin composition that exhibits excellent process stability.

Examples of the acid diffusion controller include the compounds disclosed in paragraphs [0176] to [0187] of WO2009/051088, and the like.

The acid diffusion controller may be a nitrogen-containing compound ($\alpha$) that includes one nitrogen atom, a nitrogen-containing compound ($\beta$) that includes two nitrogen atoms, a nitrogen-containing compound ($\gamma$) that includes three or more nitrogen atoms, an amide group-containing compound, a urea compound, a nitrogen-containing heterocyclic compound, a nitrogen-containing organic compound, or the like.

Examples of the nitrogen-containing compound (a) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; alkanolamines such as ethanolamine, diethanolamine, and triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; and the like.

Examples of the nitrogen-containing compound ($\beta$) include ethylenediamine, N,N,N',N'-tetramethylethylenediamine, tetramethylenediamine, hexamethylenediamine, N,N,N',N'-tetrakis(2-hydroxyethyl)ethylenediamine, N,N,N',N'-tetrakis(2-hydroxypropyl)ethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like. Examples of the nitrogen-containing compound ($\gamma$) include polyethyleneimine, polyallylamine, poly(N-(2-dimethylaminoethyl)acrylamide), and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles such as imidazole, benzimidazole, 2-methylimidazole, 4-methylimidazole, 1,2-dimethylimidazole, 2-phenylimidazole, 4-phenylimidazole, 4-methyl-2-phenylimidazole, and 2-phenylbenzimidazole, pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine, pyrazine, pyrazole, pyridazine, quinoxaline, purine, pyrrolidine, piperidine, 1-piperidine ethanol, 2-piperidine ethanol, morpholine, 4-methylmorpholine, piperazine, 1,4-dimethylpiperazine, 1,4-diazabicyclo[2.2.2]octane, and the like.

A compound that includes an acid-labile group may also be used as the nitrogen-containing organic compound. Examples of the nitrogen-containing organic compound that includes an acid-labile group include N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, t-butyl 4-hydroxy-1-piperidinecarboxylate, and the like.

The acid diffusion controller is preferably the nitrogen-containing compound ($\alpha$), the nitrogen-containing compound ($\beta$), the nitrogen-containing heterocyclic compound, or the nitrogen-containing organic compound that includes an acid-labile group, more preferably the nitrogen-containing organic compound that includes an acid-labile group, and still more preferably t-butyl 4-hydroxy-1-piperidinecarboxylate.

A compound represented by the following formula (D1) may also be used as the acid diffusion controller.

$$X^+Z^- \quad (D1)$$

wherein $X^+$ is a cation represented by the following formula (25) or a cation represented by the following formula (26), $Z^-$ is OH$^-$, an anion represented by $R^D$—COO$^-$, or an anion represented by $R^D$—SO$_3^-$, and $R^D$ is a substituted or unsubstituted alkyl group, a substituted or unsubstituted alicyclic hydrocarbon group, or a substituted or unsubstituted aryl group.

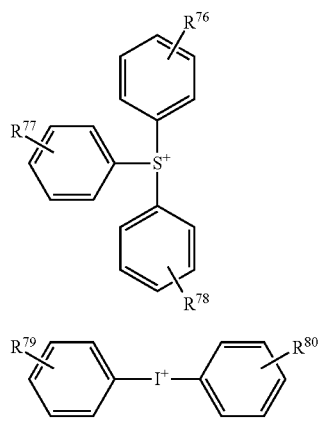

wherein $R^{76}$ to $R^{78}$ are each independently a hydrogen atom, an alkyl group, an alkoxy group, a hydroxyl group, or a halogen atom, and $R^{79}$ and $R^{80}$ are each independently a hydrogen atom, an alkyl group, an alkoxy group, a hydroxyl group, or a halogen atom.

The above compound is used as an acid diffusion controller that loses acid diffusion controllability upon decomposition due to exposure (hereinafter may be referred to as "photodegradable acid diffusion controller"). When the radiation-sensitive resin composition includes the photodegradable acid diffusion controller, an acid is diffused in the exposed area of the resist film, and diffusion of an acid is controlled in the unexposed area, so that the contrast between the exposed area and the unexposed area is improved. Specifically, since the boundary between the exposed area and the unexposed area becomes definite, the radiation-sensitive resin composition exhibits reduced LWR and an improved MEEF.

$R^{76}$ to $R^{78}$ are preferably a hydrogen atom, an alkyl group, an alkoxy group, or a halogen atom since the solubility of the compound in a developer decreases. A hydrogen atom, an alkyl group, and a halogen atom are preferable as $R^{79}$ and $R^{80}$.

$R^D$ is preferably an alicyclic hydrocarbon group or an aryl group since the solubility of the compound in a developer decreases.

Examples of the substituted or unsubstituted alkyl group represented by $R^D$ include hydroxyalkyl groups having 1 to 4 carbon atoms, such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, and a 4-hydroxybutyl group; alkoxy groups having 1 to 4 carbon atoms, such as a methoxy group, an ethoxy group, an n-propoxy group, an i-propoxy group, an n-butoxy group, a 2-methylpropoxy group, a 1-methylpropoxy group, and a t-butoxy group; a cyano group; cyanoalkyl groups having 2 to 5 carbon atoms, such as a cyanomethyl group, a 2-cyanoethyl group, a 3-cyanopropyl group, and a 4-cyanobutyl group; and the like. Among these, a hydroxymethyl group, a cyano group, and a cyanomethyl group are preferable.

Examples of the substituted or unsubstituted alicyclic hydrocarbon group represented by $R^D$ include a monovalent group derived from an alicyclic hydrocarbon such as a cycloalkane (skeleton) (e.g., hydroxycyclopentane, hydroxycyclohexane, or cyclohexanone) or a bridged alicyclic hydrocarbon (skeleton) (e.g., 1,7,7-trimethylbicyclo[2.2.1]heptan-2-one (camphor)). Among these, a group derived from 1,7,7-trimethylbicyclo[2.2.1]heptan-2-one is preferable.

Examples of the substituted or unsubstituted aryl group represented by $R^D$ include a phenyl group, a benzyl group, a phenylethyl group, a phenylpropyl group, a phenylcyclohexyl group, groups obtained by substituting some or all of the hydrogen atoms of these groups with a hydroxyl group, a cyano group, or the like, and the like.

Among these, a phenyl group, a benzyl group, and a phenylcyclohexyl group are preferable.

The anions represented by the following formulas are preferable as T.

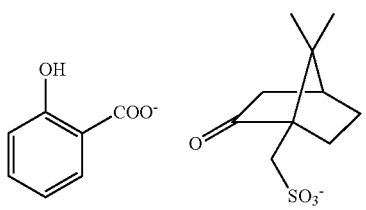

Specific examples of the sulfonium salt compound used as the photodegradable acid diffusion controller (i.e., when $X^+$ is the cation represented by the formula (25)) include triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, triphenylsulfonium 10-camphorsulfonate, 4-t-butoxyphenyldiphenylsulfonium 10-camphorsulfonate, and the like. These sulfonium salt compounds may be used either alone or in combination.

Specific examples of the iodonium salt compound used as the photodegradable acid diffusion controller (i.e., when $X^+$ is the cation represented by the formula (26)) include bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl) iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl) iodonium 10-camphorsulfonate, diphenyliodonium 10-camphorsulfonate, and the like. These iodonium salt compounds may be used either alone or in combination.

The acid diffusion controller is preferably used in an amount of 15 parts by mass or less, more preferably 0.001 to 15 parts by mass, and still more preferably 0.005 to 15 parts by mass, based on 100 parts by mass of the polymer (B). When the amount of the acid diffusion controller is 15 parts by mass or less, the sensitivity and the alkali developability of the radiation-sensitive resin composition can be improved. When the amount of the acid diffusion controller is 0.001 parts by mass or more, a deterioration in pattern shape or dimensional accuracy due to process conditions can be suppressed.

Lactone Compound

The lactone compound causes the polymer (C) to be more efficiently distributed in the surface area of the resist film. Therefore, the amount of the polymer (C) can be reduced by utilizing the lactone compound in combination with the polymer (C). This makes it possible to allow the surface of the resist film to exhibit water repellency without impairing the basic resist performance, so that elution of components from the resist film to an immersion liquid can be suppressed, or liquid immersion lithography can be implemented by a high-speed scan without causing droplets to remain (i.e., defects (e.g., watermark defects) that may occur due to liquid immersion lithography can be suppressed).

Examples of the lactone compound include γ-butyrolactone, valerolactone, mevalonic lactone, norbornanelactone, and the like.

The lactone compound is normally used in an amount of 30 to 300 parts by mass, and preferably 50 to 250 parts by mass, based on 100 parts by mass of the polymer (B). If the amount of the lactone compound is less than 30 parts by mass, the surface of the resist film may not exhibit sufficient water repellency. If the amount of the lactone compound exceeds 300 parts by mass, the basic performance of the resist and the pattern shape may deteriorate.

Dissolution Controller

The radiation-sensitive resin composition may include the dissolution controller that improves solubility in an alkaline developer due to an acid.

Examples of the dissolution controller include a compound that includes an acidic functional group (e.g., phenolic hydroxyl group, carboxyl group, or sulfonic acid group), a compound obtained by substituting the hydrogen atom of the acidic functional group of the above compound with an acid-labile group, and the like.

The dissolution controller may be a low-molecular-weight compound or a high-molecular-weight compound. The acid-labile group-containing polymer used for a positive-tone radiation-sensitive resin composition may be used as the dissolution controller for a negative-tone radiation-sensitive resin composition, for example. These dissolution controllers may be used either alone or in combination.

The dissolution controller is normally used in an amount of 50 parts by mass or less, and preferably 20 parts by mass or less, based on 100 parts by mass of the polymer (B).

Surfactant

The radiation-sensitive resin composition may include the surfactant that improves applicability, striation, developability, and the like of the radiation-sensitive resin composition.

The surfactant may be an anionic surfactant, a cationic surfactant, a nonionic surfactant, or an ampholytic surfactant. It is preferable to use a nonionic surfactant.

Examples of the nonionic surfactant include polyoxyethylene higher alkyl ethers, polyoxyethylene higher alkyl phenyl ethers, and higher fatty acid diesters of polyethylene glycol. Examples of a commercially available product of the nonionic surfactant include KP (manufactured by Shin-Etsu Chemical Co., Ltd.), Polyflow (manufactured by Kyoeisha Chemical Co., Ltd.), EFTOP (manufactured by Jemco Inc.), Megafac (manufactured by DIC Corporation), Fluorad (manufactured by Sumitomo 3M, Ltd.), Asahi Guard (manufactured by Asahi Glass Co., Ltd.), Surflon (manufactured by Asahi Glass Co., Ltd.), and the like. These surfactants may be used either alone or in combination.

The surfactant is normally used in an amount of 2 parts by mass or less, and preferably 1.5 parts by mass or less (amount of effective ingredient), based on 100 parts by mass of the polymer (B).

Sensitizer

The sensitizer absorbs the energy of radiation, and transmits the energy to the photoacid generator (e.g., compound (A)), so that the amount of acid generated increases. The sensitizer improves the apparent sensitivity of the radiation-sensitive resin composition.

Examples of the sensitizer include acetophenones, benzophenones, naphthalenes, biacetyl, eosine, rose bengal, pyrenes, anthracenes, phenothiazines, and the like.

The sensitizer is normally used in an amount of 50 parts by mass or less, and preferably 30 parts by mass or less, based on 100 parts by mass of the polymer (B).

Halation Inhibitor

Examples of the halation inhibitor include dyes and pigments such as 4-hydroxy-4'-methylchalcone. The latent image in the exposed area can be visualized by adding the halation inhibitor, and the effects of halation can be reduced during exposure.

Preparation of Radiation-Sensitive Resin Composition

The radiation-sensitive resin composition may be prepared by dissolving the components in a solvent to obtain a homogeneous solution, and optionally filtering the solution through a filter having a pore size of about 0.2 μm.

Examples of the solvent include ethers, esters, ether esters, ketones, ketone esters, amides, amide esters, lactams, aliphatic hydrocarbons, aromatic hydrocarbons, halogenated aliphatic hydrocarbons, halogenated aromatic hydrocarbons, alcohols, and the like.

Examples of the ethers include ethylene glycol monoalkyl ethers, diethylene glycol dialkyl ethers, propylene glycol monoalkyl ethers, propylene glycol dialkyl ethers, dimethoxyethanes, diethoxyethanes, cyclic ethers such as tetrahydrofuran, and the like.

Examples of the esters include acetates such as ethyl acetate, n-butyl acetate, and i-butyl acetate; saturated carboxylates such as propionates (e.g., methyl propionate); hydroxyacetates such as methyl glycolate; alkoxyacetates such as methyl methoxyacetate; acetoacetates such as ethyl acetoacetate; lactates such as ethyl lactate; substituted propionates; butylates such as ethyl butyrate; pyruvates such as methyl pyruvate; and the like.

Examples of the ether esters include ethylene glycol monoalkyl ether acetates, propylene glycol monoalkyl ether acetates, and the like.

Examples of the ketones include acyclic ketones such as acetone, 2-butanone, 4-methyl-2-pentanone, and 2-heptanone; cyclic ketones such as cyclopentanone and cyclohexanone; and the like.

Examples of the amides include N,N-dialkylformamides, N,N-dialkylacetamides, N-alkylpyrrolidones, and the like.

Examples of the aliphatic hydrocarbons include alkanes such as n-pentane, n-hexane, n-heptane, n-octane, n-nonane, and n-decane; cycloalkanes such as cyclohexane, cycloheptane, cyclooctane, decalin, and norbornane; and the like.

Examples of the aromatic hydrocarbons include benzene, toluene, xylene, ethylbenzene, cumene, and the like.

Examples of the halogenated aliphatic hydrocarbons include chlorobutanes, bromohexanes, dichloroethanes, hexamethylene dibromide, and the like.

Examples of the halogenated aromatic hydrocarbons include chlorobenzene, dichlorobenzene, and the like.

Examples of the alcohols include methanol, ethanol, 1-propanol, 2-propanol, 4-methyl-2-pentanol, and the like. These solvents may be used either alone or in combination.

The solvents disclosed in paragraphs [0202] of WO2009/051088, and the like may be used.

Among these, propylene glycol monoalkyl ether acetates, acyclic or cyclic ketones, lactates, 3-alkoxypropionates, and the like are preferable since excellent in-plane uniformity can be achieved during application.

An additional solvent having a high boiling point, such as benzyl ethyl ether, di-n-hexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, ethylene carbonate, propylene carbonate, or ethylene glycol monophenyl ether acetate, may optionally be used in combination with the above solvent. These additional solvents may be used either alone or in combination. The additional solvent is normally used in an amount of 50 mass % or less, and preferably 30 mass % or less, based on the total amount of the solvents.

The solvent is normally used so that the total solid content in the radiation-sensitive resin composition is 0.1 to 50 mass %, preferably 0.5 to 50 mass %, more preferably 1 to 40 mass %, still more preferably 1.5 to 30 mass %, and yet more preferably 2 to 25 mass %. When the total solid content in the radiation-sensitive resin composition is within the above range, excellent in-plane uniformity can be achieved during application.

Resist Pattern-Forming Method

A resist pattern may be formed by applying the radiation-sensitive resin composition to a substrate (e.g., silicon wafer or aluminum-coated wafer) by an appropriate application method (e.g., spin coating, cast coating, or roll coating), optionally prebaking (PB) the composition to form a resist film, exposing the resist film via a given mask pattern, and developing the resist film.

Examples of radiation used for exposure include deep ultraviolet rays such as a bright line spectrum of a mercury lamp (wavelength: 254 nm), KrF excimer laser light (wavelength: 248 nm), ArF excimer laser light (wavelength: 193 nm), $F_2$ excimer laser light (wavelength: 157 nm), and EUV light (wavelength: 13 nm); X-rays such as synchrotron radiation; charged particle rays such as electron beams; and the like. Among these, deep ultraviolet rays and charged particle rays are preferable, and KrF excimer laser light, ArF excimer laser light, $F_2$ excimer laser light, and electron beams are more preferable. Note that an immersion liquid may be provided over the resist film, and the resist film may be exposed via the immersion liquid. The exposure conditions (e.g., dose) are appropriately selected depending on the composition of the radiation-sensitive resin composition, the type of additive, and the like.

It is preferable to perform post-exposure bake (PEB) after exposure. The apparent sensitivity of the radiation-sensitive resin composition can be improved by performing PEB. The PEB temperature is selected depending on the composition of the radiation-sensitive resin composition, the type of additive, and the like, but is normally 30 to 200° C., and preferably 50 to 150° C. The PEB time is normally 5 to 600 seconds, and preferably 10 to 300 seconds.

The exposed resist film is developed using an alkaline developer to form a given positive-tone or negative-tone resist pattern. The alkaline developer may be an alkaline aqueous solution prepared by dissolving one or more alkaline compounds (e.g., alkaline metal hydroxide, aqueous ammonia, alkylamine, alkanolamine, heterocyclic amine, tetraalkylammonium hydroxide, choline, 1,8-diazabicyclo[5.4.0]-7-undecene, or 1,5-diazabicyclo[4.3.0]-5-nonene) in water. It is preferable to use a tetraalkylammonium hydroxide aqueous solution as the alkaline developer.

The concentration of the alkaline aqueous solution is preferably 10 mass % or less, more preferably 1 to 10 mass %, and particularly preferably 2 to 5 mass %. When the concentration of the alkaline aqueous solution is 10 mass % or less, dissolution of the unexposed area (positive-tone resist pattern) or the exposed area (negative-tone resist pattern) in the alkaline developer can be prevented. Note that an appropriate amount of a surfactant or the like may be added to the developer (alkaline aqueous solution). A resist film formed using the radiation-sensitive resin composition exhibits improved wettability with the developer by adding a surfactant to the developer. After development using the developer (alkaline aqueous solution), the resist film is normally rinsed with water, and dried.

EXAMPLES

The invention is further described below by way of examples. Note that the invention is not limited to the following examples.

The monomers used to synthesize the polymer (B) and the polymer (C) are shown below.

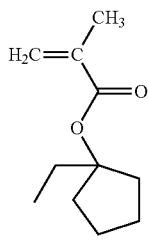 (M-1)

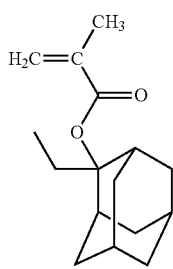 (M-2)

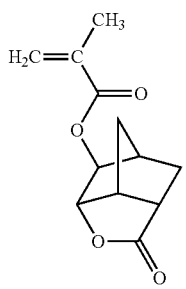 (M-3)

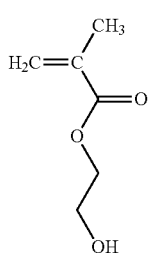 (M-4)

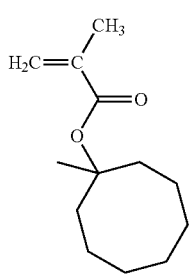 (M-5)

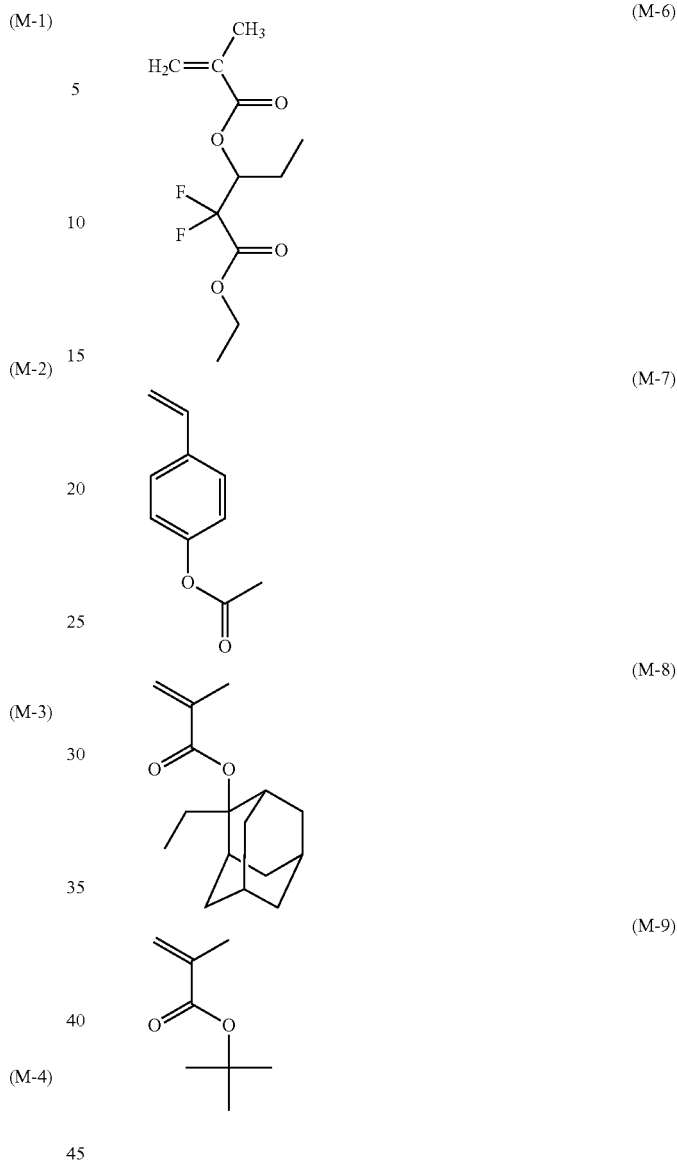

Synthesis of polymer (B)

Synthesis Example 1

31.63 g (35 mol %) of the compound (M−1), 49.60 g (45 mol %) of the compound (M-3), and 6.45 g (10 mol %) of the compound (M-4) were dissolved in 200 g of 2-butanone, and 8.14 g of 2,2'-azobis(2-methylpropionitrile) was added to (dissolved in) the solution to prepare a monomer solution. A three-necked flask (1000 ml) charged with 12.32 g (10 mol %) of the compound (M−2) and 100 g of 2-butanone was purged with nitrogen for 30 minutes, and heated to 80° C. with stirring. The monomer solution prepared as described above was added dropwise to the flask over 3 hours using a dropping funnel. The monomers were polymerized for 6 hours after the start of the addition of the monomer solution. After completion of polymerization, the reaction mixture was cooled with water to 30° C. or less, and poured into 4000 g of methanol. A white powder that precipitated was filtered off. The white powder was dispersed in and washed with 400 g of methanol in a slurry state, and filtered off. This operation was repeated once. The white powder was then dried at 50° C. for 17 hours to obtain a white powdery polymer (B-1). The polymer (B-1) had an Mw of 4300 and a dispersity (Mw/Mn) of 1.30. It was found by $^{13}$C-NMR analysis that the ratio of the content of structural units derived from the compound (M-1), the content of structural units derived from the compound (M-2), the content of structural units derived from the compound (M-3), and the content of structural units derived from the compound (M-4) in the polymer (B-1) was 35.6:8.9:46.2:9.3 (mol %).

Synthesis Example 2

55 g of the compound (M-7), 45 g of the compound (M-8), 4 g of azobisisobutylonitrile, and 1 g of t-dodecylmercaptan were dissolved in 100 g of propylene glycol monomethyl ether. The monomers were polymerized at 70° C. for 16 hours in a nitrogen atmosphere. After completion of polymerization, the reaction solution was added dropwise to 1000 g of n-hexane to coagulate the polymer. After the addition of 150 g of propylene glycol monomethyl ether to the polymer, 150 g of methanol, 34 g of triethylamine, and 6 g of water were added to the mixture. The mixture was hydrolyzed for 8 hours under reflux at the boiling point. After completion of the reaction, the solvent and triethylamine were evaporated under reduced pressure. After dissolving the resulting polymer in 150 g of acetone, the solution was added dropwise to 2000 g of water to coagulate the polymer. A white powder thus produced was filtered off, and dried at 50° C. overnight under reduced pressure to obtain a polymer (B-2). The polymer (B-2) had an Mw of 10,000 and a dispersity (Mw/Mn) of 2.1. It was found by $^{13}$C-NMR analysis that the ratio of the content of structural units derived from the compound (M-7) to the content of structural units derived from the compound (M-8) was 65.1:34.9 (mol %).

Synthesis Example 3

53 g of the compound (M-7), 47 g of the compound (M-9), 4 g of azobisisobutylonitrile, and 0.2 g of t-dodecylmercaptan were dissolved in 200 g of propylene glycol monomethyl ether. The monomers were polymerized at 70° C. for 16 hours in a nitrogen atmosphere. After completion of polymerization, the reaction solution was added dropwise to 2000 g of n-hexane to coagulate the polymer. After the addition of 150 g of propylene glycol monomethyl ether to the polymer, 150 g of methanol, 37 g of triethylamine, and 7 g of water were added to the mixture. The mixture was hydrolyzed for 8 hours under reflux at the boiling point. After completion of the reaction, the solvent and triethylamine were evaporated under reduced pressure. After dissolving the resulting polymer in 150 g of acetone, the solution was added dropwise to 2000 g of water to coagulate the polymer. A white powder thus produced was filtered off, and dried at 50° C. overnight under reduced pressure to obtain a polymer (B-3). The polymer (B-3) had an Mw of 13,000 and a dispersity (Mw/Mn) of 2.4. It was found by $^{13}$C-NMR analysis that the ratio of the content of structural units derived from the compound (M-7) (structural units derived from hydroxystyrene) to the content of structural units derived from the compound (M-9) was 50.3:49.7 (mol %).

Synthesis of Polymer (C)

Synthesis Example 4

37.41 g (40 mol %) of the compound (M-5) and 62.59 g (60 mol %) of the compound (M-6) were dissolved in 100 g of 2-butanone, and 4.79 g of 2,2'-azobis(2-methylpropionitrile) was added to (dissolved in) the solution to prepare a monomer solution. A three-necked flask (1000 ml) charged with 100 g of 2-butanone was purged with nitrogen for 30 minutes, and heated to 80° C. with stirring. The monomer solution was added dropwise to the flask over 3 hours using a dropping funnel. The monomers were polymerized for 6 hours from the start of the addition of the monomer solution. After completion of polymerization, 150 g of 2-butanone was removed from the reaction solution under reduced pressure. After cooling the reaction solution to 30° C. or less, the reaction solution was added to a mixture of 900 g of methanol and 100 g of ultrapure water, and a white powder that precipitated by this operation was filtered off. The white powder was dispersed in and washed with 100 g of methanol in a slurry state, and filtered off. This operation was repeated once. The resulting white powder was dried at 50° C. for 17 hours under vacuum to obtain a polymer (C-1) (78 g, yield: 78%). The polymer (C-1) had an Mw of 6920 and a dispersity (Mw/Mn) of 1.592. It was found by $^{13}$C-NMR analysis that the ratio of the content of structural units derived from the compound (M-5) to the content of structural units derived from the compound (M-6) was 40.8:59.2 (mol %). The fluorine atom content in the polymer (C-1) was 9.6 mass %.

Preparation of Radiation-Sensitive Resin Composition

The details of the components other then the polymers (B) and (C) are shown below.

Compound (A)

A-1: compound represented by the following formula (A-1)
A-2: compound represented by the following formula (A-2)
A-3: compound represented by the following formula (A-3)
A-4: compound represented by the following formula (A-4)
a-3: triphenylsulfonium
4-(1-adamantanecarbonyloxy)-1,1,2,2-tetrafluorobutane-sulfonate (compound represented by the following formula (a-1))

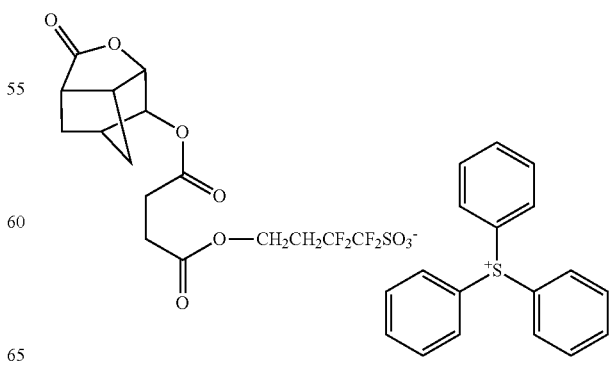

(A-1)

-continued

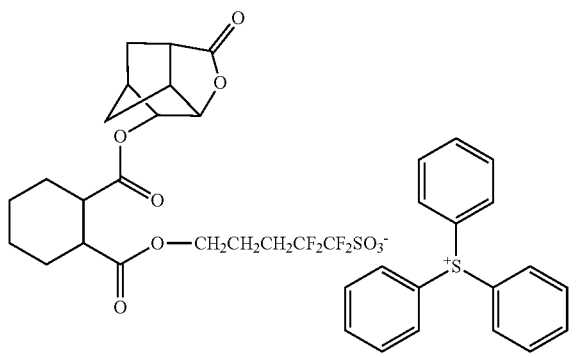

(A-2)

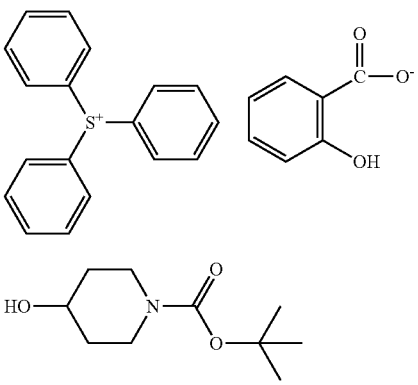

(D-1)

(D-2)

Solvent (E)
E-1: propylene glycol methyl ether acetate
E-2: cyclohexanone
E-3: ethyl lactate
Lactone compound (F)
F-1: γ-butyrolactone

Example 1

13 parts by mass of the compound (A-1) (compound (A)), 100 parts by mass of the polymer (B-1) (polymer (B)), 3 parts by mass of the polymer (C-1) (polymer (C)), 13 parts by mass of the acid diffusion controller (D-1) (acid diffusion controller (D)), 1980 parts by mass of the solvent (E-1) (solvent (E)), 848 parts by mass of the solvent (E-2) (solvent (E)), and 200 parts by mass of the lactone compound (F-1) (lactone compound (F)) were mixed to obtain a homogeneous solution. The solution was filtered through a membrane filter having a pore size of 200 nm to prepare a positive-tone radiation-sensitive resin composition. The total solid content in the radiation-sensitive resin composition was about 4 mass %.

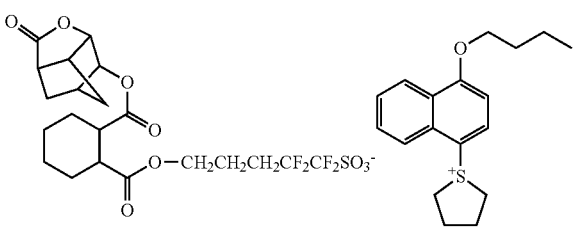

(A-3)

(A-4)

Examples 2 to 9 and Comparative Examples 1 to 4

A radiation-sensitive resin composition was prepared in the same manner as in Example 1, except that the amount and the type of each component were changed as shown in Table 1. Note that the symbol "-" in Table 1 indicates that the corresponding component was not used.

Examples 10 to 13 and Comparative Example 5

A radiation-sensitive resin composition was prepared in the same manner as in Example 1, except that the amount and the type of each component were changed as shown in Table 2.

Formation of Resist Pattern

A resist pattern was formed by a pattern-forming method (P-1), (P-2), or (P-3) using each radiation-sensitive resin composition. The pattern-forming method (P-1) was used in Examples 1 to 5 and Comparative Examples 1 and 2, and the pattern-forming method (P-2) was used in Examples 6 to 9 and Comparative Examples 3 and 4 (i.e., a pattern was formed by ArF exposure). The pattern-forming method (P-3) was used in Examples 10 to 13 and Comparative Example 5 (i.e., a pattern was formed by electron beam (EB) exposure). The pattern-forming method used for each radiation-sensitive resin composition is also shown in Table 1 or 2.

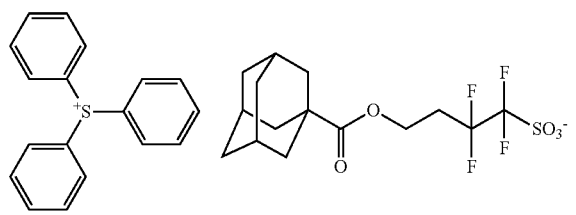

(a-1)

Acid diffusion controller (D)

D-1: triphenylsulfonium salicylate (compound represented by the following formula (D-1))

D-2: t-butyl 4-hydroxy-1-piperidinecarboxylate (compound represented by the following formula (D-2))

ArF Exposure Evaluation
Pattern-Forming Method (P-1)

The radiation-sensitive resin composition was applied to a 12-inch silicon wafer on which an underlayer antireflective film ("ARC66" manufactured by Nissan Chemical Industries, Ltd.) was formed. The radiation-sensitive resin composition was prebaked (PB) for 60 seconds at the temperature shown in Table 1 to form a resist film having a thickness of 75 nm. The resist film was exposed via a mask pattern using an ArF immersion scanner ("NSR-S610C" manufactured by Nikon Corporation) (NA=1.3, ratio=0.800, Annular). The exposed resist film was subjected to PEB for 60 seconds at the temperature shown in Table 1. The resist film was then developed using a 2.38 mass % tetramethylammonium hydroxide aqueous solution, rinsed with water, and dried to form a positive-tone resist pattern.

Pattern-Forming Method (P-2)

The radiation-sensitive resin composition was applied to a 12-inch silicon wafer on which an underlayer antireflective film ("ARC66" manufactured by Nissan Chemical Industries, Ltd.) was formed. The radiation-sensitive resin composition was prebaked (PB) for 60 seconds at the temperature shown in Table 1 to form a resist film having a thickness of 75 nm. The upper-layer film-forming composition disclosed in Example 1 of WO2008/047678 was spin-coated onto the resist film, and prebaked (PB) at 90° C. for 60 seconds to form an upper-layer film having a thickness of 90 nm. The resist film was exposed via a mask pattern using an ArF immersion scanner ("NSR-S610C" manufactured by Nikon Corporation) (NA=1.3, ratio=0.800, Annular). The exposed resist film was subjected to PEB for 60 seconds at the temperature shown in Table 1. The resist film was then developed using a 2.38 mass % tetramethylammonium hydroxide aqueous solution, rinsed with water, and dried to form a positive-tone resist pattern.

EB Exposure Evaluation
Pattern-Forming Method (P-3)

The radiation-sensitive resin composition was spin-coated onto a silicon wafer using a coater/developer ("CLEAN TRACK ACT-8" manufactured by Tokyo Electron, Ltd.), and prebaked (PB) at 110° C. for 60 seconds to form a resist film having a thickness of 50 nm. The resist film was exposed to electron beams using an electron beam drawing system ("HL800D" manufactured by Hitachi, Ltd., output: 50 KeV, current density: 5.0 A/cm$^2$). The exposed resist film was subjected to PEB for 60 seconds at the temperature shown in Table 2. The resist film was then developed at 23° C. for 1 minute by a puddle method using a 2.38% tetramethylammonium hydroxide aqueous solution, rinsed with purified water, and dried to form a resist pattern.

Evaluation

The resist pattern was evaluated as described below (see Tables 1 and 2). The results are shown in Table 1 or 2.

MEEF

A dose at which a line-and-space (LS) pattern having a line width of 50 nm was formed by exposure via a mask pattern (target size: 50 nm 1L/1S) was determined to be an optimum dose. An LS pattern (pitch: 100 nm) was formed at the optimum dose using a mask pattern (line width target size: 46 nm, 48 nm, 50 nm, 52 nm, or 54 nm), and the line width of the resist film was measured using a scanning electron microscope (SEM) ("CG4000" manufactured by Hitachi, Ltd.). A graph was drawn by plotting the target size (nm) (horizontal axis) and the line width (nm) of the resist film formed using each mask pattern (vertical axis), and the slope of the straight line of the graph was calculated to be the MEEF. The MEEF (i.e., the slope of the straight line) is close to 1 when the mask reproducibility is good.

LWR
Evaluation in Examples 1 to 9 and Comparative Examples 1 to 4

A dose at which a resist pattern having a line width of 50 nm was formed by exposure through a mask pattern (target size: 50 nm 1L/1.8S) was determined to be an optimum dose. A 50 nm 1L/1.8S pattern formed at the optimum dose was observed using the SEM. The line width of the pattern was measured from above at an arbitrary ten points, and a variation (3σ) in the measured values was taken as the LWR (nm).

Evaluation in Examples 10 to 13 and Comparative Example 5

A dose at which a resist pattern having a line width of 150 nm was formed by exposure via a mask pattern (target size: 150 nm 1L/1S) was determined to be an optimum dose. A 150 nm 1L/1S pattern formed at the optimum dose was observed in the same manner as described above to measure the LWR (nm).

The LWR value is small when the pattern has excellent linearity.

Minimum Pre-Collapse Dimension

The resist film was exposed via a mask pattern (target size: 50 nm 1L/1.8S) while changing the dose by 1 mJ. The line width of the pattern formed at a dose lower by 1 mJ than the dose at which line collapse occurred was taken as the minimum pre-collapse dimension (nm) measured using the SEM). A small minimum pre-collapse dimension indicates that the pattern has excellent collapse resistance.

Sensitivity

A dose at which a resist pattern having a line width of 150 nm was formed by exposure via a mask pattern (target size: 150 nm 1L/1S) was determined to be an optimum dose, and the optimum dose was taken as the sensitivity (μC/cm$^2$).

Resolution

The minimum line width (nm) of the line pattern of a line-and-space pattern (1L1S) that was resolved at the optimum dose was taken as the resolution.

TABLE 1

| | Compound (A) | | Polymer (B) | | Polymer (C) | | Acid diffusion controller (D) | | Solvent (E) | |
|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) |
| Example 1 | A-1 | 13 | B-1 | 100 | C-1 | 3 | D-1 | 13 | E-1/E-2 | 1980/848 |
| Example 2 | A-1 | 12 | B-1 | 100 | C-1 | 3 | D-2 | 6 | E-1/E-2 | 1980/848 |
| Example 3 | A-2 | 13 | B-1 | 100 | C-1 | 3 | D-2 | 6 | E-1/E-2 | 1980/848 |
| Example 4 | A-3 | 13 | B-1 | 100 | C-1 | 3 | D-1 | 13 | E-1/E-2 | 1980/848 |
| Example 5 | A-4 | 13 | B-1 | 100 | C-1 | 3 | D-2 | 6 | E-1/E-2 | 1980/848 |
| Comparative Example 1 | a-1 | 13 | B-1 | 100 | C-1 | 3 | D-1 | 13 | E-1/E-2 | 1980/848 |

TABLE 1-continued

| | | | | | | | | | | | |
|---|---|---|---|---|---|---|---|---|---|---|---|
| Comparative Example 2 | a-1 | 12 | B-1 | 100 | C-1 | 3 | D-2 | 6 | E-1/E-2 | 1980/848 |
| Example 6 | A-1 | 13 | B-1 | 100 | — | — | D-1 | 13 | E-1/E-2 | 1980/848 |
| Example 7 | A-1 | 12 | B-1 | 100 | — | — | D-2 | 6 | E-1/E-2 | 1980/848 |
| Example 8 | A-2 | 13 | B-1 | 100 | — | — | D-2 | 6 | E-1/E-2 | 1980/848 |
| Example 9 | A-3 | 13 | B-1 | 100 | — | — | D-1 | 13 | E-1/E-2 | 1980/848 |
| Comparative Example 3 | a-1 | 13 | B-1 | 100 | — | — | D-1 | 13 | E-1/E-2 | 1980/848 |
| Comparative Example 4 | a-1 | 12 | B-1 | 100 | — | — | D-2 | 6 | E-1/E-2 | 1980/848 |

| | Lactone compound (F) | | | | | Evaluation results | | |
|---|---|---|---|---|---|---|---|---|
| | Type | Amount (parts by mass) | Pattern-forming method | PB temp. (° C.) | PEB temp. (° C.) | MEEF | LWR (nm) | Minimum pre-collapse dimension (nm) |
| Example 1 | F-1 | 200 | P-1 | 120 | 85 | 3.0 | 4.1 | 30 |
| Example 2 | F-1 | 200 | P-1 | 110 | 90 | 3.2 | 4.1 | 30 |
| Example 3 | F-1 | 200 | P-1 | 110 | 90 | 3.0 | 3.7 | 28 |
| Example 4 | F-1 | 200 | P-1 | 110 | 85 | 2.9 | 3.7 | 28 |
| Example 5 | F-1 | 200 | P-1 | 110 | 85 | 2.9 | 4.1 | 28 |
| Comparative Example 1 | F-1 | 200 | P-1 | 120 | 85 | 3.5 | 5.4 | 39 |
| Comparative Example 2 | F-1 | 200 | P-1 | 110 | 90 | 3.7 | 6.0 | 39 |
| Example 6 | — | — | P-2 | 120 | 85 | 2.9 | 4.0 | 28 |
| Example 7 | — | — | P-2 | 110 | 90 | 3.0 | 4.4 | 28 |
| Example 8 | — | — | P-2 | 110 | 90 | 2.8 | 3.9 | 30 |
| Example 9 | — | — | P-2 | 110 | 85 | 2.8 | 3.9 | 29 |
| Comparative Example 3 | — | — | P-2 | 120 | 85 | 3.4 | 5.5 | 39 |
| Comparative Example 4 | — | — | P-2 | 110 | 90 | 3.6 | 6.0 | 38 |

As is clear from the results shown in Table 1, it was confirmed that the radiation-sensitive resin compositions according to the embodiments of the invention exhibited a small MEEF, low LWR, excellent post-development pattern collapse resistance, and a good balance between the MEEF and the LWR.

TABLE 2

| | Compound (A) | | Polymer (B) | | Acid diffusion controller (D) | | Solvent (E) | | Pattern-forming method | PEB temp. (° C.) | Evaluation results | | |
|---|---|---|---|---|---|---|---|---|---|---|---|---|---|
| | Type | Amount (parts by mass) | Type | Amount (parts by mass) | Type | Amount (parts by mass) | Type | Amount (parts by mass) | | | Sensitivity (µC/cm²) | LWR (nm) | Resolution (nm) |
| Example 10 | A-1 | 20 | B-1 | 100 | D-2 | 2 | E-1/E-3 | 3,300/1,400 | P-3 | 90 | 35.0 | 13 | 70 |
| Example 11 | A-2 | 20 | B-2 | 100 | D-2 | 3 | E-1/E-3 | 3,300/1,400 | P-3 | 80 | 35.0 | 12 | 60 |
| Example 12 | A-3 | 20 | B-3 | 100 | D-2 | 3 | E-1/E-3 | 3,300/1,400 | P-3 | 80 | 33.0 | 12 | 60 |
| Example 13 | A-2 | 20 | B-3 | 100 | D-2 | 3 | E-1/E-3 | 3,300/1,400 | P-3 | 80 | 35.0 | 11 | 60 |
| Comparative Example 5 | a-1 | 20 | B-3 | 100 | D-2 | 2 | E-1/E-3 | 3,300/1,400 | P-3 | 80 | 34.0 | 15 | 90 |

As is clear from the results shown in Table 2, it was confirmed that the radiation-sensitive resin compositions according to the embodiments of the invention exhibited low LWR and excellent resolution.

The radiation-sensitive resin composition according to the embodiments of the invention exhibits excellent post-development pattern collapse resistance, low LWR, a small MEEF, and excellent resolution. Therefore, the radiation-sensitive resin composition may suitably be used as a chemically-amplified resist that is useful for microfabrication that utilizes radiation such as deep ultraviolet rays (e.g., KrF excimer laser light, ArF excimer laser light, $F_2$ excimer laser light, and EUV light) or charged particle rays (e.g., synchrotron radiation).

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
a compound represented by a formula (I);
a first polymer that serves as a base resin; and
a second polymer that has a fluorine atom content higher than a fluorine atom content of the first polymer,

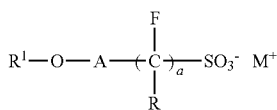
(1)

wherein
$R^1$ is a monovalent group that includes at least two groups of —CO—, —NH—, —S—, and —$SO_2$—, the at least two groups being each identical or different, and is a group represented by a formula (a1), a group represented by a formula (a3), or both thereof,
-A-$(CFR)_a$— is —$CH_2CH_2CF_2CF_2$— or —$CH_2CH_2CH_2CF_2CF_2$—, and
$M^+$ is a monovalent cation,

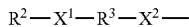
(a1)

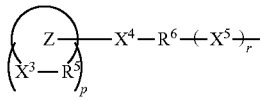
(a3)

wherein
$X^1$ to $X^5$ are each independently —CO—, —COO—, —OCO—, —O—CO—O—, —NHCO—, —CONH—, —NH—CO—O—, —O—CO—NH—, —NH—, —S—, —SO—, or —$SO_2$—,
$R^2$ is a monovalent hydrocarbon group having 1 to 30 carbon atoms,
$R^3$, $R^5$, and $R^6$ are each independently a divalent hydrocarbon group having 1 to 30 carbon atoms, wherein some or all of hydrogen atoms of the monovalent hydrocarbon group represented by $R^2$ or the divalent hydrocarbon group represented by $R^3$, $R^5$, or $R^6$ are unsubstituted or substituted with a substituent,
Z is a group that has a heterocyclic structure taken together with —$(X^3—R^5)_p$—,
p is an integer from 1 to 3, and
r is 0 or 1,
in a case where a plurality of $X^3$ are present, each of the plurality of $X^3$ is either identical or different, and
in a case where a plurality of $R^5$ are present, each of the plurality of $R^5$ is either identical or different.

2. The radiation-sensitive resin composition according to claim 1, wherein $M^+$ in the formula (I) is a sulfonium cation or an iodonium cation.

3. The radiation-sensitive resin composition according to claim 1, wherein the first polymer comprises a structural unit represented by a formula (5),

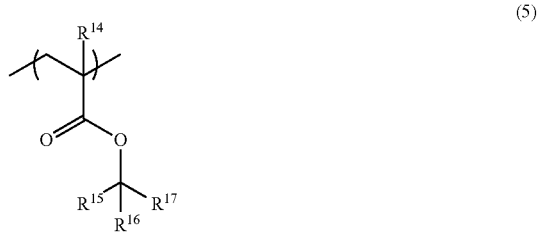
(5)

wherein
$R^{14}$ is a hydrogen atom or a methyl group, and
$R^{15}$, $R^{16}$, and $R^{17}$ are each independently a linear or branched alkyl group having 1 to 4 carbon atoms or an alicyclic hydrocarbon group having 4 to 20 carbon atoms, or two of $R^{15}$, $R^{16}$, and $R^{17}$ taken together represent an alicyclic hydrocarbon group having 4 to 20 carbon atoms together with the carbon atom bonded to the two of $R^{15}$, $R^{16}$, and $R^{17}$, and the other one of $R^{15}$, $R^{16}$, and $R^{17}$ is a linear or branched alkyl group having 1 to 4 carbon atoms or an alicyclic hydrocarbon group having 4 to 20 carbon atoms.

4. The radiation-sensitive resin composition according to claim 1, wherein $X^1$, $X^3$, and $X^4$ are each independently —CO— or —COO—.

5. The radiation-sensitive resin composition according to claim 1, wherein $X^2$ and $X^5$ are each —CO—.

\* \* \* \* \*